United States Patent
Kamata et al.

(10) Patent No.: US 8,692,243 B2
(45) Date of Patent: Apr. 8, 2014

(54) SEMICONDUCTOR DEVICE AND METHOD FOR MANUFACTURING THE SAME

(75) Inventors: Koichiro Kamata, Isehara (JP); Yoshiaki Ito, Sagamihara (JP); Takuro Ohmaru, Zama (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 128 days.

(21) Appl. No.: 13/083,642

(22) Filed: Apr. 11, 2011

(65) Prior Publication Data

US 2011/0254095 A1   Oct. 20, 2011

(30) Foreign Application Priority Data

Apr. 20, 2010 (JP) ................................ 2010-096878

(51) Int. Cl.
*H01L 29/12* (2006.01)
*H01L 21/8234* (2006.01)

(52) U.S. Cl.
USPC ............................................ 257/43; 438/237

(58) Field of Classification Search
USPC ............ 257/43, 368, E27.06, E21.616, 369, 257/379; 438/237, 152, 155
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,051,851 A | 4/2000 | Ohmi et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |

(Continued)

FOREIGN PATENT DOCUMENTS

| | | |
|---|---|---|
| EP | 0 680 087 | 7/2002 |
| EP | 1737044 A | 12/2006 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

(Continued)

*Primary Examiner* — Wael Fahmy
*Assistant Examiner* — Sarah Salerno
(74) *Attorney, Agent, or Firm* — Eric J. Robinson; Robinson Intellectual Property Law Office, P.C.

(57) ABSTRACT

An object is to reduce the number of manufacturing steps of a semiconductor device, to improve yield of a semiconductor device, or to reduce manufacturing cost of a semiconductor device. One embodiment of the present invention relates to a semiconductor device and a method for manufacturing the semiconductor device. The semiconductor device includes, over a substrate, a first transistor having a single crystal semiconductor layer in a channel formation region, a second transistor that is isolated from the first transistor with an insulating layer positioned therebetween and has an oxide semiconductor layer in a channel formation region, and a diode having a single crystal semiconductor layer and a oxide semiconductor layer.

19 Claims, 28 Drawing Sheets

(56) References Cited

U.S. PATENT DOCUMENTS

| | | |
|---|---|---|
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0257250 A1* | 11/2007 | Tseng et al. .............. 257/40 |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0191951 A1 | 8/2008 | Kato |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0071952 A1* | 3/2009 | Kuwabara .............. 219/494 |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0283138 A1 | 11/2009 | Lin et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0315580 A1* | 12/2010 | Cho et al. .............. 349/116 |
| 2011/0109532 A1* | 5/2011 | Choi .............. 345/76 |

FOREIGN PATENT DOCUMENTS

| | | |
|---|---|---|
| EP | 1 956 524 | 8/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-297293 | 11/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2008-218989 | 9/2008 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electronic Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

(56) References Cited

OTHER PUBLICATIONS

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—G—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

(56) References Cited

OTHER PUBLICATIONS

Kimizuka.N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

* cited by examiner

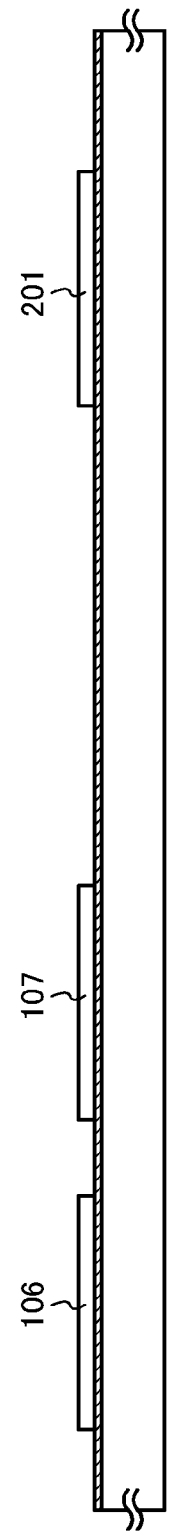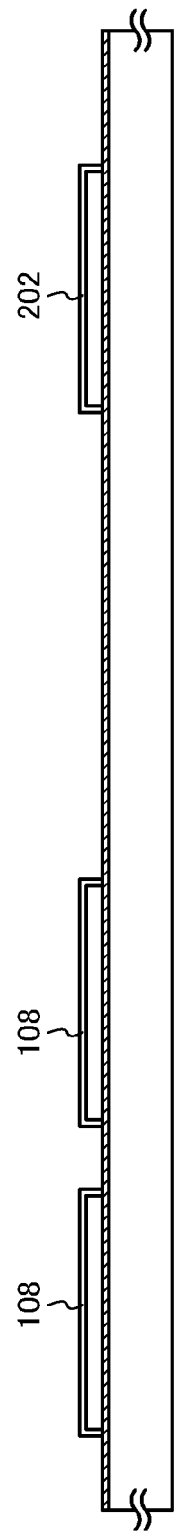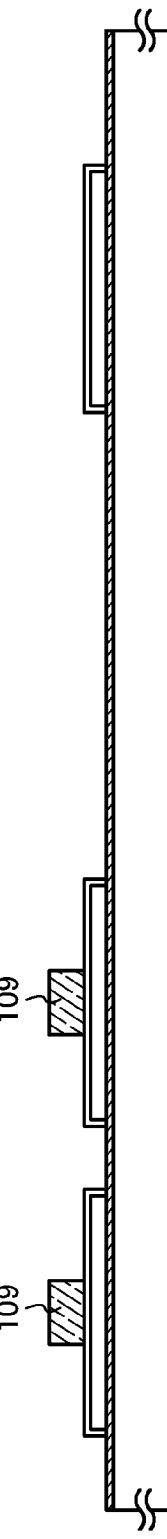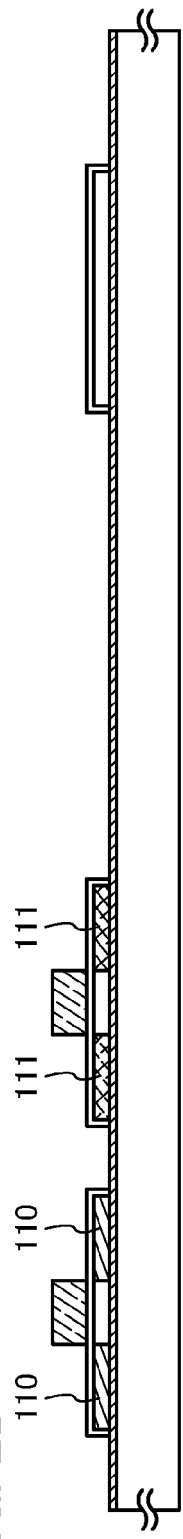

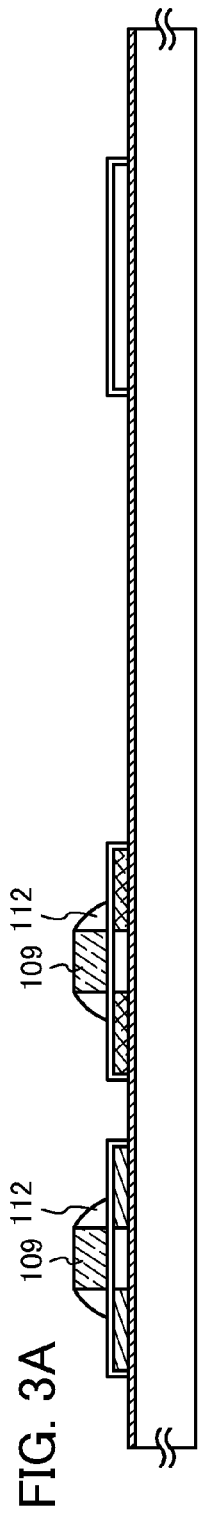
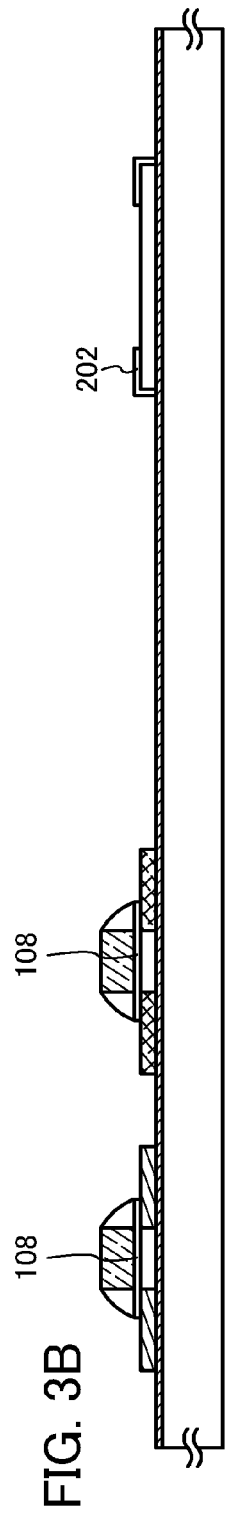
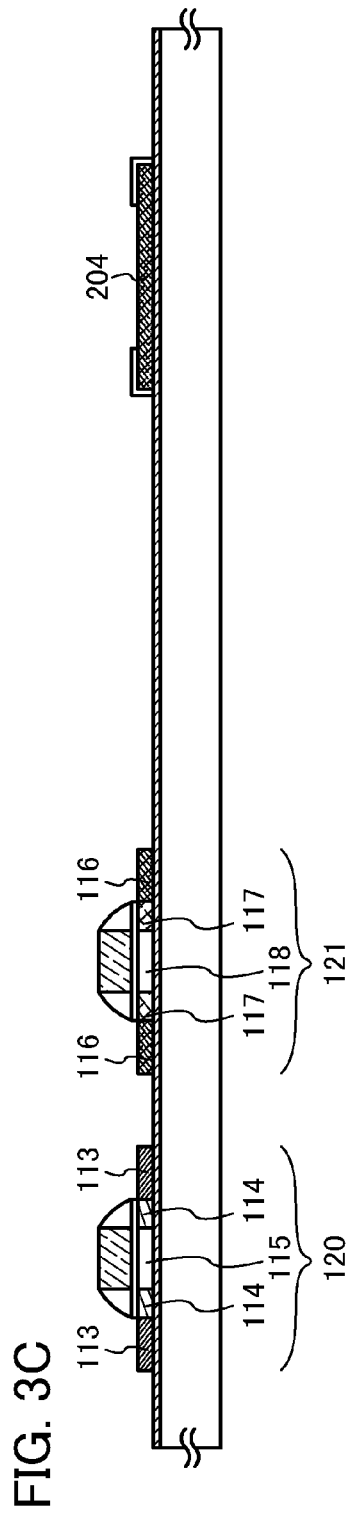
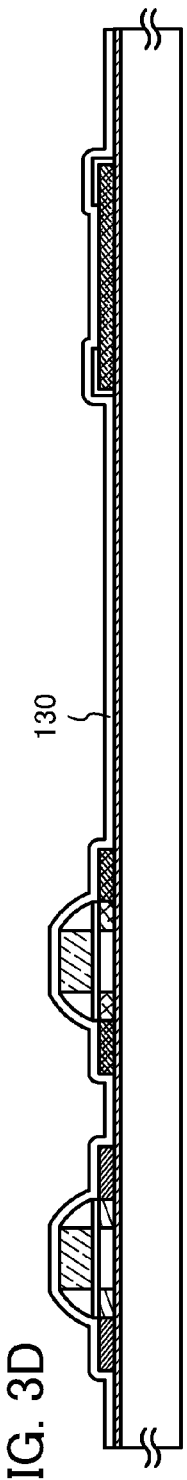

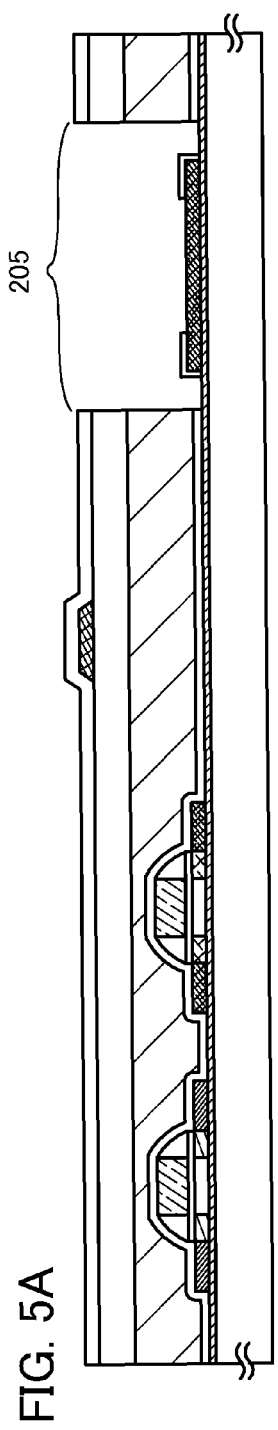
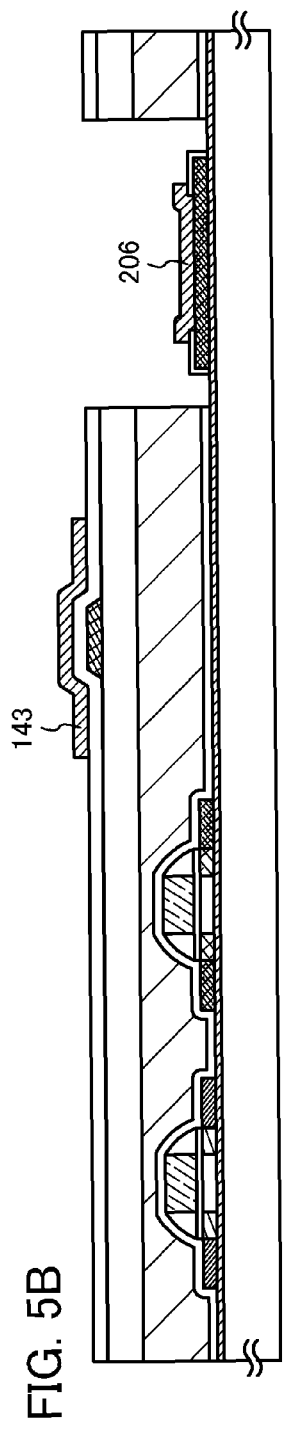
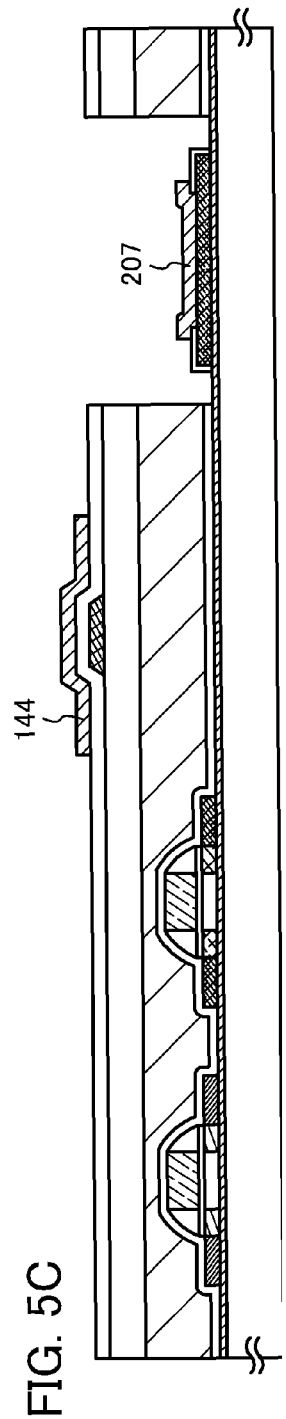
FIG. 5A
FIG. 5B
FIG. 5C

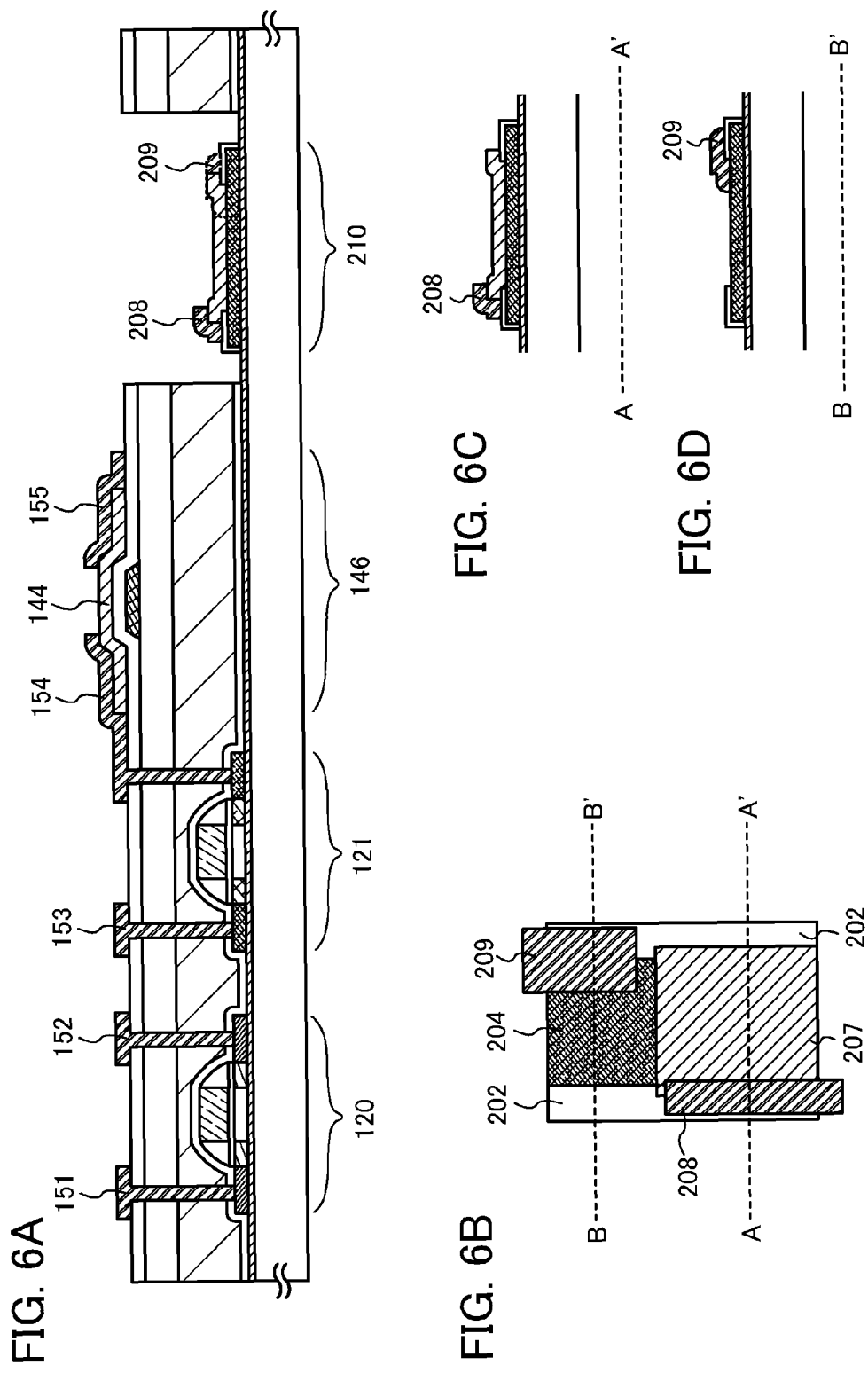

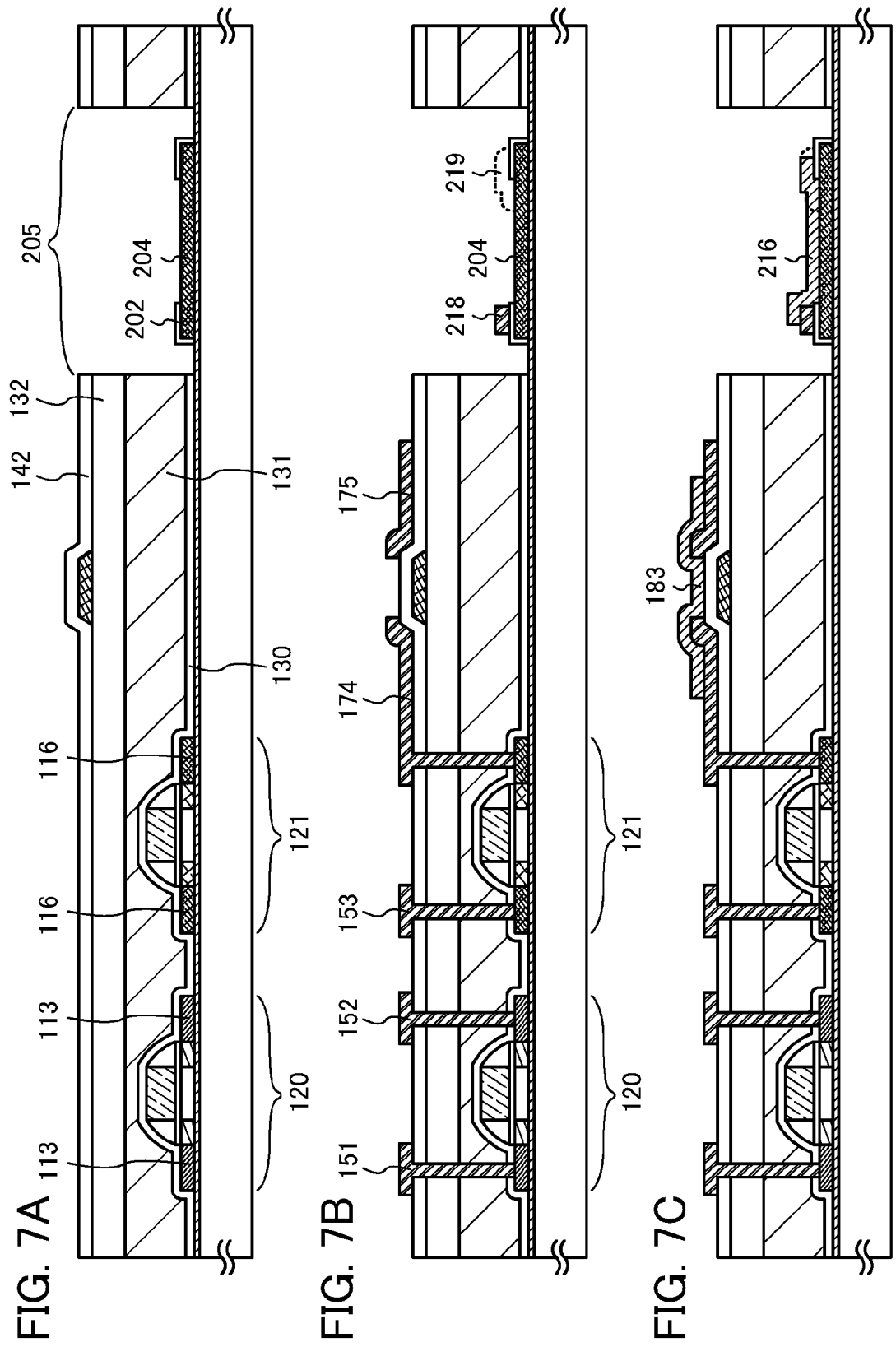

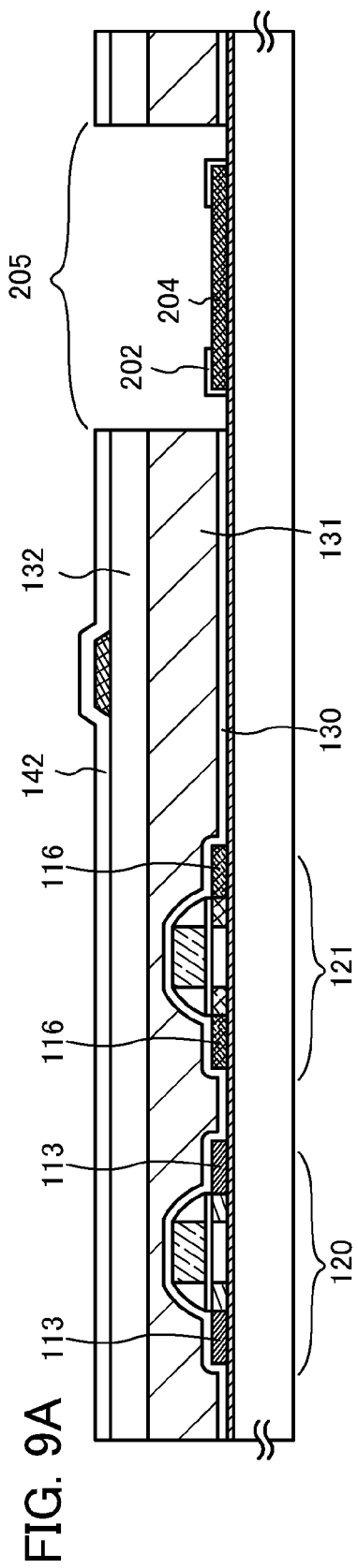
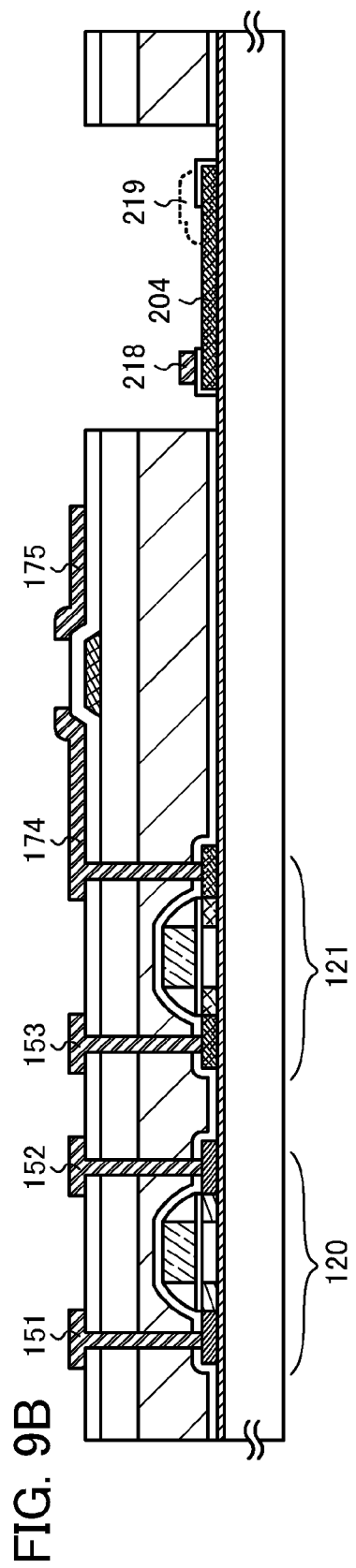
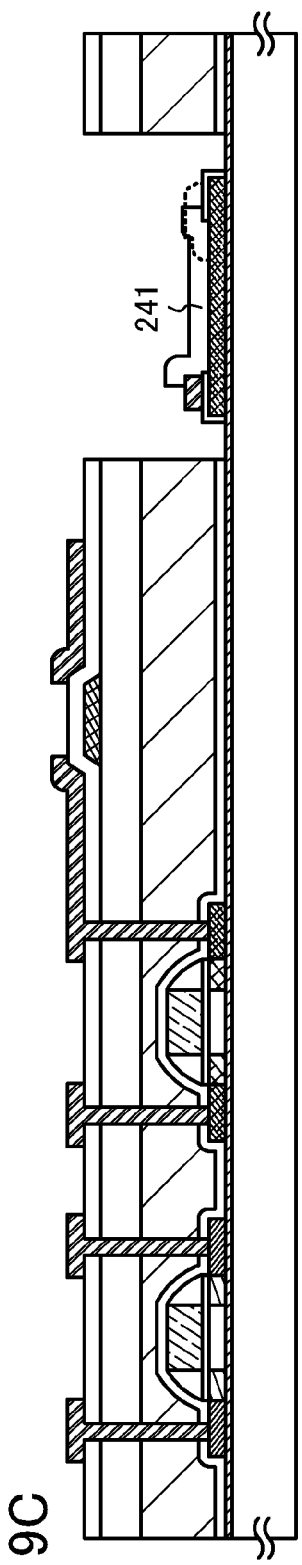

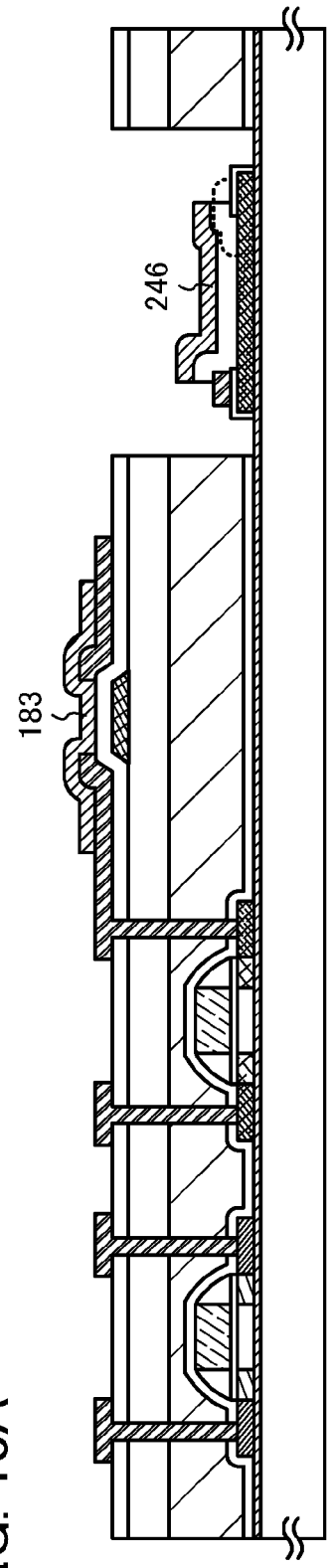
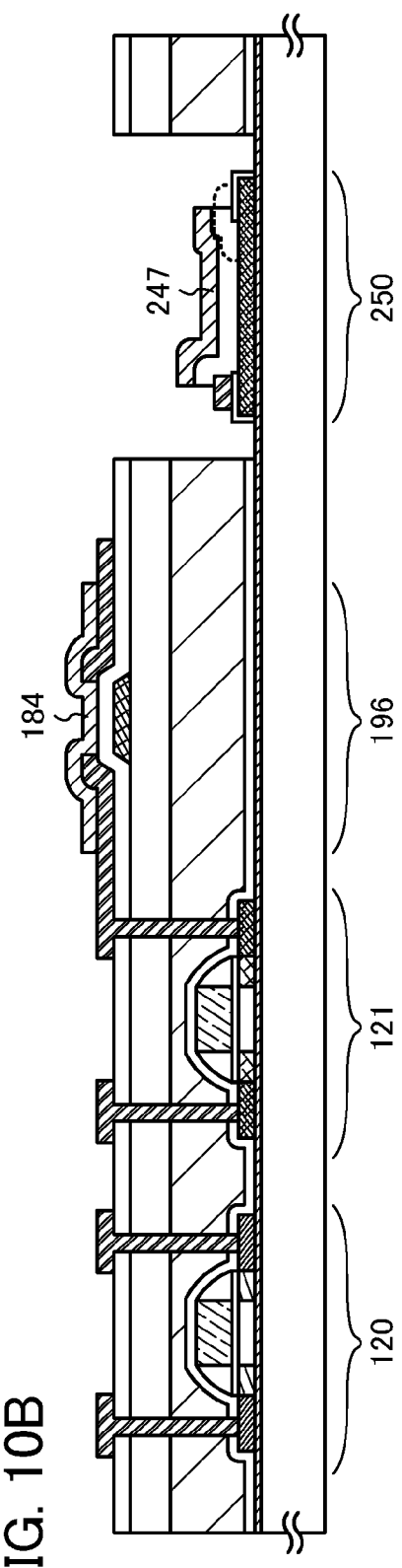

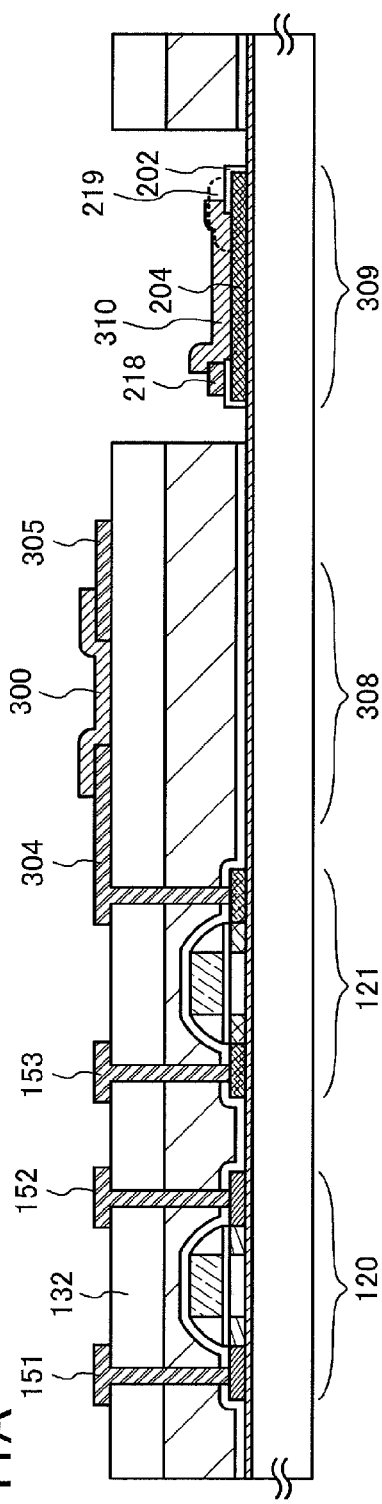
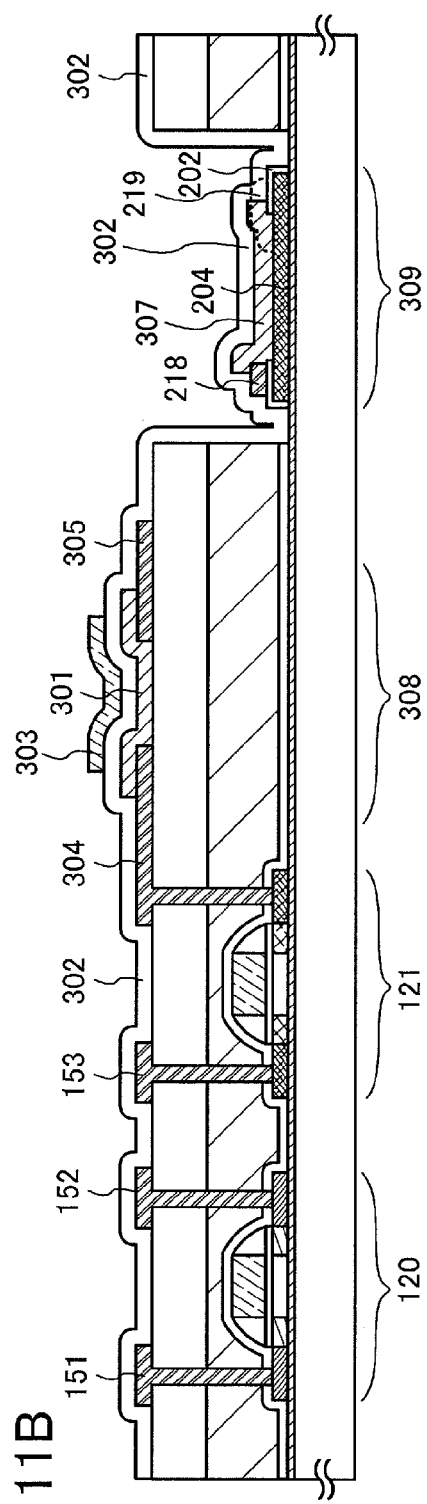
FIG. 11A
FIG. 11B

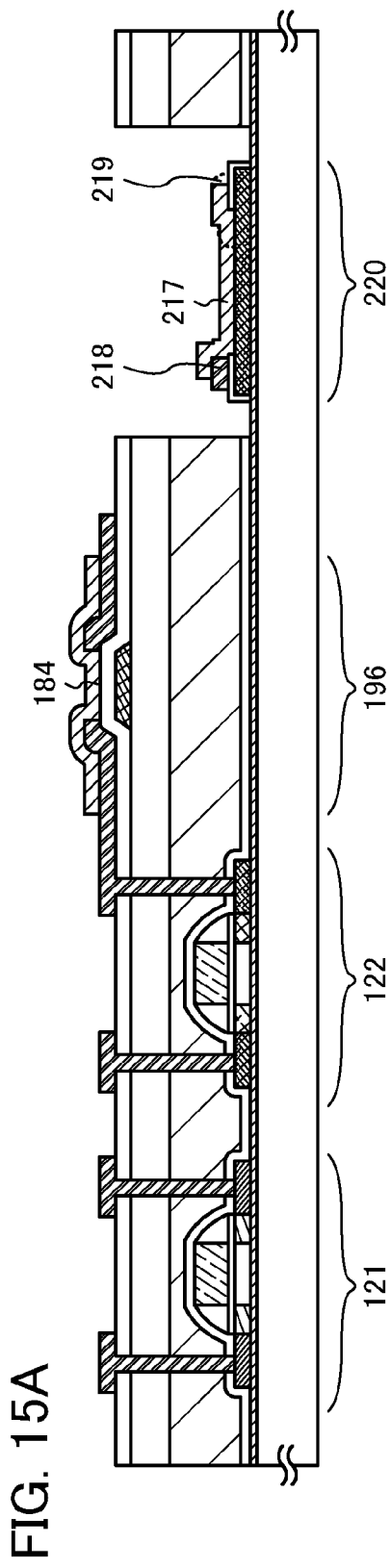
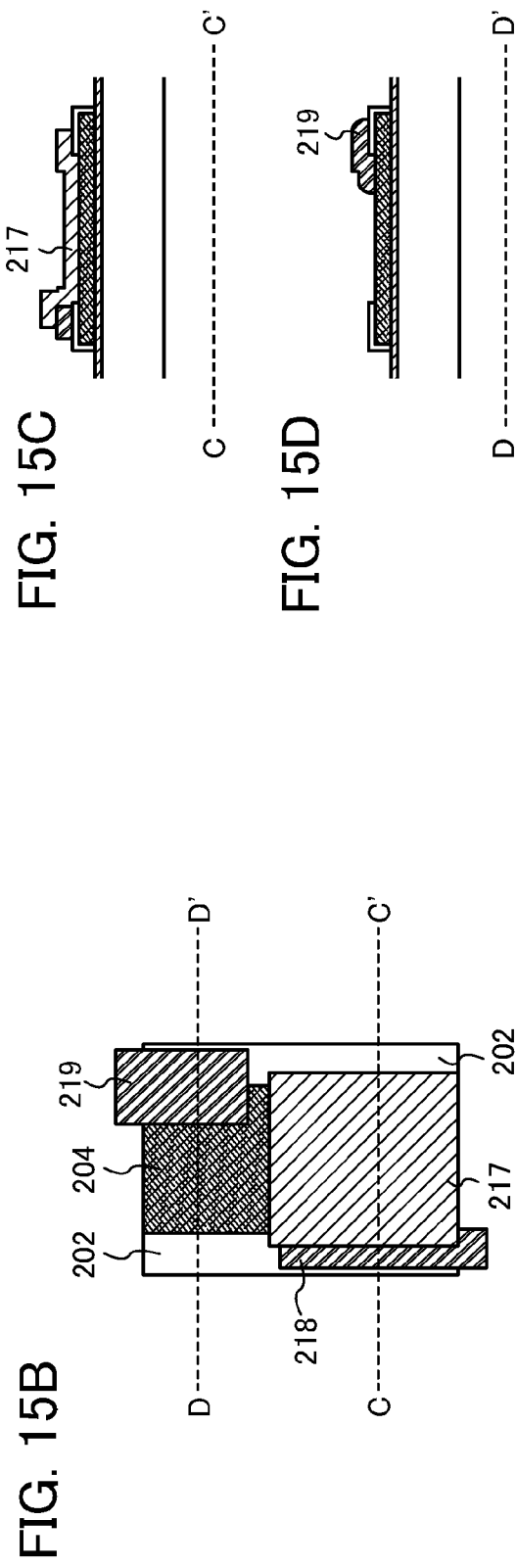
FIG. 15A
FIG. 15B
FIG. 15C
FIG. 15D

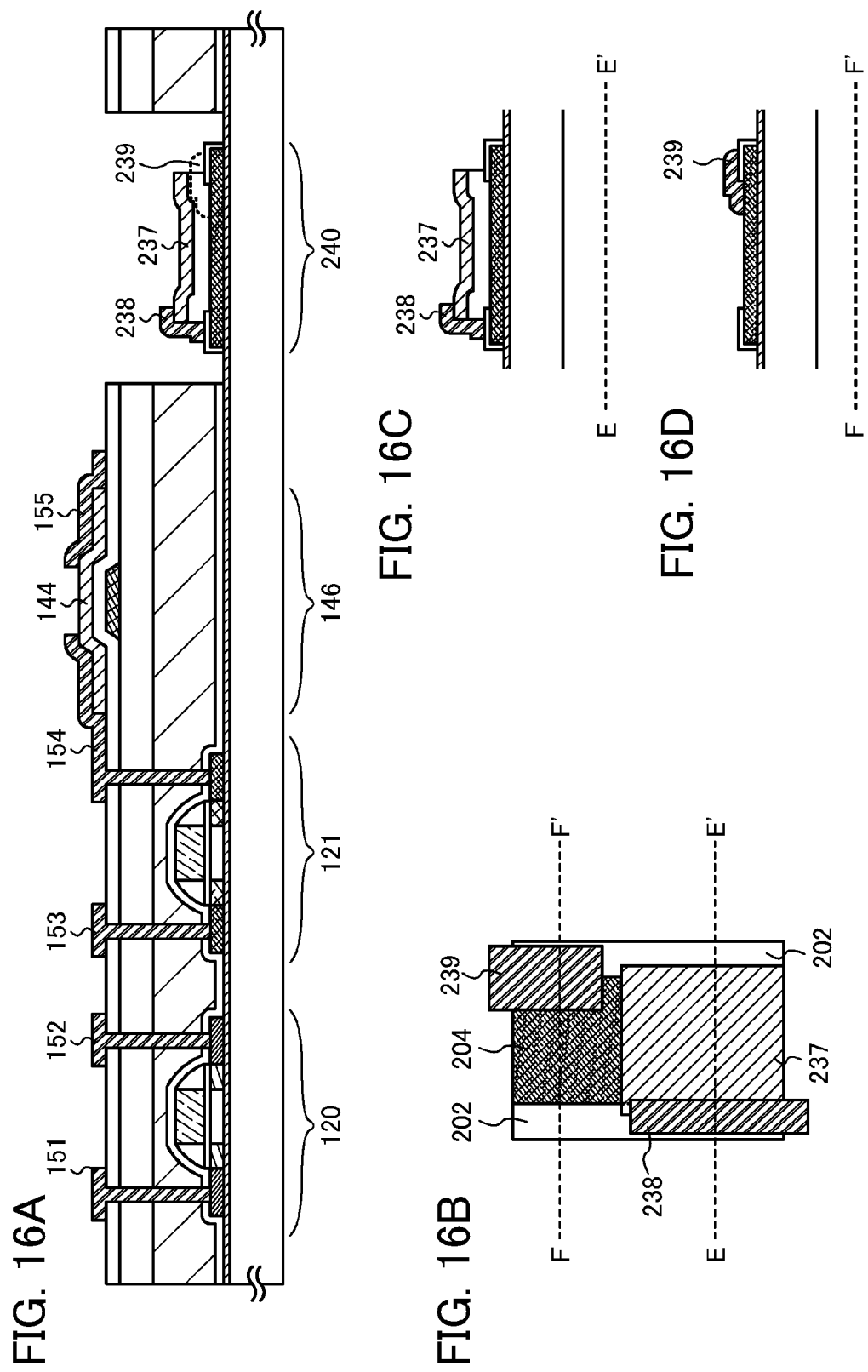

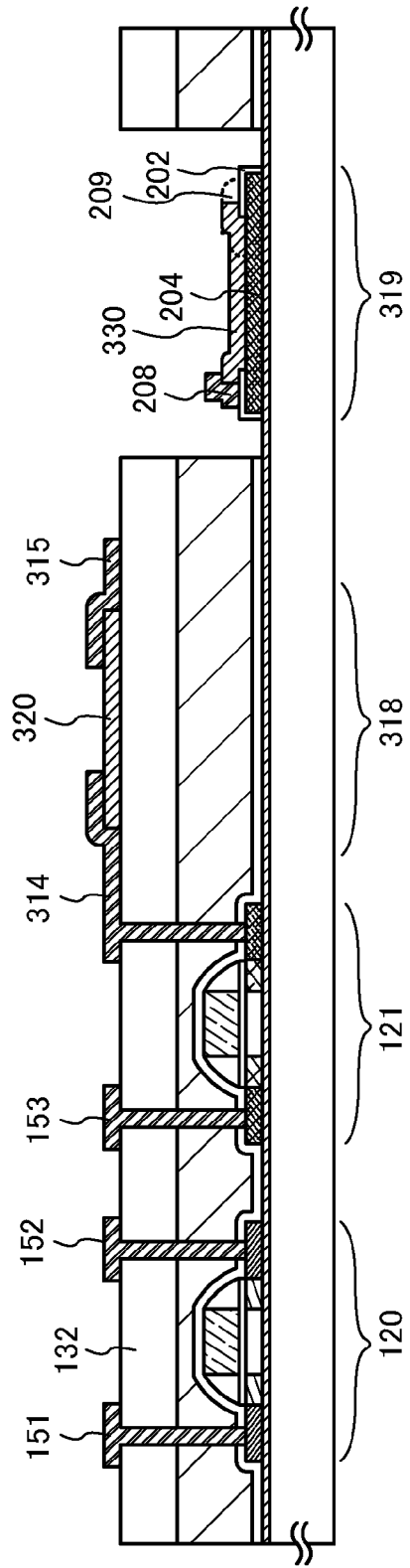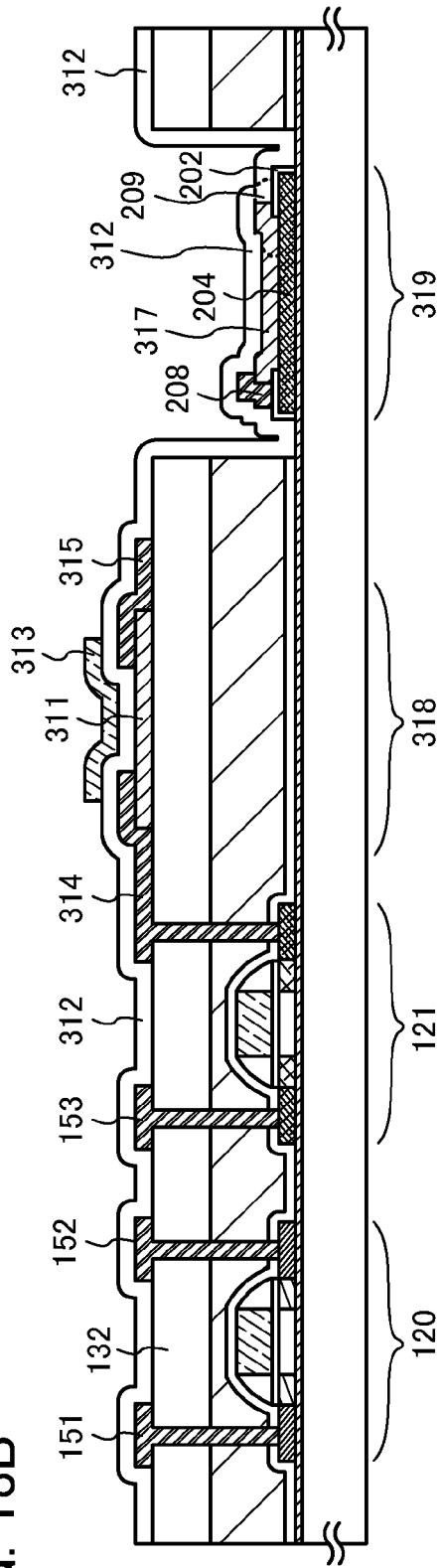

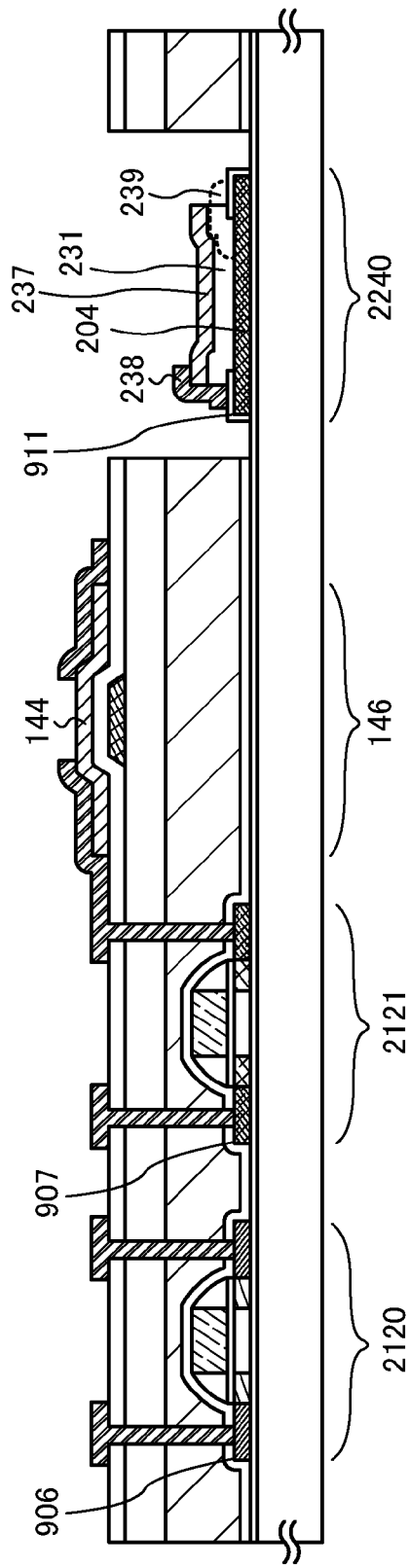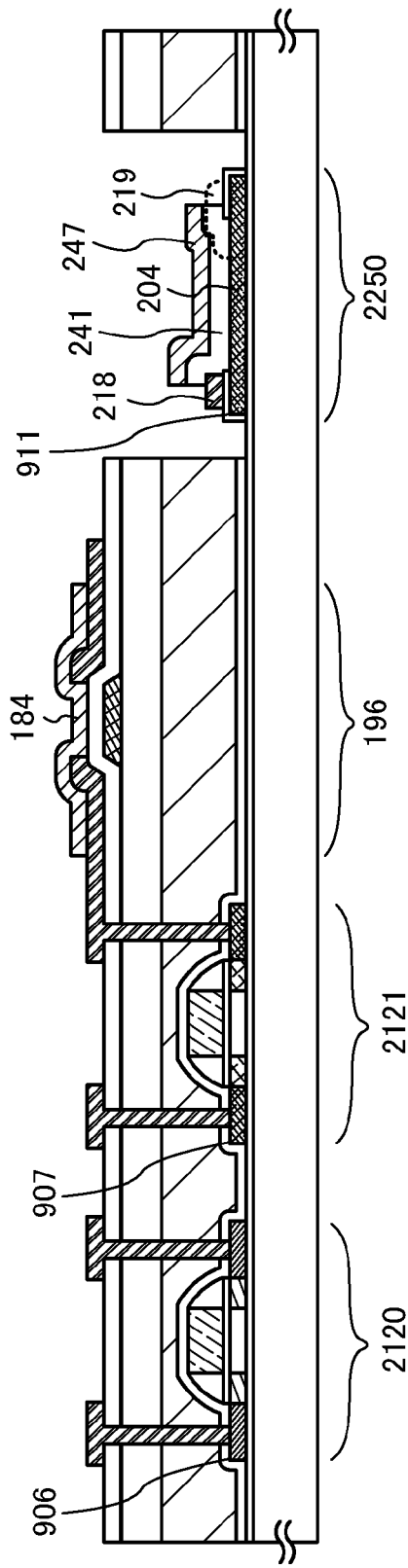

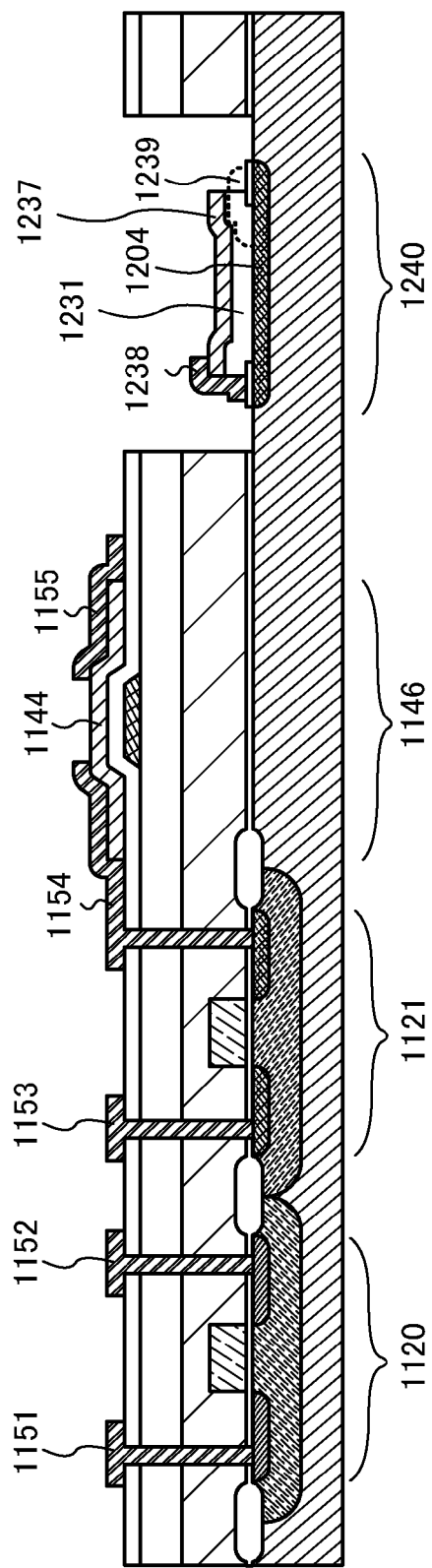
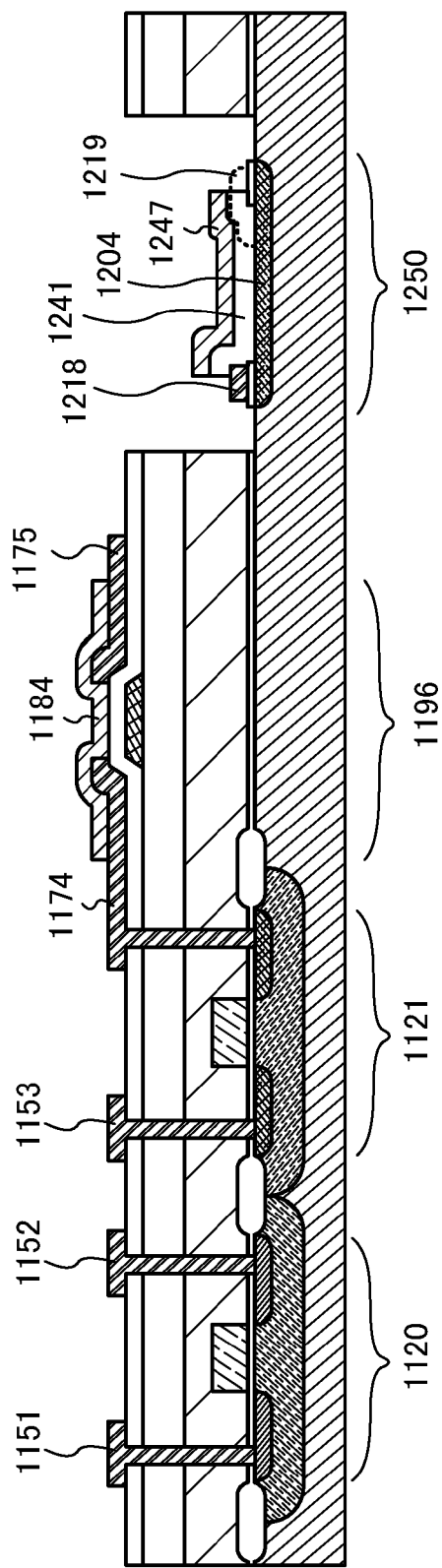

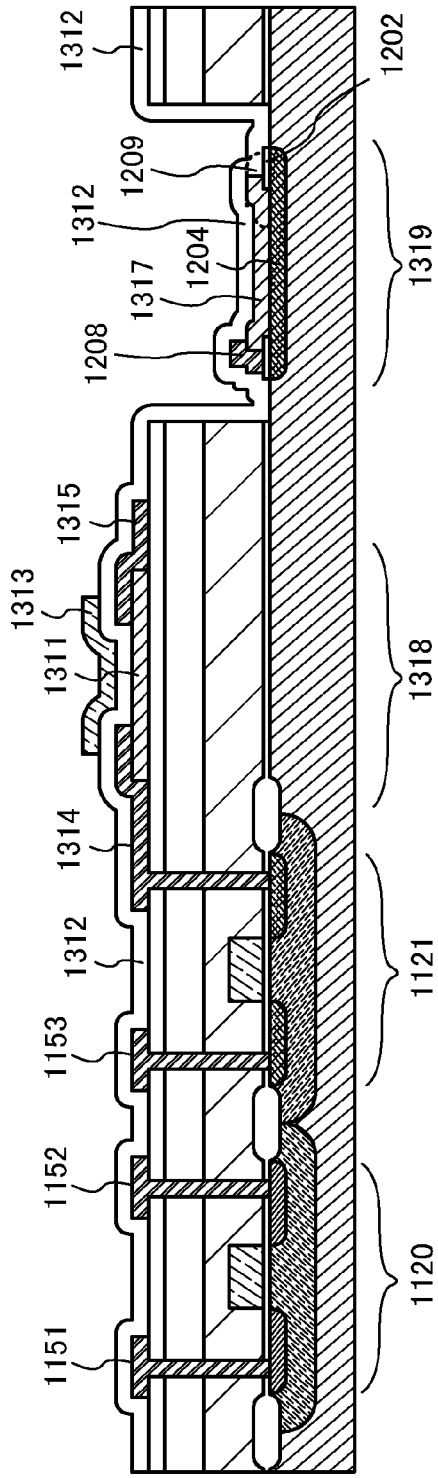
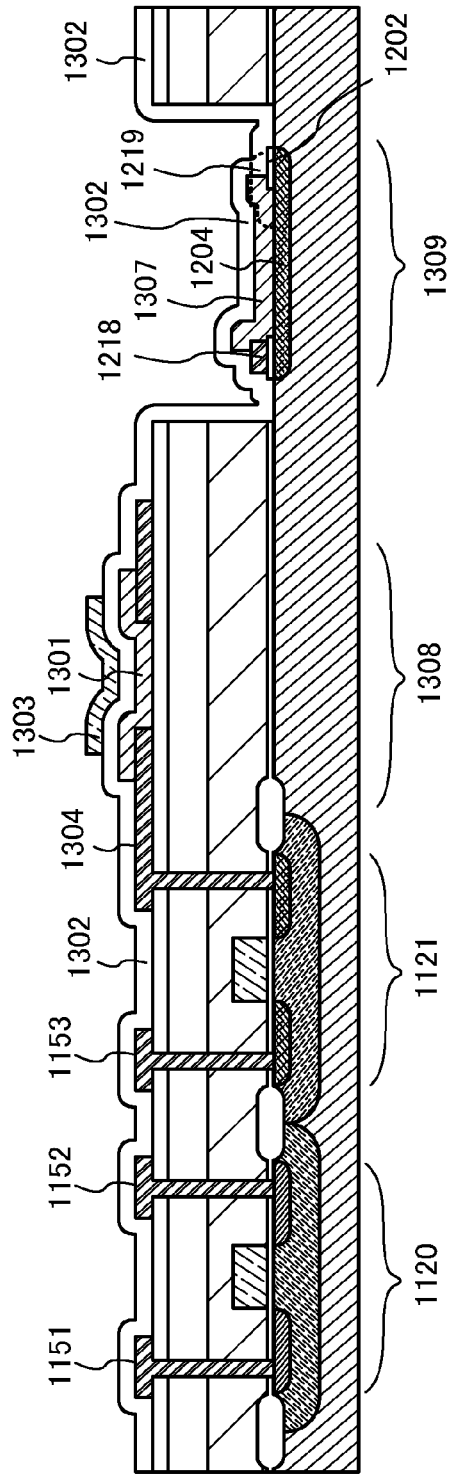

SEMICONDUCTOR DEVICE AND METHOD FOR MANUFACTURING THE SAME

BACKGROUND OF THE INVENTION

1. Field of the Invention

One embodiment of the disclosed invention relates to a semiconductor device and a method for manufacturing the semiconductor device.

2. Description of the Related Art

In recent years, semiconductor devices manufactured using semiconductor layers have been actively developed. Such semiconductor devices include semiconductor elements having various functions. As an example of a semiconductor device which includes semiconductor elements having various functions, a semiconductor device which has a wireless communication function and can transmit and receive data wirelessly can be given.

The semiconductor device having a wireless communication function can communicate with a wireless communication device which functions as a power supply device and a transmitter-receiver (also referred to as an interrogator, a reader/writer, or an R/W). Specifically, data of the semiconductor device can be read by an interrogator, for example. For example, by giving an identification number to the semiconductor device, individual recognition can be performed by the interrogator.

Further, the semiconductor device having a wireless communication function can receive electric power wirelessly from the wireless communication device.

The semiconductor device having a wireless communication function includes an antenna circuit, a memory circuit, an analog circuit, a limiter circuit, and the like, for example (see Patent Document 1).

Further, the semiconductor device having a wireless communication function is also referred to as a wireless tag, a radio frequency (RF) tag, a radio frequency identification (RFID) tag, an integrated circuit (IC) tag, or an identification (ID) tag.

In addition, a semiconductor device which has a memory circuit portion including a plurality of memory elements and has a wireless communication function capable of additionally writing data has been developed.

As a memory element included in the memory circuit portion, a volatile memory and a nonvolatile memory are given. A volatile memory includes a memory element in which data can be rewritten, and a nonvolatile memory includes a memory element in which data cannot be rewritten.

As a kind of memory element included in a nonvolatile memory, there is an antifuse memory element in which a memory layer is provided between a pair of conductors. In the antifuse memory element, when high voltage is applied to the memory layer, an irreversible reaction occurs, so that the pair of conductors can be electrically connected to each other through the memory layer. That is, by identification of the resistance of the antifuse memory element, binary data can be obtained.

An example of the above nonvolatile memory is disclosed in Patent Document 2. In an antifuse memory disclosed in Patent Document 2, amorphous silicon is provided between a pair of conductors. When high voltage is applied to the amorphous silicon, a silicide reaction occurs, so that the pair of electrodes is electrically connected to each other. Such an antifuse memory is referred to as a one time programmable (OTP) memory, a one time programmable read only memory (OTPROM), a programmable read only memory (PROM), or the like.

REFERENCE

Patent Document

[Patent Document 1] Japanese Published Patent Application No. 2008-218989
[Patent Document 2] Japanese Published Patent Application No. H7-297293

SUMMARY OF THE INVENTION

In a semiconductor device having a wireless communication function and being disclosed in Patent Document 1, an antenna circuit, a logic circuit, a memory circuit, an analog circuit, a limiter circuit, and the like are provided.

The logic circuit is required to operate at high speed. In addition, the memory circuit is required to hold voltage for a long time.

Therefore, the logic circuit preferably includes a semiconductor element capable of high-speed operation. The memory circuit preferably includes a semiconductor element capable of holding voltage for a long time.

A limiter circuit is a circuit that controls output voltage and, for example, is a circuit including a rectifier element such as a diode in many cases.

As described above, in the semiconductor device, required functions differ between circuits. Therefore, it is preferable to use semiconductor elements having different characteristics depending on the functions.

However, many manufacturing steps are needed to separately manufacture semiconductor elements having different characteristics depending on the functions. When many manufacturing steps are needed, the manufacturing process becomes complicated. As a result, yield of the semiconductor device is decreased or manufacturing cost thereof is increased.

In view of the above problem, an object of one embodiment of the disclosed invention is to reduce the number of manufacturing steps of a semiconductor device.

Another object of one embodiment of the disclosed invention is to improve yield of a semiconductor device.

Another object of one embodiment of the disclosed invention is to reduce manufacturing cost of a semiconductor device.

In one embodiment of the disclosed invention, through a process for manufacturing a first semiconductor element and a second semiconductor element which have different characteristics from each other, a third semiconductor element is also manufactured. For example, through a process for manufacturing two transistors having different characteristics from each other, a rectifier element (e.g., a diode) is simultaneously manufactured.

The first semiconductor element is a semiconductor element capable of high-speed operation, and the second semiconductor element is a semiconductor element capable of holding voltage for a long time. As the semiconductor element capable of high-speed operation, for example, a transistor having high mobility is preferable. As the semiconductor element capable of holding voltage for a long time, for example, a transistor capable of holding voltage for a long time is preferable.

More specifically, a transistor having a single crystal semiconductor layer in a channel formation region is preferable as the transistor having high mobility. A transistor having an oxide semiconductor film in a channel formation region is preferable as the transistor capable of holding voltage for a long time.

In one embodiment of the disclosed invention, with the use of a process for manufacturing a transistor having a single crystal semiconductor layer in a channel formation region and a transistor having an oxide semiconductor film in a channel formation region, a rectifier element is manufactured simultaneously with the transistors.

One embodiment of the disclosed invention relates to a semiconductor device including a first transistor having a first single crystal semiconductor layer provided over an insulating surface in a channel formation region; a second transistor that is provided above the first transistor with an insulating layer positioned therebetween and has a first oxide semiconductor layer in a channel formation region; and a rectifier element in which a second single crystal semiconductor layer provided over the insulating surface and a second oxide semiconductor layer including the same material as the first oxide semiconductor layer are stacked.

One embodiment of the disclosed invention relates to a semiconductor device including a first transistor having a first single crystal semiconductor layer provided over an insulating surface in a channel formation region; a second transistor that is provided above the first transistor with an insulating layer positioned therebetween and has a first oxide semiconductor layer in a channel formation region; and a rectifier element in which a second single crystal semiconductor layer provided over the insulating surface, an intrinsic semiconductor layer, and a second oxide semiconductor layer including the same material as the first oxide semiconductor layer are stacked.

One embodiment of the disclosed invention relates to a semiconductor device including a p-channel first transistor having a first single crystal semiconductor layer provided over an insulating surface in a channel formation region; an n-channel second transistor having a second single crystal semiconductor layer provided over the insulating surface in a channel formation region; an n-channel third transistor that is provided above the first transistor and the second transistor with an insulating layer positioned between the third transistor and the first and second transistors and has a first oxide semiconductor layer in a channel formation region; and a rectifier element in which a third single crystal semiconductor layer provided over the insulating surface and a second oxide semiconductor layer including the same material as the first oxide semiconductor layer are stacked.

One embodiment of the disclosed invention relates to a semiconductor device including a p-channel first transistor having a first single crystal semiconductor layer provided over an insulating surface in a channel formation region; an n-channel second transistor having a second single crystal semiconductor layer provided over the insulating surface in a channel formation region; an n-channel third transistor that is provided above the first transistor and the second transistor with an insulating layer positioned between the third transistor and the first and second transistors and has a first oxide semiconductor layer in a channel formation region; and a rectifier element in which a third single crystal semiconductor layer provided over the insulating surface, an intrinsic semiconductor layer, and a second oxide semiconductor layer including the same material as the first oxide semiconductor layer are stacked.

One embodiment of the disclosed invention relates to a semiconductor device including a first transistor having a first polycrystalline semiconductor layer provided over an insulating surface in a channel formation region; a second transistor that is provided above the first transistor with an insulating layer positioned therebetween and has a first oxide semiconductor layer in a channel formation region; and a rectifier element in which a second polycrystalline semiconductor layer provided over the insulating surface and a second oxide semiconductor layer including the same material as the first oxide semiconductor layer are stacked.

One embodiment of the disclosed invention relates to a semiconductor device including a first transistor having a first polycrystalline semiconductor layer provided over an insulating surface in a channel formation region; a second transistor that is provided above the first transistor with an insulating layer positioned therebetween and has a first oxide semiconductor layer in a channel formation region; and a rectifier element in which a second polycrystalline semiconductor layer provided over the insulating surface, an intrinsic semiconductor layer, and a second oxide semiconductor layer including the same material as the first oxide semiconductor layer are stacked.

One embodiment of the disclosed invention relates to a semiconductor device including a p-channel first transistor having a first polycrystalline semiconductor layer provided over an insulating surface in a channel formation region; an n-channel second transistor having a second polycrystalline semiconductor layer provided over the insulating surface in a channel formation region; an n-channel third transistor that is provided above the first transistor and the second transistor with an insulating layer positioned between the third transistor and the first and second transistors and has a first oxide semiconductor layer in a channel formation region; and a rectifier element in which a third polycrystalline semiconductor layer provided over the insulating surface and a second oxide semiconductor layer including the same material as the first oxide semiconductor layer are stacked.

One embodiment of the disclosed invention relates to a semiconductor device including a p-channel first transistor having a first polycrystalline semiconductor layer provided over an insulating surface in a channel formation region; an n-channel second transistor having a second polycrystalline semiconductor layer provided over the insulating surface in a channel formation region; an n-channel third transistor that is provided above the first transistor and the second transistor with an insulating layer positioned between the third transistor and the first and second transistors and has a first oxide semiconductor layer in a channel formation region; and a rectifier element in which a third polycrystalline semiconductor layer provided over the insulating surface, an intrinsic semiconductor layer, and a second oxide semiconductor layer including the same material as the first oxide semiconductor layer are stacked.

One embodiment of the disclosed invention relates to a semiconductor device including a first transistor having a channel formation region provided in a single crystal semiconductor substrate; a second transistor that is provided above the first transistor with an insulating layer positioned therebetween and has a first oxide semiconductor layer in a channel formation region; and a rectifier element in which an impurity region provided in the single crystal semiconductor substrate and a second oxide semiconductor layer including the same material as the first oxide semiconductor layer are stacked.

One embodiment of the disclosed invention relates to a semiconductor device including a first transistor having a channel formation region provided in a single crystal semiconductor substrate; a second transistor that is provided above the first transistor with an insulating layer positioned therebetween and has a first oxide semiconductor layer in a channel formation region; and a rectifier element in which an impurity region provided in the single crystal semiconductor substrate, an intrinsic semiconductor layer, and a second oxide semiconductor layer including the same material as the first oxide semiconductor layer are stacked.

One embodiment of the disclosed invention relates to a semiconductor device including a p-channel first transistor having a channel formation region provided in a single crystal semiconductor substrate; an n-channel second transistor having a channel formation region provided in the single crystal semiconductor substrate; an n-channel third transistor that is provided above the first transistor and the second transistor with an insulating layer positioned between the third transistor and the first and second transistors and has a first oxide semiconductor layer in a channel formation region; and a rectifier element in which an impurity region provided in the single crystal semiconductor substrate and a second oxide semiconductor layer including the same material as the first oxide semiconductor layer are stacked.

One embodiment of the disclosed invention relates to a semiconductor device including a p-channel first transistor having a channel formation region provided in a single crystal semiconductor substrate; an n-channel second transistor having a channel formation region provided in the single crystal semiconductor substrate; an n-channel third transistor that is provided above the first transistor and the second transistor with an insulating layer positioned between the third transistor and the first and second transistors and has a first oxide semiconductor layer in a channel formation region; and a rectifier element in which an impurity region provided in the single crystal semiconductor substrate, an intrinsic semiconductor layer, and a second oxide semiconductor layer including the same material as the first oxide semiconductor layer are stacked.

In one embodiment of the disclosed invention, the second transistor is an n-channel transistor.

In one embodiment of the disclosed invention, the third transistor is an n-channel transistor.

In one embodiment of the disclosed invention, the second transistor is a bottom-gate transistor.

In one embodiment of the disclosed invention, the third transistor is a bottom-gate transistor.

In one embodiment of the disclosed invention, the second transistor is a top-gate transistor.

In one embodiment of the disclosed invention, the third transistor is a top-gate transistor.

One embodiment of the disclosed invention relates to a method for manufacturing a semiconductor device, including the steps of forming a single crystal semiconductor layer; forming a first semiconductor layer and a second semiconductor layer by processing the single crystal semiconductor layer; forming a first transistor having the first semiconductor layer in a channel formation region; forming an insulating layer to cover the first transistor and the second semiconductor layer; exposing the second semiconductor layer by removing part of the insulating layer; forming a first oxide semiconductor layer and a second oxide semiconductor layer over the insulating layer and the second semiconductor layer, respectively; and forming a second transistor having the first oxide semiconductor layer and a rectifier element having the second semiconductor layer and the second oxide semiconductor layer.

One embodiment of the disclosed invention relates to a method for manufacturing a semiconductor device, including the steps of forming a single crystal semiconductor layer; forming a first semiconductor layer and a second semiconductor layer by processing the single crystal semiconductor layer; forming a first transistor having the first semiconductor layer in a channel formation region; forming an insulating layer to cover the first transistor and the second semiconductor layer; exposing the second semiconductor layer by removing part of the insulating layer; forming an intrinsic semiconductor layer over the exposed second semiconductor layer; forming a first oxide semiconductor layer and a second oxide semiconductor layer over the insulating layer and the intrinsic semiconductor layer, respectively; and forming a second transistor having the first oxide semiconductor layer and a rectifier element having the second semiconductor layer, the intrinsic semiconductor layer, and the second oxide semiconductor layer.

One embodiment of the disclosed invention relates to a method for manufacturing a semiconductor device, including the steps of forming a single crystal semiconductor layer; forming a first semiconductor layer, a second semiconductor layer, and a third semiconductor layer by processing the single crystal semiconductor layer; forming a p-channel first transistor having the first semiconductor layer in a channel formation region; forming an n-channel second transistor having the second semiconductor layer in a channel formation region; forming an insulating film to cover the first transistor, the second transistor, and the third semiconductor layer; exposing the third semiconductor layer by removing part of the insulating film; forming a first oxide semiconductor layer and a second oxide semiconductor layer over the insulating film and the third semiconductor layer, respectively; and forming a third transistor having the first oxide semiconductor layer and a rectifier element having the third semiconductor layer and the second oxide semiconductor layer.

One embodiment of the disclosed invention relates to a method for manufacturing a semiconductor device, including the steps of forming a single crystal semiconductor layer; forming a first semiconductor layer, a second semiconductor layer, and a third semiconductor layer by processing the single crystal semiconductor layer; forming a p-channel first transistor having the first semiconductor layer in a channel formation region; forming an n-channel second transistor having the second semiconductor layer in a channel formation region; forming an insulating film to cover the first transistor, the second transistor, and the third semiconductor layer; exposing the third semiconductor layer by removing part of the insulating film; forming an intrinsic semiconductor layer over the exposed third semiconductor layer; forming a first oxide semiconductor layer and a second oxide semiconductor layer over the insulating film and the intrinsic semiconductor layer, respectively; and forming a third transistor having the first oxide semiconductor layer and a rectifier element having the third semiconductor layer, the intrinsic semiconductor layer, and the second oxide semiconductor layer.

One embodiment of the disclosed invention relates to a method for manufacturing a semiconductor device, including the steps of forming a polycrystalline semiconductor layer; forming a first semiconductor layer and a second semiconductor layer by processing the polycrystalline semiconductor layer; forming a first transistor having the first semiconductor layer in a channel formation region; forming an insulating film to cover the first transistor and the second semiconductor layer; exposing the second semiconductor layer by removing part of the insulating film; forming a first oxide semiconductor layer and a second oxide semiconductor layer over the insulating film and the second semiconductor layer, respectively; and forming a second transistor having the first oxide semiconductor layer and a rectifier element having the second semiconductor layer and the second oxide semiconductor layer.

One embodiment of the disclosed invention relates to a method for manufacturing a semiconductor device, including the steps of forming a polycrystalline semiconductor layer; forming a first semiconductor layer and a second semiconductor layer by processing the polycrystalline semiconductor layer; forming a first transistor having the first semiconductor layer in a channel formation region; forming an insulating film to cover the first transistor and the second semiconductor layer; exposing the second semiconductor layer by removing part of the insulating film; forming an intrinsic semiconductor layer over the exposed second semiconductor layer; forming a first oxide semiconductor layer and a second oxide semiconductor layer over the insulating film and the intrinsic semiconductor layer, respectively; and forming a second transistor having the first oxide semiconductor layer and a rectifier element having the second semiconductor layer, the intrinsic semiconductor layer, and the second oxide semiconductor layer.

One embodiment of the disclosed invention relates to a method for manufacturing a semiconductor device, including the steps of forming a polycrystalline semiconductor layer; forming a first semiconductor layer, a second semiconductor layer, and a third semiconductor layer by processing the polycrystalline semiconductor layer; forming a p-channel first transistor having the first semiconductor layer in a channel formation region; forming an n-channel second transistor having the second semiconductor layer in a channel formation region; forming an insulating layer to cover the first transistor, the second transistor, and the third semiconductor layer; exposing the third semiconductor layer by removing part of the insulating layer; forming a first oxide semiconductor layer and a second oxide semiconductor layer over the insulating layer and the third semiconductor layer, respectively; and forming a third transistor having the first oxide semiconductor layer and a rectifier element having the third semiconductor layer and the second oxide semiconductor layer.

One embodiment of the disclosed invention relates to a method for manufacturing a semiconductor device, including the steps of forming a polycrystalline semiconductor layer; forming a first semiconductor layer, a second semiconductor layer, and a third semiconductor layer by processing the polycrystalline semiconductor layer; forming a p-channel first transistor having the first semiconductor layer in a channel formation region; forming an n-channel second transistor having the second semiconductor layer in a channel formation region; forming an insulating layer to cover the first transistor, the second transistor, and the third semiconductor layer; exposing the third semiconductor layer by removing part of the insulating layer; forming an intrinsic semiconductor layer over the exposed third semiconductor layer; forming a first oxide semiconductor layer and a second oxide semiconductor layer over the insulating layer and the intrinsic semiconductor layer, respectively; and forming a third transistor having the first oxide semiconductor layer and a rectifier element having the third semiconductor layer, the intrinsic semiconductor layer, and the second oxide semiconductor layer.

One embodiment of the disclosed invention relates to a method for manufacturing a semiconductor device, including the steps of forming a first transistor having a first region of a single crystal semiconductor substrate in a channel formation region; forming an insulating layer to cover the first transistor and another region of the single crystal semiconductor substrate; exposing a second region of the single crystal semiconductor substrate by removing part of the insulating layer; forming a first oxide semiconductor layer and a second oxide semiconductor layer over the insulating layer and the second region of the single crystal semiconductor substrate, respectively; and forming a second transistor having the first oxide semiconductor layer and a rectifier element having the second region of the single crystal semiconductor substrate and the second oxide semiconductor layer.

One embodiment of the disclosed invention relates to a method for manufacturing a semiconductor device, including the steps of forming a first transistor having a first region of a single crystal semiconductor substrate in a channel formation region; forming an insulating layer to cover the first transistor and another region of the single crystal semiconductor substrate; exposing a second region of the single crystal semiconductor substrate by removing part of the insulating layer; forming an intrinsic semiconductor layer over the exposed second region of the single crystal semiconductor substrate; forming a first oxide semiconductor layer and a second oxide semiconductor layer over the insulating layer and the intrinsic semiconductor layer, respectively; and forming a second transistor having the first oxide semiconductor layer and a rectifier element having the second region of the single crystal semiconductor substrate, the intrinsic semiconductor layer, and the second oxide semiconductor layer.

One embodiment of the disclosed invention relates to a method for manufacturing a semiconductor device, including the steps of forming a p-channel first transistor having a first region of a single crystal semiconductor substrate in a channel formation region; forming an n-channel second transistor having a second region of the single crystal semiconductor substrate in a channel formation region; forming an insulating layer to cover the first transistor, the second transistor, and another region of the single crystal semiconductor substrate; exposing a third region of the single crystal semiconductor substrate by removing part of the insulating layer; forming a first oxide semiconductor layer and a second oxide semiconductor layer over the insulating layer and the third region of the single crystal semiconductor substrate, respectively; and forming a third transistor having the first oxide semiconductor layer and a rectifier element having the third region of the single crystal semiconductor substrate and the second oxide semiconductor layer.

One embodiment of the disclosed invention relates to a method for manufacturing a semiconductor device, including the steps of forming a p-channel first transistor having a first region of a single crystal semiconductor substrate in a channel formation region; forming an n-channel second transistor having a second region of the single crystal semiconductor substrate in a channel formation region; forming an insulating layer to cover the first transistor, the second transistor, and another region of the single crystal semiconductor substrate; exposing a third region of the single crystal semiconductor substrate by removing part of the insulating layer; forming an intrinsic semiconductor layer over the exposed third region of the single crystal semiconductor substrate, forming a first oxide semiconductor layer and a second oxide semiconductor layer over the insulating layer and the intrinsic semiconductor layer, respectively; and forming a third transistor having the first oxide semiconductor layer and a rectifier element having the third region of the single crystal semiconductor substrate, the intrinsic semiconductor layer, and the second oxide semiconductor layer.

According to one embodiment of the disclosed invention, in the manufacture of a semiconductor device, through a process for manufacturing a first semiconductor element and a second semiconductor element which have different characteristics from each other, a third semiconductor element is also manufactured; thus, the number of manufacturing steps can be reduced. When the number of manufacturing steps of the semiconductor device is reduced, yield of the semiconductor device can be improved. When the number of manufacturing steps of the semiconductor device is reduced, manufacturing cost of the semiconductor device can be reduced.

BRIEF DESCRIPTION OF THE DRAWINGS

In the accompanying drawings:

FIGS. 2A to 2D are cross-sectional views illustrating manufacturing steps of a semiconductor device;

FIGS. 3A to 3D are cross-sectional views illustrating manufacturing steps of a semiconductor device;

FIGS. 5A to 5C are cross-sectional views illustrating manufacturing steps of a semiconductor device;

FIGS. 6A to 6D are cross-sectional views and a top view illustrating a manufacturing step of a semiconductor device;

FIGS. 7A to 7C are cross-sectional views illustrating manufacturing steps of a semiconductor device;

FIGS. 9A to 9C are cross-sectional views illustrating manufacturing steps of a semiconductor device;

FIGS. 10A and 10B are cross-sectional views illustrating manufacturing steps of a semiconductor device;

FIGS. 11A and 11B are cross-sectional views illustrating manufacturing steps of a semiconductor device;

FIGS. 15A to 15D are cross-sectional views and a top view illustrating a manufacturing step of a semiconductor device;

FIGS. 16A to 16D are cross-sectional views and a top view illustrating a manufacturing step of a semiconductor device;

FIGS. 18A and 18B are cross-sectional views illustrating manufacturing steps of a semiconductor device;

FIGS. 21A and 21B are cross-sectional views illustrating manufacturing steps of semiconductor devices;

FIGS. 27A and 27B are cross-sectional views illustrating manufacturing steps of semiconductor devices; and FIGS. 28A and 28B are cross-sectional views illustrating manufacturing steps of semiconductor devices.

DETAILED DESCRIPTION OF THE INVENTION

Figure 1A:
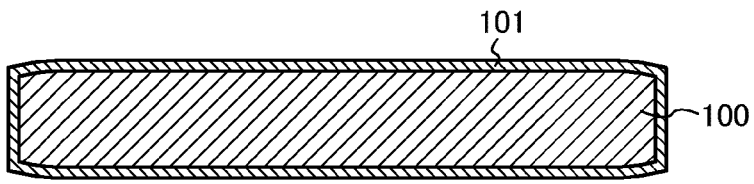
FIGS. 1A to 1E are cross-sectional views illustrating manufacturing steps of a semiconductor device.

Embodiments of the invention disclosed in this specification will be described below with reference to the accompanying drawings. Note that the invention disclosed in this specification can be carried out in a variety of different modes, and it is easily understood by those skilled in the art that the modes and details of the invention disclosed in this specification can be changed in various ways without departing from the spirit and scope thereof. Therefore, the invention disclosed in this specification is not construed as being limited to description of the embodiments. Note that in the drawings hereinafter shown, the same portions or portions having similar functions are denoted by the same reference numerals, and repeated description thereof will be omitted.

Note that in the invention disclosed in this specification, a semiconductor device refers to an element or a device in general which functions by utilizing a semiconductor and includes, in its category, electric devices including electronic circuits, display devices, light-emitting devices, and the like and electronic appliances on which the electric devices are mounted.

Embodiment 1

This embodiment will be described with reference to FIGS. 1A to 1E, FIGS. 2A to 2D, FIGS. 3A to 3D, FIGS. 4A to 4C, FIGS. 5A to 5C, and FIGS. 6A to 6D.

In this embodiment, a transistor including silicon is manufactured with the use of a silicon-on-insulator (SOI) substrate, and then a transistor including an oxide semiconductor is manufactured. Through a process for manufacturing the transistor including silicon and the transistor including an oxide semiconductor, a rectifier element (e.g., a diode) is also manufactured. A method for manufacturing a semiconductor device which includes a transistor including silicon, a transistor including an oxide semiconductor, and a rectifier element (e.g., a diode) will be described.

First, as illustrated in FIG. 1A, a bond substrate 100 is cleaned, and then an insulating film 101 is formed over a surface of the bond substrate 100.

As the bond substrate 100, a single crystal semiconductor substrate formed using silicon can be used. Alternatively, a semiconductor substrate formed using silicon having crystal lattice distortion, silicon germanium obtained by adding germanium to silicon, or the like may be used as the bond substrate 100.

Note that in a single crystal semiconductor substrate used as the bond substrate 100, the directions of crystal axes are preferably uniform; however, the substrate does not necessarily include perfect crystals in which a lattice defect such as a point defect, a line defect, or a plane defect is completely eliminated.

The insulating film 101 may be a single insulating film or a stack of plural insulating films. Considering that a region which includes impurities is removed later, it is preferable to form the insulating film 101 to a thickness of greater than or equal to 15 nm and less than or equal to 500 nm.

As a film included in the insulating film 101, an insulating film including silicon or germanium as a component such as a silicon oxide film, a silicon nitride film, a silicon oxynitride film, a silicon nitride oxide film, a germanium oxide film, a germanium nitride film, a germanium oxynitride film, or a germanium nitride oxide film can be used. Further, an insulating film including a metal oxide such as aluminum oxide, tantalum oxide, or hafnium oxide; an insulating film including a metal nitride such as aluminum nitride; an insulating film including a metal oxynitride such as an aluminum oxynitride film; or an insulating film including a metal nitride oxide such as an aluminum nitride oxide film can be used.

In this embodiment, an example in which silicon oxide formed by thermal oxidation of the bond substrate 100 is used as the insulating film 101 is described. Note that in FIG. 1A, the insulating film 101 is formed so as to cover the entire surface of the bond substrate 100; however, the insulating film 101 may be formed over at least one surface of the bond substrate 100.

In this specification, an oxynitride refers to a substance which includes more oxygen than nitrogen, and a nitride oxide refers to a substance which includes more nitrogen than oxygen. For example, silicon oxynitride can be a substance including oxygen, nitrogen, silicon, and hydrogen in ranges of greater than or equal to 50 atomic % and less than or equal to 70 atomic %, greater than or equal to 0.5 atomic % and less than or equal to 15 atomic %, greater than or equal to 25 atomic % and less than or equal to 35 atomic %, and greater than or equal to 0.1 atomic % and less than or equal to 10 atomic %, respectively.

Further, silicon nitride oxide can be a substance including oxygen, nitrogen, silicon, and hydrogen in ranges of greater than or equal to 5 atomic % and less than or equal to 30 atomic %, greater than or equal to 20 atomic % and less than or equal to 55 atomic %, greater than or equal to 25 atomic % and less than or equal to 35 atomic %, and greater than or equal to 10 atomic % and less than or equal to 30 atomic %, respectively.

Note that the above ranges are obtained by measurement using Rutherford backscattering spectrometry (RBS) or hydrogen forward scattering spectrometry (HFS). In addition, the total of the percentages of the constituent elements does not exceed 100 atomic %.

In the case where the insulating film 101 is formed by thermal oxidation of the surface of the bond substrate 100, dry oxidation in which oxygen including a small amount of moisture is used, thermal oxidation in which a gas including a halogen such as hydrogen chloride is added to an oxygen atmosphere, or the like can be used as the thermal oxidation. In addition, wet oxidation such as pyrogenic oxidation in which hydrogen is burnt with oxygen to generate water or water vapor oxidation in which high-purity water is heated to 100° C. or higher to generate water vapor and oxidation is performed with the use of the water vapor may be employed for forming the insulating film 101.

In the case where a base substrate 103 includes an impurity which decreases reliability of a semiconductor device, such as an alkali metal or an alkaline earth metal, it is preferable to provide a barrier film that can prevent such an impurity from diffusing from the base substrate 103 into a semiconductor film which is formed after separation. The insulating film 101 preferably includes at least one barrier film.

As an insulating film that can be used as the barrier film, a silicon nitride film, a silicon nitride oxide film, an aluminum nitride film, an aluminum nitride oxide film, and the like can be given. The insulating film that is used as the barrier film is preferably formed to a thickness of 15 nm to 300 nm, for example. In addition, an insulating film which has a lower proportion of nitrogen than the barrier film, such as a silicon oxide film or a silicon oxynitride film, may be formed between the barrier film and the bond substrate 100. The insulating film which has a lower proportion of nitrogen may be formed to a thickness of greater than or equal to 5 nm and less than or equal to 200 nm.

In the case of using silicon oxide for the insulating film 101, the insulating film 101 can be formed by a vapor deposition method such as a thermal CVD method, a plasma CVD method, an atmospheric pressure CVD method, or a bias ECRCVD method using a mixed gas of silane and oxygen, a mixed gas of tetraethyl orthosilicate (TEOS) and oxygen, or the like. In this case, a surface of the insulating film 101 may be subjected to oxygen plasma treatment to increase the density. In the case of using silicon nitride for the insulating film 101, the insulating film 101 can be formed by a vapor deposition method such as a plasma CVD method using a mixed gas of silane and ammonia.

Alternatively, the insulating film 101 may be formed using silicon oxide by a chemical vapor deposition method with the use of an organosilane gas. As the organosilane gas, the following compound including silicon can be used: tetraethyl orthosilicate (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), trisdimethylaminosilane (chemical formula: $SiH(N(CH_3)_2)_3$), or the like.

By using an organosilane gas as a source gas, a silicon oxide film with a smooth surface can be formed at a process temperature of 350° C. or lower. Alternatively, the insulating film 101 can be formed using a low temperature oxide (LTO) which is formed by a thermal CVD method at a heating temperature of higher than or equal to 200° C. and lower than or equal to 500° C. An LTO can be formed by using monosilane ($SiH_4$), disilane ($Si_2H_6$), or the like for a silicon source gas and using nitrogen dioxide ($NO_2$) or the like for an oxygen source gas.

It is to be noted that an insulating film formed at a relatively low temperature, such as a silicon oxide film formed using organosilane or a silicon nitride oxide film formed at a low temperature, has a number of OH groups on its surface. Hydrogen bonding between the OH group and a water molecule forms a silanol group and bonds the base substrate and the insulating film at a low temperature. A siloxane bond, which is a covalent bond, is formed finally between the base substrate and the insulating film. Therefore, the insulating film such as the silicon oxide film formed using organosilane or the LTO formed at a relatively low temperature is suitable for bonding at a low temperature, as compared with a thermal oxide film having no OH groups or having very few OH groups which is used in Smart Cut (registered trademark) or the like.

The insulating film 101 forms a bonding plane which is smooth and hydrophilic over the surface of the bond substrate 100. Therefore, the average surface roughness Ra of the insulating film 101 is preferably 0.7 nm or less, further preferably 0.4 nm or less. The thickness of the insulating film 101 may be greater than or equal to 5 nm and less than or equal to 500 nm, preferably greater than or equal to 10 nm and less than or equal to 200 nm.

Figure 1B:
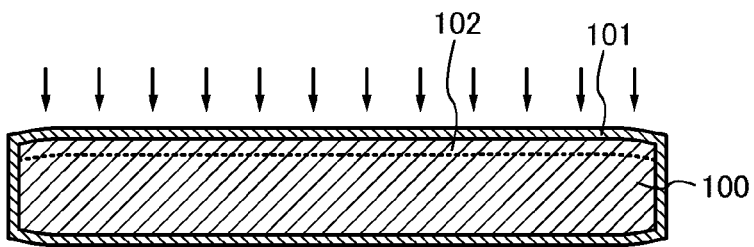

Next, as illustrated in FIG. 1B, an ion beam including ions accelerated by an electric field is emitted to the bond substrate 100 through the insulating film 101 as indicated by arrows. Thus, an embrittlement layer 102 having microvoids is formed in a region at an appropriate depth from the surface of the bond substrate 100. For example, the embrittlement layer means a layer which is locally embrittled by disorder of a crystal structure, and the state of the embrittlement layer depends on a means for forming the embrittlement layer. Note that there may be a case where a region ranging from one surface of the bond substrate to the embrittlement layer is embrittled to some extent; however, the embrittlement layer in this specification refers to a region at which separation is performed later and its vicinity.

The depth at which the embrittlement layer 102 is formed can be adjusted by the acceleration energy of the ion beam and the incident angle thereof. The acceleration energy can be adjusted by acceleration voltage, dose, or the like. The embrittlement layer 102 is formed at the same depth or substantially the same depth as the average penetration depth of ions. The thickness of a single crystal semiconductor layer 104 which is separated from the bond substrate 100 later is determined on the basis of the depth to which ions are emitted. The depth at which the embrittlement layer 102 is formed can be in the range of, for example, greater than or equal to 50 nm and less than or equal to 500 nm, preferably greater than or equal to 50 nm and less than or equal to 200 nm.

The implantation of ions to the bond substrate 100 is preferably performed by an ion doping method, in which mass separation is not conducted, in terms of shortening the takt time; in this embodiment, an ion implantation method in which mass separation is conducted may be employed.

When hydrogen ($H_2$) is used for a source gas, $H^+$, $H_2^+$, and $H_3^+$ can be produced by exciting a hydrogen gas. The proportion of ion species produced from the source gas can be changed by adjusting a plasma excitation method, the pressure of an atmosphere for generating plasma, the amount of a supplied source gas, or the like. In the case where the ion implantation is performed by an ion doping method, it is preferable that $H_3^+$ be included at 50% or higher with respect to the total amount of $H^+$, $H_2^+$, and $H_3^+$ in the ion beam, and it is further preferable that the proportion of $H_3^+$ be 80% or higher. When $H_3^+$ is included at 80% or higher, the proportion of $H_2^+$ ions in the ion beam is lower relatively, which results in smaller variation in the average penetration depth of the hydrogen ions included in the ion beam. Consequently, the ion implantation efficiency is improved and the takt time can be shortened.

$H_3^+$ has larger mass than $H^+$ and $H_2^+$. When the ion beam including a higher proportion of $H_3^+$ is compared with the ion beam including a higher proportion of $H^+$ and $H_2^+$, the former can implant hydrogen into a shallower region of the bond substrate 100 than the latter even if the acceleration voltage at the time of doping is the same. Moreover, since the former has a steep concentration distribution of hydrogen implanted into the bond substrate 100 in a thickness direction, the embrittlement layer 102 itself can be formed to be thinner.

Helium (He) can be used for the source gas of the ion beam. Since most of the ion species produced by exciting helium are $He^+$, $He^+$ can be mainly implanted into the bond substrate 100 even by an ion doping method in which mass separation is not conducted. Therefore, microvoids can be formed in the embrittlement layer 102 efficiently by an ion doping method. In the case of performing ion implantation by an ion doping method using helium, the acceleration voltage can be higher than or equal to 10 kV and lower than or equal to 200 kV, and the dose can be greater than or equal to $1\times10^{16}$ ions/cm$^2$ and less than or equal to $6\times10^{16}$ ions/cm$^2$.

A halogen gas such as a chlorine gas ($Cl_2$ gas) or a fluorine gas ($F_2$ gas) can also be used as the source gas.

Figure 1C:
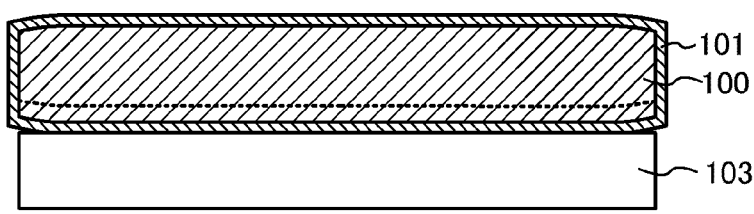

Next, as illustrated in FIG. 1C, the bond substrate 100 and the base substrate 103 are attached to each other with the insulating film 101 positioned therebetween.

Note that before the base substrate 103 and the bond substrate 100 are attached to each other, surface treatment for improving the bonding strength between the insulating film 101 and the base substrate 103 is preferably performed on surfaces for attachment, that is, in this embodiment, a surface of the insulating film 101 formed over the bond substrate 100 and a surface of the base substrate 103.

As examples of the surface treatment, wet treatment, dry treatment, and a combination of wet treatment and dry treatment can be given. Different wet treatments or different dry treatments may be combined to be performed. Examples of the wet treatment include ozone treatment using ozone water (ozone water cleaning), ultrasonic cleaning such as megasonic cleaning, two-fluid cleaning (method in which functional water such as pure water or hydrogenated water and a carrier gas such as nitrogen are sprayed together), and cleaning with hydrochloric acid and hydrogen peroxide water. As examples of the dry treatment, inert gas neutral atomic beam treatment, inert gas ion beam treatment, ultraviolet treatment, ozone treatment, plasma treatment, plasma treatment with bias application, and radical treatment can be given. By performing the above surface treatment, the hydrophilicity and cleanliness of the surfaces for the attachment can be increased. Thus, the bonding strength can be improved.

For the attachment, the base substrate 103 and the insulating film 101 over the bond substrate 100 are disposed in close contact with each other, and then a pressure of approximately higher than or equal to 1 N/cm$^2$ and lower than or equal to 500 N/cm$^2$, preferably higher than or equal to 11 N/cm$^2$ and lower than or equal to 20 N/cm$^2$ is applied to part of the base substrate 103 and the bond substrate 100 which are superposed on each other. When the pressure is applied, bonding between the base substrate 103 and the insulating film 101 starts from that portion, which results in bonding of the entire surface where the base substrate 103 and the insulating film 101 are in close contact with each other.

The bonding is performed by Van der Waals force or a hydrogen bond, so that the bonding is firm even at room temperature. Note that since the above bonding can be performed at a low temperature, various substrates can be used as the base substrate 103. For example, a variety of glass substrates for electronics industry, such as an aluminosilicate glass substrate, a barium borosilicate glass substrate, or an aluminoborosilicate glass substrate, a quartz substrate, a ceramic substrate, a sapphire substrate, or the like can be used as the base substrate 103. As the base substrate 103, a semiconductor substrate formed using silicon, gallium arsenide, indium phosphide, or the like can be used. Alternatively, a metal substrate including a stainless steel substrate may be used as the base substrate 103. A substrate with a coefficient of thermal expansion of greater than or equal to $25\times10^{-7}$/° C. and less than or equal to $50\times10^{-7}$/° C. (preferably greater than or equal to $30\times10^{-7}$/° C. and less than or equal to $40\times10^{-7}$/° C.) and a strain point of higher than or equal to 580° C. and lower than or equal to 680° C. (preferably higher than or equal to 600° C. and lower than or equal to 680° C.) is preferably used as the glass substrate used as the base substrate 103. When the glass substrate is an alkali-free glass substrate, impurity contamination of semiconductor devices can be suppressed.

As the glass substrate, a mother glass substrate developed for production of liquid crystal panels can be used. As such a mother glass substrate, substrates having the following sizes are known: the third generation (550 mm×650 mm), the 3.5-th generation (600 mm×720 mm), the fourth generation (680 mm×880 mm or 730 mm×920 mm), the fifth generation (1100 mm×1300 mm), the sixth generation (1500 mm×1850 mm), the seventh generation (1870 mm×2200 mm), the eighth generation (2200 mm×2400 mm), and the like. When an SOI substrate is manufactured using a large-sized mother glass substrate as the base substrate 103, the SOI substrate can have a large area. By using a large-area substrate like a mother glass substrate as the base substrate 103, an SOI substrate can have a larger area. When the SOI substrate can have a larger area, a plurality of chips such as ICs or LSIs can be manufactured at one time and the number of chips manufactured from one substrate is increased. As a result, the productivity can be improved drastically.

If the base substrate 103 is a glass substrate that largely shrinks when heat treatment is performed thereon, such as EAGLE 2000 (manufactured by Corning Incorporated), a defect in attachment may occur after the bonding step. Therefore, in order to avoid such a defect in attachment due to the shrink, the base substrate 103 may be subjected to heat treatment in advance before the bonding step.

Moreover, an insulating film may be formed in advance over the base substrate 103. The base substrate 103 is not necessarily provided with an insulating film over its surface. However, the formation of the insulating film over the surface of the base substrate 103 can prevent impurities in the base substrate 103, such as an alkali metal and an alkaline earth metal, from entering the bond substrate 100. In the case of forming the insulating film over the surface of the base substrate 103, the insulating film over the base substrate 103 is bonded to the insulating film 101; therefore, a wider variety of substrates can be used as the base substrate 103. In general, the upper temperature limits of substrates formed using flexible synthetic resins such as plastics tend to be low. However, as long as the substrates can withstand process temperatures in later steps of manufacturing semiconductor elements, the substrates formed using such resins can be used as the base substrate 103 in the case of forming the insulating film over the base substrate 103.

As a plastic substrate, a substrate including polyester, polyether sulfone (PES), polyethylene naphthalate (PEN), polycarbonate (PC), polyether etherketone (PEEK), polysulfone (PSF), polyether imide (PEI), polyarylate (PAR), polybutylene terephthalate (PBT), polyimide, an acrylonitrile butadiene styrene resin, polyvinyl chloride, polypropylene, polyvinyl acetate, an acrylic resin, and the like can be given. As an example of polyester, polyethylene terephthalate (PET) can be given.

In the case of forming the insulating film over the base substrate 103, the attachment is preferably performed after a surface of the insulating film is subjected to surface treatment in a manner similar to that of the insulating film 101.

After the bond substrate 100 is attached to the base substrate 103, heat treatment is preferably performed in order to increase the bonding force at the bonding interface between the base substrate 103 and the insulating film 101. This treatment is performed at a temperature where a crack is not generated in the embrittlement layer 102 and can be performed at a temperature in the range of higher than or equal to 200° C. and lower than or equal to 400° C. By attaching the bond substrate 100 to the base substrate 103 within this temperature range, the bonding force between the base substrate 103 and the insulating film 101 can be made strong.

If the bonding plane is contaminated by dust or the like at the time of attaching the bond substrate 100 and the base substrate 103, the contaminated portion is not bonded. In order to avoid the contamination of the bonding plane, the attachment of the bond substrate 100 and the base substrate 103 is preferably performed in an airtight treatment chamber. At the time of attaching the bond substrate 100 and the base substrate 103, the treatment chamber may have a reduced pressure of approximately $5.0 \times 10^{-3}$ Pa and the atmosphere of the bonding treatment may be cleaned.

Figure 1D:
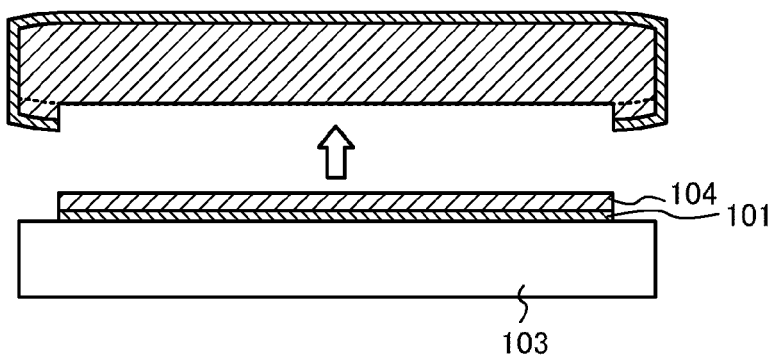

Then, microvoids adjacent to each other in the embrittlement layer 102 are combined by the heat treatment, so that the microvoids increase in volume. As a result, as illustrated in FIG. 1D, the single crystal semiconductor layer 104 which is part of the bond substrate 100 is separated from the bond substrate 100 along the embrittlement layer 102. Since the insulating film 101 and the base substrate 103 are bonded to each other, the single crystal semiconductor layer 104 which is separated from the bond substrate 100 is fixed to the base substrate 103. The heat treatment for separating the single crystal semiconductor layer 104 from the bond substrate 100 is performed at a temperature which does not exceed the strain point of the base substrate 103.

A rapid thermal annealing (RTA) apparatus, a resistance heating furnace, or a microwave heating apparatus can be used for this heat treatment. As an RTA apparatus, a gas rapid thermal annealing (GRTA) apparatus or a lamp rapid thermal annealing (LRTA) apparatus can be used. In the case of using a GRTA apparatus, the heating temperature can be higher than or equal to 550° C. and lower than or equal to 650° C., and the treatment time can be longer than or equal to 0.5 minutes and shorter than or equal to 60 minutes. In the case of using a resistance heating apparatus, the heating temperature can be higher than or equal to 200° C. and lower than or equal to 650° C., and the treatment time can be longer than or equal to 2 hours and shorter than or equal to 4 hours.

The heat treatment may be performed by dielectric heating with a high-frequency wave such as a microwave. The heat treatment by dielectric heating can be performed by irradiating the bond substrate 100 with a high-frequency wave with a frequency of 300 MHz to 3 THz generated by a high-frequency wave generation apparatus. Specifically, for example, irradiation with a microwave with a frequency of 2.45 GHz at 900 W is performed for 14 minutes to combine microvoids adjacent to each other in the embrittlement layer, whereby the bond substrate 100 can be split along the embrittlement layer finally.

It is to be noted that, in some cases, a periphery of the bond substrate 100 is not bonded to the base substrate 103. This is because the periphery of the bond substrate 100 is chamfered or has a curvature, so that the base substrate 103 is not in close contact with the insulating film 101 or the embrittlement layer 102 is difficult to split at the periphery of the bond substrate 100. Another reason is that polishing such as CMP performed in manufacturing the bond substrate 100 is not enough at the periphery of the bond substrate 100, so that a surface thereof is rougher at the periphery than at a center. Still another reason is that, in the case where a carrier or the like damages the periphery of the bond substrate 100 at the time of delivery of the bond substrate 100, the damage makes it difficult to bond the periphery to the base substrate 103. For these reasons, the single crystal semiconductor layer 104 which is smaller than the bond substrate 100 is attached to the base substrate 103.

Note that the bond substrate 100 may be subjected to hydrogenation treatment before the bond substrate 100 is separated. The hydrogenation treatment is performed, for example, at 350° C. for approximately 2 hours in a hydrogen atmosphere.

If a plurality of bond substrates 100 is attached to the base substrate 103, the plurality of bond substrates 100 may have different crystal plane orientations. The mobility of carriers in a semiconductor depends on crystal plane orientation. Therefore, the single crystal semiconductor layer 104 may be formed by selecting as appropriate the bond substrate 100 which has crystal plane orientation suitable for a semiconductor element to be formed. For example, in a case of forming an n-type semiconductor element with the use of the single crystal semiconductor layer 104, the mobility of carriers in the semiconductor element can be increased by forming the single crystal semiconductor layer 104 having a {100} plane. In a case of forming a p-type semiconductor element with the use of the single crystal semiconductor layer 104, the mobility of carriers in the semiconductor element can be increased by forming the single crystal semiconductor layer 104 having a {110} plane. In the case of forming a transistor as a semiconductor element, the bonding direction of the single crystal semiconductor layer 104 is determined in consideration of a channel direction and crystal plane orientation.

Through the above steps, an SOI substrate in which the single crystal semiconductor layer 104 is formed over the base substrate 103 with the insulating film 101 positioned therebetween can be obtained. In the case where the bond substrate 100 is a single crystal silicon substrate, the single crystal semiconductor layer 104 is a single crystal silicon layer.

Note that in the single crystal semiconductor layer 104 disposed in close contact with the base substrate 103, crystal defects due to formation of the embrittlement layer 102 and separation along the embrittlement layer 102 are formed, or the planarity of the surface of the single crystal semiconductor layer 104 is reduced. Thus, in one embodiment of the present invention, in order to reduce the crystal defects and improve planarity, the single crystal semiconductor layer 104 is irradiated with a laser beam after treatment of removing an oxide film such as a natural oxide film which is formed on the surface of the single crystal semiconductor layer 104.

In this embodiment, the single crystal semiconductor layer 104 is immersed in DHF having a hydrogen fluoride concentration of 0.5 wt % for 110 seconds, whereby the oxide film is removed.

The laser beam irradiation is preferably performed with such an energy density that the single crystal semiconductor layer 104 is partially melted. This is because, if the single crystal semiconductor layer 104 is completely melted, generation of microcrystals due to recrystallization of the single crystal semiconductor layer 104 is accompanied with disordered nucleation of the single crystal semiconductor layer 104 in a liquid phase and crystallinity thereof is lowered. By partial melting, so-called longitudinal growth in which crystal growth proceeds from a solid phase portion which is not melted occurs in the single crystal semiconductor layer 104. Owing to recrystallization by the longitudinal growth, crystal defects of the single crystal semiconductor layer 104 are reduced and crystallinity thereof is recovered. The state in which the single crystal semiconductor layer 104 is completely melted indicates that the single crystal semiconductor layer 104 is melted to be in a liquid phase to the interface with the insulating film 101. On the other hand, the state where the single crystal semiconductor layer 104 is partially melted indicates that an upper layer thereof is melted and is in a liquid phase and a lower layer thereof is in a solid phase.

As this laser beam irradiation, pulsed laser beam irradiation is preferable for partially melting the single crystal semiconductor layer 104. For example, in the case of a pulsed laser, the repetition rate is less than or equal to 1 MHz and the pulse width is greater than or equal to 10 nanoseconds and less than or equal to 500 nanoseconds. For example, a XeCl excimer laser having a repetition rate of 10 Hz to 300 Hz, a pulse width of 25 nanoseconds, and a wavelength of 308 nm can be used.

As the laser beam, a fundamental wave or a second harmonic of a solid-state laser, which is selectively absorbed by a semiconductor, is preferably used. Specifically, for example, a laser beam having a wavelength in the range of greater than or equal to 250 nm and less than or equal to 700 nm can be used. Further, the energy of the laser beam can be determined in consideration of the wavelength of the laser beam, the skin depth of the laser beam, the thickness of the single crystal semiconductor layer 104, or the like. For example, in the case where the thickness of the single crystal semiconductor layer 104 is approximately 120 nm and a pulsed laser that emits a laser beam having a wavelength of 308 nm is used, the energy density of the laser beam may be 600 mJ/cm$^2$ to 700 mJ/cm$^2$.

As a pulsed laser, for example, an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper-vapor laser, or a gold-vapor laser can be used.

Figure 1E:
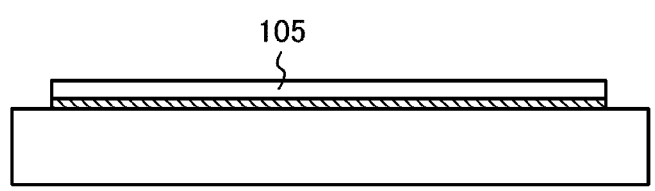

In this embodiment, in the case where the thickness of the single crystal semiconductor layer 104 is approximately 146 nm, the laser beam irradiation can be performed in the following manner. As a laser emitting a laser beam, a XeCl excimer laser (wavelength: 308 nm, pulse width: 20 nanoseconds, and repetition rate: 30 Hz) is used. The cross section of the laser beam is shaped into a linear form with a size of 0.4 mm×120 mm through an optical system. The single crystal semiconductor layer 104 is irradiated with the laser beam with a laser scanning speed of 0.5 mm/s. Through the laser beam irradiation, a single crystal semiconductor layer 105 whose crystal defects are repaired is formed as illustrated in FIG. 1E.

After the laser beam irradiation, the single crystal semiconductor layer 105 is preferably subjected to heat treatment at a temperature higher than or equal to 500° C. and lower than or equal to 650° C. This heating treatment can repair defects of the single crystal semiconductor layer 105 which have not been repaired in the laser beam irradiation and can reduce distortion of the single crystal semiconductor layer 105. A rapid thermal annealing (RTA) apparatus, a resistance heating furnace, or a microwave heating apparatus can be used for this heat treatment. As an RTA apparatus, a gas rapid thermal annealing (GRTA) apparatus or a lamp rapid thermal annealing (LRTA) apparatus can be used. For example, when a resistance heating furnace is used, the heat treatment is preferably performed at 600° C. for 4 hours.

Next, as illustrated in FIG. 2A, the single crystal semiconductor layer 105 is partly etched, so that an island-shaped semiconductor film 106, an island-shaped semiconductor film 107, and an island-shaped semiconductor film 201 are formed from the single crystal semiconductor layer 105.

In this manner, the semiconductor film 106 serving as a channel formation region of a transistor 120 described later, the semiconductor film 107 serving as a channel formation region of a transistor 121 described later, and the semiconductor film 201 serving as a p-type semiconductor layer 204 of a diode 210 that is a rectifier element described later can be formed at a time. By forming the semiconductor film 106, the semiconductor film 107, and the semiconductor film 201 at a time, the number of manufacturing steps of the semiconductor device can be reduced.

In order to control threshold voltage, a p-type impurity such as boron, aluminum, or gallium or an n-type impurity such as phosphorus or arsenic may be added to the semiconductor film 106 and the semiconductor film 107.

Next, gate insulating films 108 are formed so as to cover the semiconductor film 106 and the semiconductor film 107, as illustrated in FIG. 2B. At the same time, an insulating film 202 is formed so as to cover the semiconductor film 201.

The gate insulating films 108 and the insulating film 202 can be formed by oxidation or nitridation of surfaces of the semiconductor film 106, the semiconductor film 107, and the semiconductor film 201 by high-density plasma treatment.

The high-density plasma treatment is performed, for example, by using a mixed gas of a rare gas such as He, Ar, Kr, or Xe, and oxygen, nitrogen oxide, ammonia, nitrogen, hydrogen, or the like. In this case, when plasma is excited by introduction of microwaves, plasma with a low electron temperature and high density can be generated. The surfaces of the semiconductor films are oxidized or nitrided by oxygen radicals (which include OH radicals in some cases) or nitrogen radicals (which include NH radical in some cases) produced by such high-density plasma, whereby insulating films each having a thickness of 1 nm to 20 nm, preferably 5 nm to 10 nm, are formed in contact with the semiconductor films. These insulating films each having a thickness of 5 nm to 10 nm are used as the gate insulating films 108 and the insulating film 202.

The gate insulating films 108 and the insulating film 202 are formed in such a manner that, for example, nitrous oxide ($N_2O$) is diluted with Ar by one to three times (at a flow rate ratio) and a microwave power of 3 kW to 5 kW (frequency: 2.45 GHz) is applied at a pressure of 10 Pa to 30 Pa to oxidize or nitride the surfaces of the semiconductor film 106, the semiconductor film 107, and the semiconductor film 201. By this treatment, an insulating film having a thickness of 1 nm to 10 nm (preferably 2 nm to 6 nm) is formed. Further, nitrous oxide ($N_2O$) and silane ($SiH_4$) are introduced, and a microwave power of 3 kW to 5 kW (frequency: 2.45 GHz) is applied at a pressure of 10 Pa to 30 Pa to form a silicon oxynitride film by a vapor deposition method, whereby the insulating film is formed. With a combination of a solid-phase reaction and a reaction by a vapor deposition method, the insulating film with low interface state density and excellent breakdown voltage can be formed.

Oxidation or nitridation of the semiconductor films by the above high-density plasma treatment proceeds by a solid-phase reaction; therefore, the interface state density between the gate insulating film 108 and the semiconductor film 106 and between the gate insulating film 108 and the semiconductor film 107 can be extremely low.

Further, since the semiconductor film 106 and the semiconductor film 107 are directly oxidized or nitrided by the high-density plasma treatment, variation in thickness of the gate insulating films 108 to be formed can be suppressed.

Furthermore, in the case where the semiconductor films have crystallinity and the surfaces of the semiconductor films are oxidized by a solid-phase reaction by the high-density plasma treatment, crystal grain boundaries can be prevented from being locally oxidized at high speed. Thus, the uniform gate insulating films 108 with low interface state density can be formed.

A transistor in which the gate insulating film 108 partly or wholly includes the insulating film formed by the high-density plasma treatment can have suppressed variation in characteristics.

Alternatively, the gate insulating films 108 and the insulating film 202 may be formed by thermally oxidizing the semiconductor film 106, the semiconductor film 107, and the semiconductor film 201. The gate insulating films 108 may be formed as a single layer or a stacked layer of a film including silicon oxide, silicon nitride oxide, silicon oxynitride, silicon nitride, hafnium oxide, aluminum oxide, or tantalum oxide by a plasma CVD method, a sputtering method, or the like.

Then, as illustrated in FIG. 2C, a conductive film is formed over the gate insulating films 108, and then the conductive film is processed into an appropriate shape, so that electrodes 109 are formed over the semiconductor film 106 and the semiconductor film 107. Note that in this manufacturing step, a mask covering the semiconductor film 201 is formed and no electrodes are formed over the semiconductor film 201.

The conductive film can be formed by a CVD method, a sputtering method, or the like. For the conductive film, tantalum (Ta), tungsten (W), titanium (Ti), molybdenum (Mo), aluminum (Al), copper (Cu), chromium (Cr), niobium (Nb), or the like can be used. Moreover, an alloy including the above metal as a main component or a compound including the above metal may be used. Alternatively, the electrodes 109 may be formed using a semiconductor such as polycrystalline silicon doped with an impurity element such as phosphorus which imparts conductivity to the semiconductor film.

In the case of forming a two-layer conductive film, a first layer can be formed using tantalum nitride or tantalum and a second layer can be formed using tungsten. Moreover, the following combinations are given: tungsten nitride and tungsten, molybdenum nitride and molybdenum, aluminum and tantalum, aluminum and titanium, and the like. Since tungsten and tantalum nitride have high heat resistance, heat treatment for thermal activation can be performed after the two-layer conductive film is formed. Alternatively, as the combination of the two-layer conductive film, silicon doped with an impurity imparting n-type conductivity and nickel silicide, silicon doped with an impurity imparting n-type conductivity and tungsten silicide, or the like can be used.

Although each of the electrodes 109 is formed of a single-layer conductive film in this embodiment, this embodiment is not limited to this structure. Each of the electrodes 109 may be formed of a plurality of stacked conductive films. In the case of using a three-layer structure in which more than three conductive films are stacked, a stacked structure of a molybdenum film, an aluminum film, and a molybdenum film is preferably employed.

Note that the electrodes 109 may be selectively formed by a droplet discharge method without using a mask.

Note that a droplet discharge method means a method for forming an appropriate shape by discharging or ejecting droplets including an appropriate composition from fine pores. An inkjet method is given as an example.

The electrodes 109 can be formed by etching the formed conductive film into a desired tapered shape by using an inductively coupled plasma (ICP) etching method and appropriately adjusting the etching condition (the amount of electric power applied to a coiled electrode layer, the amount of electric power applied to an electrode layer on the substrate side, the temperature of the electrode layer on the substrate side, or the like). Further, angles and the like of the tapered shape can be controlled by the shape of a mask.

Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Next, as illustrated in FIG. 2D, impurity elements imparting one conductivity type are added to the semiconductor film 106 and the semiconductor film 107 by using the electrodes 109 as masks.

In this embodiment, an impurity element imparting n-type conductivity (e.g., phosphorus or arsenic) is added to the semiconductor film 106, and an impurity element imparting p-type conductivity (e.g., boron) is added to the semiconductor film 107. Note that when the impurity element imparting p-type conductivity is added to the semiconductor film 107, the semiconductor film 106 to which the n-type impurity is added is covered with a mask or the like so that the impurity element imparting p-type conductivity is added selectively. On the other hand, when the impurity element imparting n-type conductivity is added to the semiconductor film 106, the semiconductor film 107 to which the p-type impurity is added is covered with a mask or the like so that the impurity element imparting n-type conductivity is added selectively.

Note that the semiconductor film 201 may be covered with a mask or the like so that an impurity element imparting n-type or p-type conductivity is not added thereto. Alternatively, in the case of using the semiconductor film 201 as a p-type semiconductor layer, the impurity element imparting p-type conductivity may be added thereto. Further alternatively, in the case of using the semiconductor film 201 as an n-type semiconductor layer, the impurity element imparting n-type conductivity may be added thereto.

Alternatively, after addition of an impurity element imparting one of p-type and n-type conductivity to the semiconductor film 106 and the semiconductor film 107, an impurity element imparting the other conductivity may be added to one of the semiconductor film 106 and the semiconductor film 107 selectively at a higher concentration than the previously added impurity element. By the addition of the impurities, impurity regions 110 and impurity regions 111 are formed in the semiconductor film 106 and the semiconductor film 107, respectively.

Next, as illustrated in FIG. 3A, sidewalls 112 are formed on side surfaces of the electrodes 109 over the semiconductor film 106 and the semiconductor film 107. For example, the sidewalls 112 can be formed in such a manner that an insulating film is newly formed so as to cover the gate insulating films 108 and the electrodes 109 and the newly-formed insulating film is partly etched by anisotropic etching in which etching is performed mainly in a perpendicular direction. The newly-formed insulating film is partly etched by the anisotropic etching, whereby the sidewalls 112 are formed on the side surfaces of the electrodes 109.

The insulating film for forming the sidewalls 112 can be formed as a single layer or a stacked layer of any of a silicon film, a silicon oxide film, a silicon oxynitride film, a silicon nitride oxide film, and a film including an organic material such as an organic resin by an LPCVD method, a plasma CVD method, a sputtering method, or the like. In this embodiment, a 100-nm-thick silicon oxide film is formed by a plasma CVD method. As an etching gas, a mixed gas of $CHF_3$ and helium can be used. Note that the steps of forming the sidewalls 112 are not limited to those given here.

Note that the gate insulating films 108 and the insulating film 202 may be partly etched by the anisotropic etching (see FIG. 3B).

By etching the insulating film 202, a region where an oxide semiconductor film 206 formed in a later step is in contact with the semiconductor film 201 can be formed.

Next, as illustrated in FIG. 3C, impurity elements imparting one conductivity type are added to the semiconductor film 106 and the semiconductor film 107 with the electrodes 109 and the sidewalls 112 used as masks. In this step, the impurity element imparting one conductivity type is also added to the semiconductor film 201.

Note that the impurity elements imparting the same conductivity type as the impurity elements which have been added in the previous step are added to the semiconductor film 106 and the semiconductor film 107 at higher concentrations. Note that when the impurity element imparting p-type conductivity is added to the semiconductor film 107, the semiconductor film 106 to which the n-type impurity is added is covered with a mask or the like so that the impurity element imparting p-type conductivity is added selectively. On the other hand, when the impurity element imparting n-type conductivity is added to the semiconductor film 106, the semiconductor film 107 to which the p-type impurity is added is covered with a mask or the like so that the impurity element imparting n-type conductivity is added selectively.

In the case of using the semiconductor film 201 as a p-type semiconductor layer, the impurity element imparting p-type conductivity is added to the semiconductor film 201 at the time of adding the impurity element imparting p-type conductivity to the semiconductor film 107. In the case of using the semiconductor film 201 as an n-type semiconductor layer, the impurity element imparting n-type conductivity is added to the semiconductor film 201 at the time of adding the impurity element imparting n-type conductivity to the semiconductor film 106. The semiconductor film 201 to which the impurity element imparting p-type conductivity is added is used as the p-type semiconductor layer 204 of the diode 210 described later.

By the addition of the impurity element imparting n-type conductivity, a pair of high-concentration impurity regions 113, a pair of low-concentration impurity regions 114, and a channel formation region 115 are formed in the semiconductor film 106.

By the addition of the impurity element imparting p-type conductivity, a pair of high-concentration impurity regions 116, a pair of low-concentration impurity regions 117, and a channel formation region 118 are formed in the semiconductor film 107.

The high-concentration impurity regions 113 and the high-concentration impurity regions 116 each function as a source region or a drain region. The low-concentration impurity regions 114 and the low-concentration impurity regions 117 each function as a lightly doped drain (LDD) region. Note that the LDD regions are not necessarily provided, and only impurity regions functioning as a source region and a drain region may be formed. Alternatively, the LDD region may be formed on either the source region side or the drain region side.

The sidewalls 112 formed over the semiconductor film 107 and the sidewalls 112 formed over the semiconductor film 106 may be formed so as to have the same width in the carrier flow direction, or may be formed so as to have different widths.

It is preferable that the width of the sidewall 112 over the semiconductor film 107 which is to be part of the p-channel transistor 121 be larger than the width of the sidewall 112 over the semiconductor film 106 which is to be part of the n-channel transistor 120. This is because boron which is added for forming the source region and the drain region in the p-channel transistor 121 is easily diffused and a short channel effect is easily induced. When the width of the sidewall 112 in the p-channel transistor 121 is made larger, boron can be added to the source region and the drain region at a higher concentration, and thus the resistance of the source region and the drain region can be reduced.

Next, in order to further reduce the resistance of the source region and the drain region, silicide may be formed in the semiconductor film 106 and the semiconductor film 107, so that silicide layers are formed. The silicide is formed in such a manner that metal is in contact with the semiconductor films, and silicon in the semiconductor films is made to react with the metal by heat treatment, a GRTA method, an LRTA method, or the like. Cobalt silicide or nickel silicide may be used for the silicide layers.

In the case where the semiconductor film 106 and the semiconductor film 107 are thin, a silicide reaction may proceed to bottom portions of the semiconductor film 106 and the semiconductor film 107 in this region. As a metal material used for the silicide formation, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like. Alternatively, the silicide may be formed by laser irradiation or light irradiation using a lamp or the like.

Through the above series of steps, the n-channel transistor 120 and the p-channel transistor 121 each of which has a single crystal semiconductor layer in a channel formation region are manufactured. Further, the p-type semiconductor layer 204 of the diode 210 is formed.

Next, above the transistor 120 and the transistor 121, a transistor that is isolated from the transistor 120 and the transistor 121 with an insulating film 130, an insulating film 131, and an insulating film 132 positioned therebetween and has an oxide semiconductor layer in a channel formation region is manufactured.

First, as illustrated in FIG. 3D, the insulating film 130 is formed so as to cover the transistor 120, the transistor 121, the insulating film 202, and the p-type semiconductor layer 204.

By providing the insulating film 130, oxidation of surfaces of the electrodes 109 at the time of heat treatment can be prevented. Specifically, it is preferable that the insulating film 130 be formed using silicon nitride, silicon nitride oxide, silicon oxynitride, aluminum nitride, aluminum oxide, silicon oxide, or the like. In this embodiment, a silicon oxynitride film having a thickness of approximately 50 nm is used as the insulating film 130.

Figure 4A:
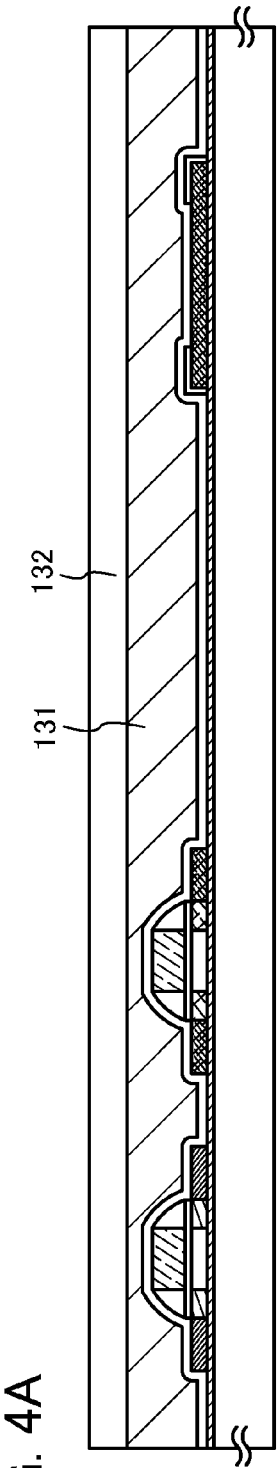
FIGS. 4A to 4C are cross-sectional views illustrating manufacturing steps of a semiconductor device.

Next, as illustrated in FIG. 4A, the insulating film 131 and the insulating film 132 are formed over the insulating film 130.

The insulating film 131 and the insulating film 132 are formed using materials which can withstand temperature of heat treatment performed in a later manufacturing step. Specifically, an inorganic insulating film of silicon oxide, silicon nitride, silicon nitride oxide, silicon oxynitride, aluminum nitride, aluminum nitride oxide, or the like can be used as each of the insulating film 131 and the insulating film 132, for example.

Note that the insulating film 131 and the insulating film 132 are stacked over the insulating film 130 in this embodiment; however, the insulating film formed over the insulating film 130 may be an insulating film of a single layer or an insulating film in which three or more layers are stacked.

A surface of the insulating film 132 may be planarized by a CMP method or the like.

Figure 4B:
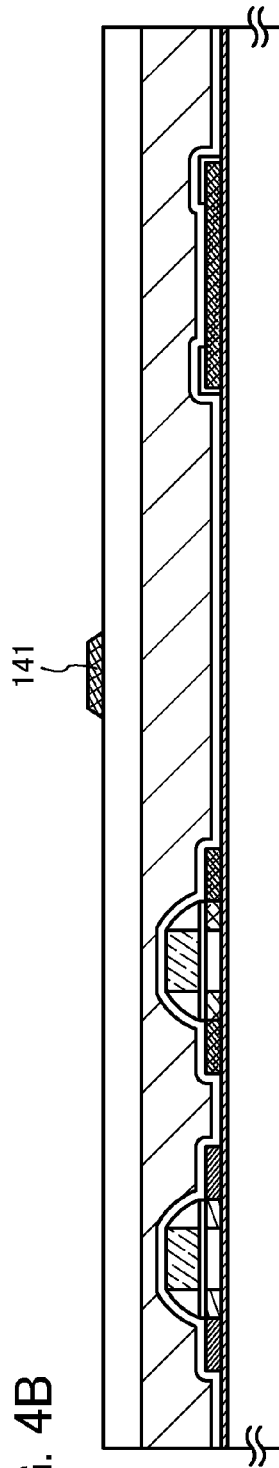

Next, as illustrated in FIG. 4B, a conductive film is formed over the insulating film 132, and then an unnecessary portion is removed by etching, so that a gate electrode 141 is formed. At this time, the etching is performed so that end portions of the gate electrode 141 are tapered.

As a material of the conductive film, a metal material such as molybdenum, titanium, chromium, tantalum, tungsten, neodymium, or scandium; an alloy material including any of these metal materials as a main component; and a nitride including any of these metals can be given. Further, a single layer or a stacked layer including any of these metal materials, alloy materials, and nitrides can be used as the conductive film. Note that aluminum or copper can also be used as such a metal material if aluminum or copper can withstand temperature of heat treatment performed in a later step.

For example, as a conductive film having a two-layer structure, the following structures are preferable: a two-layer structure in which molybdenum is stacked over aluminum, a two-layer structure in which molybdenum is stacked over copper, a two-layer structure in which titanium nitride or tantalum nitride is stacked over copper, and a two-layer structure of titanium nitride and molybdenum. As a three-layer structure, the following structure is preferable: a stacked structure including aluminum, an alloy of aluminum and silicon, an alloy of aluminum and titanium, or an alloy of aluminum and neodymium in a middle layer and any of tungsten, tungsten nitride, titanium nitride, and titanium in a top layer and a bottom layer.

When a light-transmitting conductive oxide film is used for the gate electrode 141, the aperture ratio can be improved. For example, indium oxide, an alloy of indium oxide and tin oxide, an alloy of indium oxide and zinc oxide, zinc oxide, zinc aluminum oxide, zinc aluminum oxynitride, zinc gallium oxide, or the like can be used for the conductive oxide film.

The thickness of the gate electrode 141 is 10 nm to 400 nm, preferably 100 nm to 200 nm. In this embodiment, after a conductive film for the gate electrode 141 is formed to a thickness of 100 nm by a sputtering method using a tungsten target, the conductive film is processed into a desired shape by etching. Thus, the gate electrode 141 is formed.

Figure 4C:
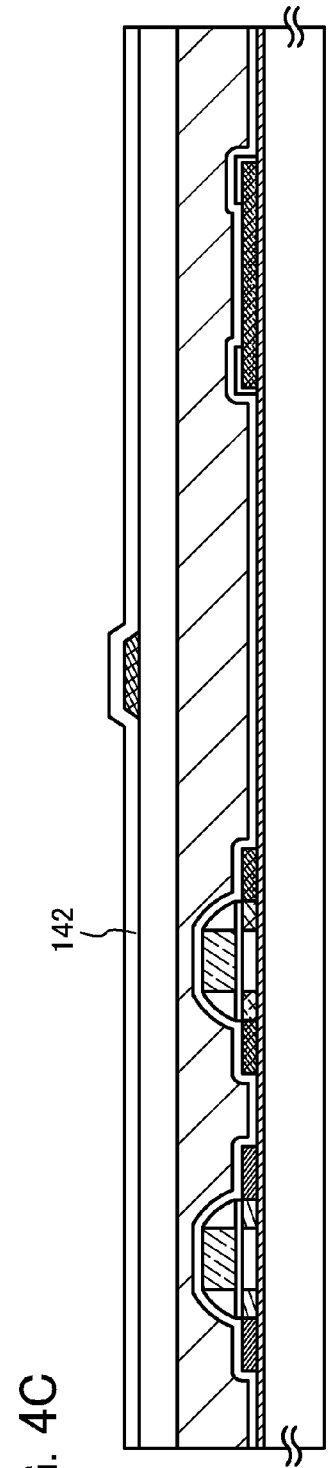

Next, as illustrated in FIG. 4C, a gate insulating film 142 is formed over the gate electrode 141. The gate insulating film 142 can be formed as a single layer or a stacked layer of any of a silicon oxide film, a silicon nitride film, a silicon oxynitride film, a silicon nitride oxide film, a hafnium oxide film, an aluminum oxide film, and a tantalum oxide film by a plasma CVD method, a sputtering method, or the like. It is preferable that the gate insulating film 142 include impurities such as moisture or hydrogen as little as possible.

As the gate insulating film 142, an insulating film having a structure in which an insulating film formed using a material having a high barrier property and an insulating film having a lower proportion of nitrogen such as a silicon oxide film or a silicon oxynitride film are stacked may be formed. In this case, the insulating film such as a silicon oxide film or a silicon oxynitride film is formed between the insulating film having a barrier property and the oxide semiconductor film.

As the insulating film having a high barrier property, a silicon nitride film, a silicon nitride oxide film, an aluminum nitride film, an aluminum nitride oxide film, and the like can be given, for example.

The insulating film having a barrier property is used for the gate insulating film 142, so that impurities in an atmosphere, such as moisture or hydrogen, or impurities included in the substrate, such as an alkali metal or a heavy metal, can be prevented from entering the oxide semiconductor film, the gate insulating film 142, or the interface between the oxide semiconductor film and another insulating film and the vicinity thereof.

In addition, the insulating film having a lower proportion of nitrogen such as a silicon oxide film or a silicon oxynitride film is formed so as to be in contact with the oxide semiconductor film, so that the insulating film formed using a material having a high barrier property can be prevented from being in direct contact with the oxide semiconductor film.

In this embodiment, the gate insulating film 142 is formed to have a structure in which a 100-nm-thick silicon oxide film formed by a sputtering method is stacked over a 50-nm-thick silicon nitride film formed by a sputtering method.

Then, each of the gate insulating film 142, the insulating film 132, the insulating film 131, and the insulating film 130 is partly removed by etching or the like, so that an opening 205 is formed (see FIG. 5A). The opening 205 is provided in a region where the diode 210 described later is formed. By this etching step, the insulating film 202 and the p-type semiconductor layer 204 are exposed.

Next, an oxide semiconductor film is formed over the gate insulating film 142 and the exposed p-type semiconductor layer 204. After being formed, the oxide semiconductor film is processed into a desired shape by etching or the like. By this step, an island-shaped oxide semiconductor film 143 is formed to overlap with the gate electrode 141, and the island-shaped oxide semiconductor film 206 is formed in contact with the p-type semiconductor layer 204 (see FIG. 5B).

The above oxide semiconductor film is used for a channel formation region of a transistor 146 described later. The above oxide semiconductor film is also used for an n-type semiconductor layer of the diode 210. The oxide semiconductor film has n-type conductivity without addition of an impurity element imparting one conductivity type. Therefore, it is preferable that the oxide semiconductor film be used for the channel formation region of the transistor 146 because a step of adding an impurity element can be omitted.

Through the above steps, the oxide semiconductor film 143 serving as the channel formation region of the transistor 146 and the oxide semiconductor film 206 serving as the n-type semiconductor layer of the diode 210 can be formed at a time. Since the oxide semiconductor film 143 and the oxide semiconductor film 206 can be formed at a time, the number of manufacturing steps of the semiconductor device can be reduced.

The oxide semiconductor film is formed by a sputtering method using an oxide semiconductor as a target. Moreover, the oxide semiconductor film can be formed by a sputtering method in a rare gas (e.g., argon) atmosphere, an oxygen atmosphere, or an atmosphere including a rare gas (e.g., argon) and oxygen.

Note that before the oxide semiconductor film is formed by a sputtering method, dust and a contaminant attached to a surface of the gate insulating film 142 is preferably removed by reverse sputtering in which an argon gas is introduced and plasma is generated. The reverse sputtering refers to a method by which, without application of voltage to a target side, a surface of a substrate is modified in such a manner that an RF power source is used for voltage application to a substrate side in an argon atmosphere and an Ar ion collides with the substrate. Note that instead of an argon atmosphere, a nitrogen atmosphere, a helium atmosphere, or the like may be used. Alternatively, an argon atmosphere to which oxygen, nitrous oxide, or the like is added may be used. Further alternatively, an argon atmosphere to which chlorine, carbon tetrafluoride, or the like is added may be used.

The oxide semiconductor film includes at least one element selected from In, Ga, Sn, and Zn. For example, a four-component metal oxide such as an In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor, a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor, a single-component metal oxide such as an In—O-based oxide semiconductor, a Sn—O-based oxide semiconductor, or a Zn—O-based oxide semiconductor, or the like can be used. In addition, the above oxide semiconductor may include an element other than In, Ga, Sn, and Zn, for example, $SiO_2$.

For example, an In—Ga—Zn—O-based oxide semiconductor means an oxide semiconductor including indium (In), gallium (Ga), and zinc (Zn), and there is no limitation on the composition ratio thereof.

As the oxide semiconductor film, a thin film expressed by the chemical formula $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like.

In the case where an In—Zn—O-based material is used as the oxide semiconductor, a target used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=1.5:1 to 15:1 in an atomic ratio ($In_2O_3$:ZnO=3:4 to 15:2 in a molar ratio). For example, when a target used for forming an In—Zn—O-based oxide semiconductor has an atomic ratio of In:Zn:O=X: Y:Z, the relation Z>1.5X+Y is satisfied.

In addition, silicon oxide may be included in the oxide semiconductor film. Addition of silicon oxide ($SiO_x$ (x>0)) which hinders crystallization to the oxide semiconductor film can suppress crystallization of the oxide semiconductor film when heat treatment is performed after formation of the oxide semiconductor film in the manufacturing process. The oxide semiconductor film is preferably in an amorphous state, but may be partly crystallized.

The thickness of the oxide semiconductor film is 10 nm to 300 nm, preferably 20 nm to 100 nm. In this embodiment, an oxide semiconductor target including In, Ga, and Zn ($In_2O_3$:$Ga_2O_3$:ZnO=1:1:1 or $In_2O_3$:$Ga_2O_3$:ZnO=1:1:2 in a molar ratio) is used. The oxide semiconductor film is formed under the following conditions: the distance between the substrate and the target is 100 mm, the pressure is 0.6 Pa, the direct current (DC) power is 0.5 kW, and the atmosphere is an oxygen atmosphere (the flow rate of oxygen is 100%). Note that a pulsed direct current (DC) power source is preferable because dust can be reduced and the film thickness can be uniform. In this embodiment, as the oxide semiconductor film, an In—Ga—Zn—O-based non-single-crystal film having a thickness of 30 nm is formed using an In—Ga—Zn—O-based oxide semiconductor target with a sputtering apparatus.

Note that when the oxide semiconductor film is formed without exposure to the air after the plasma treatment, dust or moisture can be prevented from attaching to an interface between the gate insulating film 142 and the oxide semiconductor film. Further, a pulsed direct current (DC) power source is preferable because dust can be reduced and the film thickness can be uniform.

The relative density of the oxide semiconductor target is preferably higher than or equal to 80%, further preferably higher than or equal to 95%, still further preferably higher than or equal to 99.9%. When a target having a high relative density is used, the impurity concentration in an oxide semiconductor film to be formed can be reduced, so that a transistor with excellent electric characteristics or high reliability can be obtained.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for magnetron sputtering, and a sputtering apparatus used for ECR sputtering in which plasma generated with the use of microwaves is used without using glow discharge.

Furthermore, as a film formation method by sputtering, there are also a reactive sputtering method in which a target substance and a sputtering gas component are chemically reacted with each other during film formation to form a thin compound film thereof, and a bias sputtering method in which voltage is also applied to a substrate during film formation.

In addition, the substrate may be heated to a temperature higher than or equal to 100° C. and lower than or equal to 700° C. by light or a heater during the film formation by a sputtering method. By heating during the film formation, the damage due to sputtering is repaired at the same time as the film formation.

Preheat treatment is preferably performed so as to remove moisture or hydrogen remaining on an inner wall of the sputtering apparatus, on a surface of the target, or in a target material, before the oxide semiconductor film is formed. As the preheat treatment, a method in which the inside of the deposition chamber is heated to 200° C. to 600° C. under reduced pressure, a method in which introduction and exhaust of nitrogen or an inert gas are repeated while the inside of the deposition chamber is heated, and the like can be given. After the preheat treatment, the substrate or the sputtering apparatus is cooled, and then the oxide semiconductor film is formed without exposure to the air. In this case, not water but oil or the like is preferably used as a coolant for the target. Although a certain level of effect can be obtained when introduction and exhaust of nitrogen are repeated without heating, it is preferable to perform the treatment with the inside of the deposition chamber heated.

It is preferable to remove moisture or the like remaining in the sputtering apparatus with the use of a cryopump before, during, or after the oxide semiconductor film is formed.

The oxide semiconductor film can be processed into an island shape, for example, by wet etching using a mixed solution of phosphoric acid, acetic acid, and nitric acid or an ammonia peroxide mixture (31 wt % hydrogen peroxide water: 28 wt % ammonia water: water=5:2:2). The island-shaped oxide semiconductor film 143 formed by the etching is provided so as to overlap with the gate electrode 141. The island-shaped oxide semiconductor film 206 is formed in contact with the p-type semiconductor layer 204.

In the etching of the oxide semiconductor film, organic acid such as citric acid or oxalic acid can be used for an etchant. In this embodiment, an unnecessary portion is removed by wet etching using ITO07N (produced by KANTO CHEMICAL CO., INC.), so that the island-shaped oxide semiconductor film 143 and the island-shaped oxide semiconductor film 206 are formed. The etching here is not limited to wet etching and may be dry etching.

As an etching gas for dry etching, a gas including chlorine (chlorine-based gas such as chlorine ($Cl_2$), boron trichloride ($BCl_3$), silicon tetrachloride ($SiCl_4$), or carbon tetrachloride ($CCl_4$)) is preferably used.

Alternatively, a gas including fluorine (fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As a dry etching method, a parallel plate reactive ion etching (RIE) method or an inductively coupled plasma (ICP) etching method can be used. In order to etch the film into a desired shape, the etching condition (the amount of electric power applied to a coiled electrode, the amount of electric power applied to an electrode on the substrate side, the temperature of the electrode on the substrate side, or the like) is adjusted as appropriate.

The etchant after the wet etching is removed together with the etched material by cleaning. The waste liquid including the etchant and the material etched off may be purified and the material may be reused. When a material such as indium included in the oxide semiconductor film is collected from the waste liquid after the etching and reused, the resources can be efficiently used and cost can be reduced.

In order to obtain a desired shape by etching, the etching conditions (such as an etchant, etching time, and temperature) are adjusted as appropriate in accordance with the material.

Next, heat treatment may be performed on the oxide semiconductor film 143 and the oxide semiconductor film 206 in an atmosphere of an inert gas (such as nitrogen, helium, neon, or argon).

By performing the heat treatment on the oxide semiconductor film 143 and the oxide semiconductor film 206, an oxide semiconductor film 144 and an oxide semiconductor film 207 in which the amount of impurities such as hydrogen and water is reduced are formed as illustrated in FIG. 5C.

Specifically, the heat treatment can be performed by rapid thermal annealing (RTA) treatment in an atmosphere of an inert gas (such as nitrogen, helium, neon, or argon) at a temperature higher than or equal to 300° C. and lower than or equal to 750° C. (or at a temperature lower than or equal to the strain point of the glass substrate) for approximately longer than or equal to 1 minute and shorter than or equal to 10 minutes, preferably at 650° C. for approximately longer than or equal to 3 minutes and shorter than or equal to 6 minutes. By an RTA method, dehydration or dehydrogenation can be performed in a short time; therefore, the treatment can be performed even at a temperature higher than the strain point of the glass substrate.

Note that a timing of the heat treatment is not limited to after formation of the island-shaped oxide semiconductor film 143 and the island-shaped oxide semiconductor film 206, and the heat treatment may be performed on the oxide semiconductor film before etching. The heat treatment may be performed more than once after the island-shaped oxide semiconductor film 143 and the island-shaped oxide semiconductor film 206 are formed.

In this embodiment, the heat treatment is performed for 6 minutes in a nitrogen atmosphere in a state where the substrate temperature reaches 600° C. For the heat treatment, a heating method using an electric furnace, a rapid heating method such as a gas rapid thermal annealing (GRTA) method using a heated gas or a lamp rapid thermal annealing (LRTA) method using lamp light, or the like can be used. For example, in the case of performing the heat treatment with the use of an electric furnace, the temperature rise characteristic is preferably set to be higher than or equal to 0.1° C./min and lower than or equal to 20° C./min and the temperature drop characteristic is preferably set to be higher than or equal to 0.1° C./min and lower than or equal to 15° C./min.

Note that it is preferable that in the heat treatment, moisture, hydrogen, or the like be not included in nitrogen or a rare gas such as helium, neon, or argon. The purity of nitrogen or the rare gas such as helium, neon, or argon which is introduced into a heat treatment apparatus is preferably 6N (99.9999%) or higher, further preferably 7N (99.99999%) or higher (that is, the impurity concentration is preferably 1 ppm or lower, further preferably 0.1 ppm or lower).

Alternatively, the heat treatment may be performed under air where the dew point under atmospheric pressure is −60° C. or lower and the moisture content is small, instead of in an inert gas atmosphere such as a nitrogen atmosphere or a rare gas atmosphere.

The island-shaped oxide semiconductor film 144 which has been subjected to the heat treatment in an inert gas atmosphere is preferably in an amorphous state, but may be partly crystallized.

Next, the gate insulating film 142, the insulating film 132, the insulating film 131, and the insulating film 130 are partly etched. By this etching step, contact holes reaching the high-concentration impurity regions 113 in the transistor 120 and contact holes reaching the high-concentration impurity regions 116 in the transistor 121 are formed.

Then, a conductive film is formed over the gate insulating film 142, the oxide semiconductor film 144, the insulating film 202, and the p-type semiconductor layer 204 by a sputtering method or a vacuum evaporation method. The conductive film is processed into an appropriate shape by etching or the like.

In this manner, a conductive film 151 functioning as one of a source electrode and a drain electrode of the transistor 120, and a conductive film 152 functioning as the other of the source electrode and the drain electrode of the transistor 120 are formed. A conductive film 153 functioning as one of a source electrode and a drain electrode of the transistor 121, and a conductive film 154 functioning as the other of the source electrode and the drain electrode of the transistor 121 and one of a source electrode and a drain electrode of the transistor 146 are formed. A conductive film 155 functioning as the other of the source electrode and the drain electrode of the transistor 146 is formed. Conductive films 208 and 209 functioning as electrodes of the diode 210 are formed (see FIG. 6A). Note that the conductive film 209 is shown by a dotted line in FIG. 6A because it cannot be illustrated in the cross-sectional view.

Note that the transistor 146 illustrated in FIG. 6A can be referred to as a bottom-gate top-contact transistor because the transistor 146 is a bottom-gate transistor and the oxide semiconductor film 144 is connected to the source electrode or the drain electrode (the conductive film 154 or the conductive film 155) in a region including a top surface of the oxide semiconductor film 144.

The conductive film 208 and the conductive film 209 which are the electrodes of the diode 210 are electrically connected to the semiconductor film 207 that is an n-type semiconductor layer and the p-type semiconductor layer 204, respectively.

The conductive film 209 needs to be electrically connected to the p-type semiconductor layer 204 of the diode 210. FIG. 6B is a top view of the diode 210, and FIGS. 6C and 6D are cross-sectional views along line A-A' and line B-B' in FIG. 6B (top view), respectively. As illustrated in FIGS. 6B and 6D, the conductive film 209 is electrically connected to the p-type semiconductor layer 204 in a region which is over the p-type semiconductor layer 204 and not provided with the oxide semiconductor film 207.

For the conductive film 151, the conductive film 152, the conductive film 153, the conductive film 154, the conductive film 155, the conductive film 208, and the conductive film 209, for example, an element selected from aluminum, chromium, tantalum, titanium, manganese, magnesium, molybdenum, tungsten, zirconium, beryllium, and yttrium; an alloy including one or more of these elements as a component; or the like can be used. Note that in the case where heat treatment is performed after the formation of the conductive films, the conductive films preferably have heat resistance enough to withstand the heat treatment. In the case of performing heat treatment after the formation of the conductive films, the conductive films are formed using a heat-resistant conductive material in combination with aluminum because aluminum alone has problems of low heat resistance, being easily corroded, and the like. As the heat-resistant conductive material which is combined with aluminum, the following material is preferably used: an element selected from titanium, tantalum, tungsten, molybdenum, chromium, neodymium, and scandium; an alloy including one or more of these elements as a component; a nitride including any of these elements as a component; or the like.

A light-transmitting conductive oxide film can be used for the conductive film 151, the conductive film 152, the conductive film 153, the conductive film 154, the conductive film 155, the conductive film 208, and the conductive film 209. By using the light-transmitting conductive oxide film, the aperture ratio can be improved. For example, a conductive oxide film including indium oxide, an alloy of indium oxide and tin oxide, an alloy of indium oxide and zinc oxide, zinc oxide, zinc aluminum oxide, zinc aluminum oxynitride, zinc gallium oxide, or the like can be used as such a light-transmitting conductive film.

The thicknesses of the conductive film 151, the conductive film 152, the conductive film 153, the conductive film 154, the conductive film 155, the conductive film 208, and the conductive film 209 are each 10 nm to 400 nm, preferably 100 nm to 200 nm. In this embodiment, the conductive film for the source electrodes and the drain electrodes is obtained by stacking a titanium film, a titanium nitride film, an aluminum film, and a titanium film in this order by a sputtering method. The conductive film is processed into a desired shape by etching. Thus, the conductive film 151, the conductive film 152, the conductive film 153, the conductive film 154, the conductive film 155, the conductive film 208, and the conductive film 209 are formed.

The etching for forming the conductive film 151, the conductive film 152, the conductive film 153, the conductive film 154, the conductive film 155, the conductive film 208, and the conductive film 209 can be either wet etching or dry etching. In the case where the conductive film 151, the conductive film 152, the conductive film 153, the conductive film 154, the conductive film 155, the conductive film 208, and the conductive film 209 are formed by dry etching, a gas including chlorine ($Cl_2$), boron trichloride ($BCl_3$), or the like is preferably used.

Through the above steps, the transistor 146 having the oxide semiconductor film 144 in the channel formation region, and the diode 210 having the p-type semiconductor layer 204 that is a single crystal semiconductor layer and the oxide semiconductor film 207 can be manufactured.

Although a channel-etched transistor is manufactured as the transistor 146 including the oxide semiconductor film 144 in this embodiment, a channel-stop transistor may be manufactured. In that case, a channel protective film may be formed over the oxide semiconductor film 144 to overlap with the gate electrode 141. The channel protective film can prevent a portion of the oxide semiconductor film 144 which is to be a channel formation region, from being damaged in a later step (e.g., reduction in thickness due to plasma or an etchant in etching). Therefore, reliability of the transistor can be improved.

Further, after the oxide semiconductor film 144 is formed, an insulating film may be formed to cover the oxide semiconductor film 144, and a second gate electrode may be formed over the insulating film so as to overlap with the oxide semiconductor film 144. In the case where the second gate electrode is formed, the second gate electrode functions as a so-called back gate. With the second gate electrode, an electric field in the oxide semiconductor film 144 can be controlled, whereby electric characteristics of the transistor 146 can be controlled. Note that the second gate electrode may be electrically connected to another wiring layer, electrode, or the like so that a potential is supplied to the second gate electrode, or may be insulated so as to be in a floating state.

This embodiment can be applied to any semiconductor device that includes two transistors having different characteristics from each other and a diode. Examples of such a semiconductor device include semiconductor devices having a wireless communication function, microprocessors, integrated circuits such as image processing circuits, photoelectric conversion devices, and semiconductor display devices. The photoelectric conversion devices include solar cells and photosensors in the category. The semiconductor display devices include the following in the category: liquid crystal display devices, light-emitting devices in which a light-emitting element typified by an organic light-emitting diode (OLED) is provided for each pixel, electronic paper, electronic book readers, digital micromirror devices (DMDs), plasma display panels (PDPs), field emission displays (FEDs), and other semiconductor display devices in which a driver circuit including a semiconductor element is included.

According to this embodiment, the diode 210 can also be manufactured through a process for manufacturing the transistor 120 or the transistor 121 which is formed using the single crystal semiconductor layer 104 separated from the bond substrate 100 and manufacturing the transistor 146 formed using an oxide semiconductor film. Accordingly, it is not necessary to provide a process for manufacturing the diode 210, separately from the process for manufacturing the transistor 120 or the transistor 121 and the transistor 146. Therefore, the number of manufacturing steps of such a semiconductor device including transistors and a diode can be reduced. When the number of manufacturing steps of the semiconductor device is reduced, yield of the semiconductor device can be improved. When the number of manufacturing steps of the semiconductor device is reduced, manufacturing cost of the semiconductor device can be reduced.

Embodiment 2

In this embodiment, a semiconductor device having a structure different from the structure in Embodiment 1 and a manufacturing method thereof will be described with reference to FIGS. 7A to 7C and FIGS. 15A to 15D.

First, steps up to and including a step in which each of the gate insulating film 142, the insulating film 132, the insulating film 131, and the insulating film 130 is partly etched so that the opening 205 is formed are performed on the basis of the manufacturing steps in FIGS. 1A to 1E, FIGS. 2A to 2D, FIGS. 3A to 3D, FIGS. 4A to 4C, and FIG. 5A of Embodiment 1 (see FIG. 7A). Note that FIG. 7A corresponds to FIG. 5A.

In this embodiment, in a manner similar to that of Embodiment 1, the semiconductor film 106 serving as a channel formation region of the transistor 120, the semiconductor film 107 serving as a channel formation region of the transistor 121, and the semiconductor film 201 serving as the p-type semiconductor layer 204 of a diode 220 that is a rectifier element described later can be formed at a time. By forming the semiconductor film 106, the semiconductor film 107, and the semiconductor film 201 at a time, the number of manufacturing steps of the semiconductor device can be reduced.

Next, the gate insulating film 142, the insulating film 132, the insulating film 131, and the insulating film 130 are partly etched. By this etching step, contact holes reaching the high-concentration impurity regions 113 in the transistor 120 and contact holes reaching the high-concentration impurity regions 116 in the transistor 121 are formed.

Then, a conductive film is formed over the gate insulating film 142, the insulating film 202, and the p-type semiconductor layer 204 by a sputtering method or a vacuum evaporation method. The conductive film is processed into an appropriate shape by etching or the like.

Through the above manufacturing steps, the conductive film 151 functioning as one of a source electrode and a drain electrode of the transistor 120, and the conductive film 152 functioning as the other of the source electrode and the drain electrode of the transistor 120 are formed. The conductive film 153 functioning as one of a source electrode and a drain electrode of the transistor 121, and a conductive film 174 functioning as the other of the source electrode and the drain electrode of the transistor 121 and one of a source electrode and a drain electrode of a transistor 196 are formed. A conductive film 175 functioning as the other of the source electrode and the drain electrode of the transistor 196 is formed. Conductive films 218 and 219 functioning as electrodes of the diode 220 are formed (see FIG. 7B). Note that the conductive film 219 is shown by a dotted line in FIG. 7B because it cannot be illustrated in the cross-sectional view.

FIG. 15B is a top view of the diode 220, and FIGS. 15C and 15D are cross-sectional views along line C-C' and line D-D' in FIG. 15B (top view), respectively. As illustrated in FIGS. 15B and 15D, the conductive film 219 is electrically connected to the p-type semiconductor layer 204 in a region which is over the p-type semiconductor layer 204 and not provided with an oxide semiconductor film 217 (described later).

The conductive film 218 and the conductive film 219 which are the electrodes of the diode 220 are electrically connected to the oxide semiconductor film 217 that is an n-type semiconductor layer described later and the p-type semiconductor layer 204, respectively.

Next, an oxide semiconductor film is formed over the gate insulating film 142, the conductive film 174, the conductive film 175, the conductive film 218, the insulating film 202, and the p-type semiconductor layer 204, and then the oxide semiconductor film is processed into a desired shape by etching or the like. Thus, an island-shaped oxide semiconductor film 183 is formed to overlap with the gate electrode 141, and an island-shaped oxide semiconductor film 216 is formed in contact with the p-type semiconductor layer 204 (see FIG. 7C). Note that for detailed steps and conditions for the formation of the island-shaped oxide semiconductor film 183 and the island-shaped oxide semiconductor film 216, those of the island-shaped oxide semiconductor film 143 and the island-shaped oxide semiconductor film 206 described in Embodiment 1 can be referred to, respectively.

The oxide semiconductor film 183 serving as a channel formation region of the transistor 196 described later and the oxide semiconductor film 216 serving as an n-type semiconductor layer of the diode 220 can be formed at a time. Since the oxide semiconductor film 183 and the oxide semiconductor film 216 can be formed at a time, the number of manufacturing steps of the semiconductor device can be reduced.

Next, heat treatment may be performed on the oxide semiconductor film 183 and the oxide semiconductor film 216 in an atmosphere of an inert gas (such as nitrogen, helium, neon, or argon).

By performing the heat treatment on the oxide semiconductor film 183 and the oxide semiconductor film 216, an oxide semiconductor film 184 and the oxide semiconductor film 217 in which the amount of impurities such as hydrogen and water is reduced are formed as illustrated in FIG. 15A.

Through the above steps, the transistor 196 having the oxide semiconductor film 184 in the channel formation region, and the diode 220 having the p-type semiconductor layer 204 that is a single crystal semiconductor layer and the oxide semiconductor film 217 can be manufactured.

Note that the transistor 196 illustrated in FIG. 15A can be referred to as a bottom-gate bottom-contact transistor because the transistor 196 is a bottom-gate transistor and the oxide semiconductor film 184 is connected to the source electrode or the drain electrode (the conductive film 174 or the conductive film 175) in a region including a bottom surface of the oxide semiconductor film 184.

Although a channel-etched transistor is manufactured as the transistor 196 including the oxide semiconductor film 184 in this embodiment, a channel-stop transistor may be manufactured. In that case, a channel protective film may be formed over the oxide semiconductor film 184 to overlap with the gate electrode 141. The channel protective film can prevent a portion of the oxide semiconductor film 184 which is to be a channel formation region, from being damaged in a later step (e.g., reduction in thickness due to plasma or an etchant in etching). Therefore, reliability of the transistor can be improved.

Further, after the oxide semiconductor film 184 is formed, an insulating film may be formed to cover the oxide semiconductor film 184, and a second gate electrode may be formed over the insulating film so as to overlap with the oxide semiconductor film 184. In the case where the second gate electrode is formed, the second gate electrode functions as a so-called back gate. With the second gate electrode, an electric field in the oxide semiconductor film 184 can be controlled, whereby electric characteristics of the transistor 196 can be controlled. Note that the second gate electrode may be electrically connected to another wiring layer, electrode, or the like so that a potential is supplied to the second gate electrode, or may be insulated so as to be in a floating state.

Note that as in the case of Embodiment 1, this embodiment can be applied to any semiconductor device that includes two transistors having different characteristics from each other and a diode. Examples of such a semiconductor device include semiconductor devices having a wireless communication function, microprocessors, integrated circuits such as image processing circuits, photoelectric conversion devices, and semiconductor display devices. The photoelectric conversion devices include solar cells and photosensors in the category. The semiconductor display devices include the following in the category: liquid crystal display devices, light-emitting devices in which a light-emitting element typified by an organic light-emitting diode (OLED) is provided for each pixel, electronic paper, electronic book readers, digital micromirror devices (DMDs), plasma display panels (PDPs), field emission displays (FEDs), and other semiconductor display devices in which a driver circuit including a semiconductor element is included.

According to this embodiment, the diode 220 can also be manufactured through a process for manufacturing the transistor 120 or the transistor 121 which is formed using the single crystal semiconductor layer 104 separated from the bond substrate 100 and manufacturing the transistor 196 formed using an oxide semiconductor film. Accordingly, it is not necessary to provide a process for manufacturing the diode 220, separately from the process for manufacturing the transistor 120 or the transistor 121 and the transistor 196. Therefore, the number of manufacturing steps of such a semiconductor device including transistors and a diode can be reduced. When the number of manufacturing steps of the semiconductor device is reduced, yield of the semiconductor device can be improved. When the number of manufacturing steps of the semiconductor device is reduced, manufacturing cost of the semiconductor device can be reduced.

Embodiment 3

In this embodiment, a semiconductor device having a structure different from the structures in Embodiments 1 and 2 and a manufacturing method thereof will be described with reference to FIGS. 8A to 8C and FIGS. 16A to 16D.

Figure 8A:
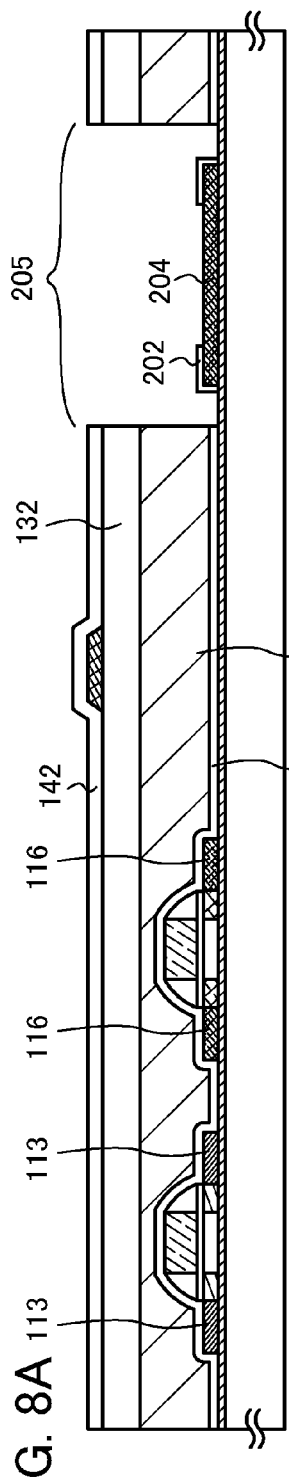
FIGS. 8A to 8C are cross-sectional views illustrating manufacturing steps of a semiconductor device.
Figure 8B:
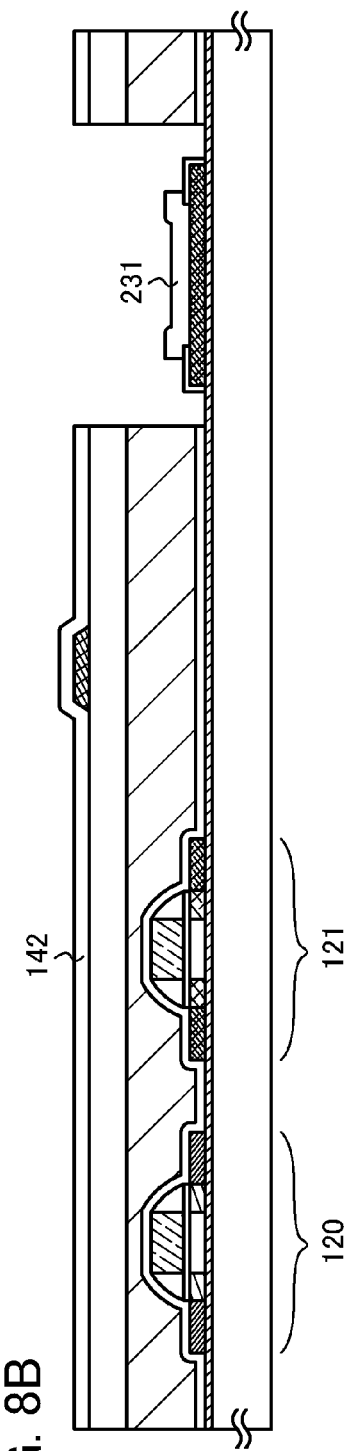
Figure 8C:
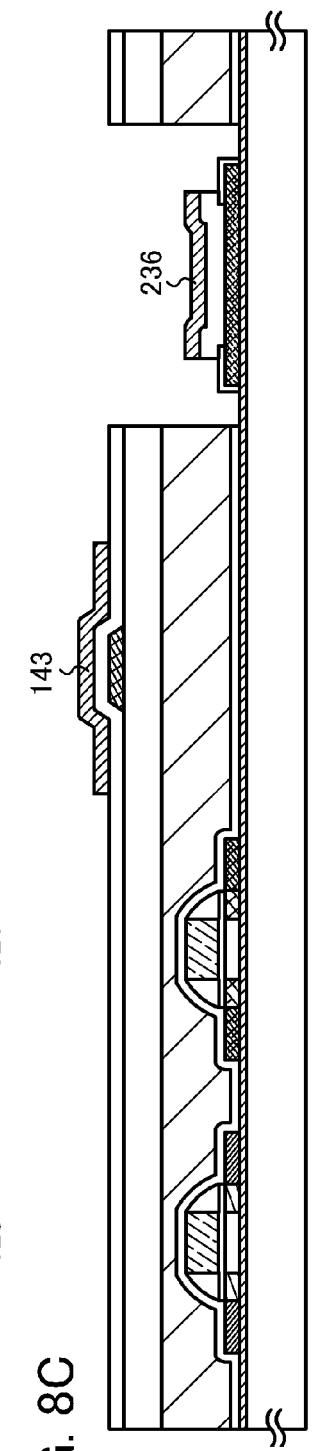

First, steps up to and including a step in which each of the gate insulating film 142, the insulating film 132, the insulating film 131, and the insulating film 130 is partly etched so that the opening 205 is formed are performed on the basis of the manufacturing steps in FIGS. 1A to 1E, FIGS. 2A to 2D, FIGS. 3A to 3D, FIGS. 4A to 4C, and FIG. 5A of Embodiment 1 (see FIG. 8A). Note that FIG. 8A corresponds to FIG. 5A.

In this embodiment, in a manner similar to that of Embodiment 1, the semiconductor film 106 serving as a channel formation region of the transistor 120, the semiconductor film 107 serving as a channel formation region of the transistor 121, and the semiconductor film 201 serving as the p-type semiconductor layer 204 of a diode 240 that is a rectifier element described later can be formed at a time. By forming the semiconductor film 106, the semiconductor film 107, and the semiconductor film 201 at a time, the number of manufacturing steps of the semiconductor device can be reduced.

Next, an intrinsic semiconductor film is formed over the p-type semiconductor layer 204 and the insulating film 202. After being formed, the intrinsic semiconductor film is processed into a desired shape by etching or the like. By this step, an island-shaped intrinsic semiconductor film 231 is formed in contact with the p-type semiconductor layer 204 (see FIG. 8B).

The island-shaped intrinsic semiconductor film 231 serves as an intrinsic semiconductor layer of the diode 240 having a pin junction.

Note that the intrinsic semiconductor layer mentioned here refers to a semiconductor layer in which the concentration of an impurity therein imparting p-type or n-type conductivity is $1 \times 10^{20}$ cm$^{-3}$ or lower and the concentrations of oxygen and nitrogen are each $9 \times 10^{19}$ cm$^3$ or lower, and whose photoconductivity is greater than or equal to 1000 times as high as dark conductivity. In this specification, the intrinsic semiconductor layer is also called an i-type semiconductor layer.

Next, an oxide semiconductor film is formed over the gate insulating film 142 and the intrinsic semiconductor film 231. After being formed, the oxide semiconductor film is processed into a desired shape by etching or the like. Thus, the island-shaped oxide semiconductor film 143 is formed to overlap with the gate electrode 141, and an island-shaped oxide semiconductor film 236 is formed in contact with the intrinsic semiconductor film 231 (see FIG. 8C). Note that for detailed steps and conditions for the formation of the island-shaped oxide semiconductor film 143 and the island-shaped oxide semiconductor film 236, those of the island-shaped oxide semiconductor film 143 and the island-shaped oxide semiconductor film 206 described in Embodiment 1 can be referred to, respectively.

The oxide semiconductor film 143 serving as a channel formation region of the transistor 146 and the oxide semiconductor film 236 serving as an n-type semiconductor layer of the diode 240 can be formed at a time. Since the oxide semiconductor film 143 and the oxide semiconductor film 236 can be formed at a time, the number of manufacturing steps of the semiconductor device can be reduced.

Next, heat treatment may be performed on the oxide semiconductor film 143 and the oxide semiconductor film 236 in an atmosphere of an inert gas (such as nitrogen, helium, neon, or argon).

By performing the heat treatment on the oxide semiconductor film 143 and the oxide semiconductor film 236, the oxide semiconductor film 144 and an oxide semiconductor film 237 in which the amount of impurities such as hydrogen and water is reduced are formed.

Then, a conductive film is formed over the gate insulating film 142, the oxide semiconductor film 144, the insulating film 202, and the oxide semiconductor film 237 by a sputtering method or a vacuum evaporation method. The conductive film is processed into an appropriate shape by etching or the like.

In this manner, the conductive film 151 functioning as one of a source electrode and a drain electrode of the transistor 120, and the conductive film 152 functioning as the other of the source electrode and the drain electrode of the transistor 120 are formed. The conductive film 153 functioning as one of a source electrode and a drain electrode of the transistor 121, and the conductive film 154 functioning as the other of the source electrode and the drain electrode of the transistor 121 and one of a source electrode and a drain electrode of the transistor 146 are formed. The conductive film 155 functioning as the other of the source electrode and the drain electrode of the transistor 146 is formed. Conductive films 238 and 239 functioning as electrodes of the diode 240 are formed (see FIG. 16A). Note that the conductive film 239 is shown by a dotted line in FIG. 16A because it cannot be illustrated in the cross-sectional view.

Note that the transistor 146 illustrated in FIG. 16A can be referred to as a bottom-gate top-contact transistor because the transistor 146 is a bottom-gate transistor and the oxide semiconductor film 144 is connected to the source electrode or the drain electrode (the conductive film 154 or the conductive film 155) in a region including a top surface of the oxide semiconductor film 144.

The conductive film 238 and the conductive film 239 which are the electrodes of the diode 240 are electrically connected to the oxide semiconductor film 237 that is an n-type semiconductor layer and the p-type semiconductor layer 204, respectively.

The conductive film 239 needs to be electrically connected to the p-type semiconductor layer 204 of the diode 240. FIG. 16B is a top view of the diode 240, and FIGS. 16C and 16D are cross-sectional views along line E-E' and line F-F' in FIG. 16B (top view), respectively. Note that in FIG. 16B, the intrinsic semiconductor film 231 is provided to overlap with the oxide semiconductor film 237. As illustrated in FIGS. 16B and 16D, the conductive film 239 is electrically connected to the p-type semiconductor layer 204 in a region which is over the p-type semiconductor layer 204 and not provided with the oxide semiconductor film 237.

Through the above steps, the transistor 146 having the oxide semiconductor film 144 in the channel formation region, and the diode 240 having the p-type semiconductor layer 204 that is a single crystal semiconductor layer and the oxide semiconductor film 237 can be manufactured.

Although a channel-etched transistor is manufactured as the transistor 146 including the oxide semiconductor film 144 in this embodiment, a channel-stop transistor may be manufactured. In that case, a channel protective film may be formed over the oxide semiconductor film 144 to overlap with the gate electrode 141. The channel protective film can prevent a portion of the oxide semiconductor film 144 which is to be a channel formation region, from being damaged in a later step (e.g., reduction in thickness due to plasma or an etchant in etching). Therefore, reliability of the transistor can be improved.

Further, after the oxide semiconductor film 144 is formed, an insulating film may be formed to cover the oxide semiconductor film 144, and a second gate electrode may be formed over the insulating film so as to overlap with the oxide semiconductor film 144. In the case where the second gate electrode is formed, the second gate electrode functions as a so-called back gate. With the second gate electrode, an electric field in the oxide semiconductor film 144 can be controlled, whereby electric characteristics of the transistor 146 can be controlled. Note that the second gate electrode may be electrically connected to another wiring layer, electrode, or the like so that a potential is supplied to the second gate electrode, or may be insulated so as to be in a floating state.

Note that as in the case of Embodiment 1, this embodiment can be applied to any semiconductor device that includes two transistors having different characteristics from each other and a diode. Examples of such a semiconductor device include semiconductor devices having a wireless communication function, microprocessors, integrated circuits such as image processing circuits, photoelectric conversion devices, and semiconductor display devices. The photoelectric conversion devices include solar cells and photosensors in the category. The semiconductor display devices include the following in the category: liquid crystal display devices, light-emitting devices in which a light-emitting element typified by an organic light-emitting diode (OLED) is provided for each pixel, electronic paper, electronic book readers, digital micromirror devices (DMDs), plasma display panels (PDPs), field emission displays (FEDs), and other semiconductor display devices in which a driver circuit including a semiconductor element is included.

According to this embodiment, the diode 240 can also be manufactured through a process for manufacturing the transistor 120 or the transistor 121 which is formed using the single crystal semiconductor layer 104 separated from the bond substrate 100 and manufacturing the transistor 146 formed using an oxide semiconductor film. Accordingly, it is not necessary to provide a process for manufacturing the diode 240, separately from the process for manufacturing the transistor 120 or the transistor 121 and the transistor 146. Therefore, the number of manufacturing steps of such a semiconductor device including transistors and a diode can be reduced. When the number of manufacturing steps of the semiconductor device is reduced, yield of the semiconductor device can be improved. When the number of manufacturing steps of the semiconductor device is reduced, manufacturing cost of the semiconductor device can be reduced.

Embodiment 4

In this embodiment, a semiconductor device having a structure different from the structures in Embodiments 1 to 3 and a manufacturing method thereof will be described with reference to FIGS. 9A to 9C, FIGS. 10A and 10B, and FIGS. 17A to 17C.

First, steps up to and including a step in which each of the gate insulating film 142, the insulating film 132, the insulating film 131, and the insulating film 130 is partly etched so that the opening 205 is formed are performed on the basis of the manufacturing steps in FIGS. 1A to 1E, FIGS. 2A to 2D, FIGS. 3A to 3D, FIGS. 4A to 4C, and FIG. 5A of Embodiment 1 (see FIG. 9A). Note that FIG. 9A corresponds to FIG. 5A.

In this embodiment, in a manner similar to that of Embodiment 1, the semiconductor film 106 serving as a channel formation region of the transistor 120, the semiconductor film 107 serving as a channel formation region of the transistor 121, and the semiconductor film 201 serving as the p-type semiconductor layer 204 of a diode 250 that is a rectifier element described later can be formed at a time. By forming the semiconductor film 106, the semiconductor film 107, and the semiconductor film 201 at a time, the number of manufacturing steps of the semiconductor device can be reduced.

Next, the gate insulating film 142, the insulating film 132, the insulating film 131, and the insulating film 130 are partly etched. By this etching step, contact holes reaching the high-concentration impurity regions 113 in the transistor 120 and contact holes reaching the high-concentration impurity regions 116 in the transistor 121 are formed.

Then, a conductive film is formed over the gate insulating film 142, the insulating film 202, and the p-type semiconductor layer 204 by a sputtering method or a vacuum evaporation method. The conductive film is processed into an appropriate shape by etching or the like.

In this manner, the conductive film 151 functioning as one of a source electrode and a drain electrode of the transistor 120, and the conductive film 152 functioning as the other of the source electrode and the drain electrode of the transistor 120 are formed. The conductive film 153 functioning as one of a source electrode and a drain electrode of the transistor 121, and the conductive film 174 functioning as the other of the source electrode and the drain electrode of the transistor 121 and one of a source electrode and a drain electrode of the transistor 196 are formed. The conductive film 175 functioning as the other of the source electrode and the drain electrode of the transistor 196 is formed. The conductive films 218 and 219 functioning as electrodes of the diode 250 are formed (see FIG. 9B). Note that the conductive film 219 is shown by a dotted line in FIG. 9B because it cannot be illustrated in the cross-sectional view.

Figure 17B:
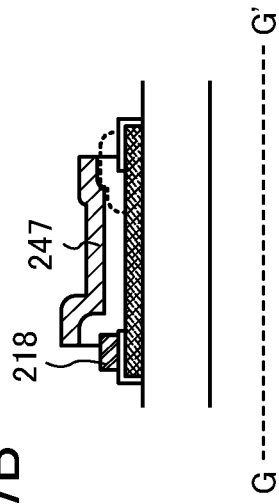
FIGS. 17A to 17C are a top view and cross-sectional views illustrating a manufacturing step of a semiconductor device.
Figure 17C:
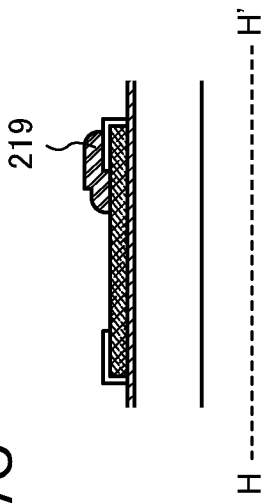
Figure 17A:
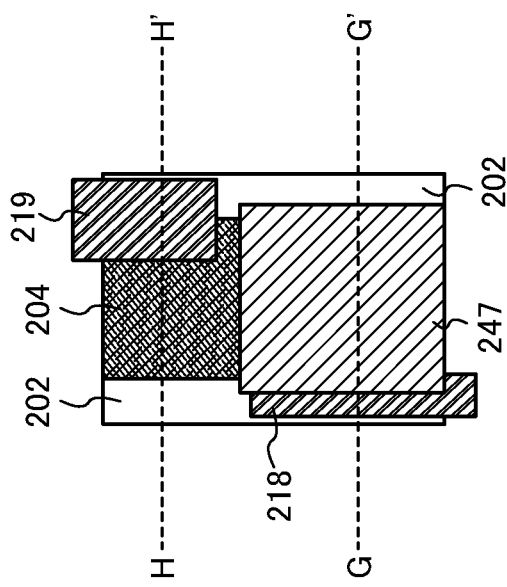

The conductive film 218 and the conductive film 219 which are the electrodes of the diode 250 are electrically connected to an oxide semiconductor film 247 that is an n-type semiconductor layer described later and the p-type semiconductor layer 204, respectively. Note that FIG. 17A is a top view of the conductive film 218, the conductive film 219, and the p-type semiconductor layer 204 and details of the components will be described later.

Next, an intrinsic semiconductor film is formed over the p-type semiconductor layer 204, the insulating film 202, and the conductive film 218. After being formed, the intrinsic semiconductor film is processed into a desired shape by etching or the like. By this step, an island-shaped intrinsic semiconductor film 241 is formed in contact with the p-type semiconductor layer 204 (see FIG. 9C).

The island-shaped intrinsic semiconductor film 241 serves as an intrinsic semiconductor layer of the diode 250 having a pin junction.

Next, an oxide semiconductor film is formed over the gate insulating film 142 and the intrinsic semiconductor film 241. After being formed, the above oxide semiconductor film is processed into a desired shape by etching or the like. Thus, the island-shaped oxide semiconductor film 183 is formed to overlap with the gate electrode 141, and an island-shaped oxide semiconductor film 246 is formed in contact with the intrinsic semiconductor film 241 (see FIG. 10A). Note that for detailed steps and conditions for the formation of the island-shaped oxide semiconductor film 183 and the island-shaped oxide semiconductor film 246, those of the island-shaped oxide semiconductor film 143 and the island-shaped oxide semiconductor film 206 described in Embodiment 1 can be referred to, respectively.

The oxide semiconductor film 183 serving as a channel formation region of the transistor 196 described later and the oxide semiconductor film 246 serving as an n-type semiconductor layer of the diode 250 can be formed at a time. Since the oxide semiconductor film 183 and the oxide semiconductor film 246 can be formed at a time, the number of manufacturing steps of the semiconductor device can be reduced.

Next, heat treatment may be performed on the oxide semiconductor film 183 and the oxide semiconductor film 246 in an atmosphere of an inert gas (such as nitrogen, helium, neon, or argon).

By performing the heat treatment on the oxide semiconductor film 183 and the oxide semiconductor film 246, the oxide semiconductor film 184 and the oxide semiconductor film 247 in which the amount of impurities such as hydrogen and water is reduced are formed (see FIG. 10B).

Note that the transistor 196 illustrated in FIG. 10B can be referred to as a bottom-gate bottom-contact transistor because the transistor 196 is a bottom-gate transistor and the oxide semiconductor film 184 is connected to the source electrode or the drain electrode (the conductive film 174 or the conductive film 175) in a region including a bottom surface of the oxide semiconductor film 184.

The conductive film 218 and the conductive film 219 which are the electrodes of the diode 250 are electrically connected to the oxide semiconductor film 247 that is an n-type semiconductor layer and the p-type semiconductor layer 204, respectively.

The conductive film 219 needs to be electrically connected to the p-type semiconductor layer 204 of the diode 250. FIG. 17A is a top view of the diode 250, and FIGS. 17B and 17C are cross-sectional views along line G-G' and line H-H' in FIG. 17A (top view), respectively. Note that in FIG. 17A, the intrinsic semiconductor film 241 is provided to overlap with the oxide semiconductor film 247. As illustrated in FIGS. 17A and 17C, the conductive film 219 is electrically connected to the p-type semiconductor layer 204 in a region which is over the p-type semiconductor layer 204 and not provided with the oxide semiconductor film 247.

Through the above steps, the transistor 196 in which the oxide semiconductor film 184 is used as the channel formation region, and the diode 250 having the p-type semiconductor layer 204 that is a single crystal semiconductor layer and the oxide semiconductor film 247 can be manufactured.

Although a channel-etched transistor is manufactured as the transistor 196 including the oxide semiconductor film 184 in this embodiment, a channel-stop transistor may be manufactured. In that case, a channel protective film may be formed over the oxide semiconductor film 184 to overlap with the gate electrode 141. The channel protective film can prevent a portion of the oxide semiconductor film 184 which is to be a channel formation region, from being damaged in a later step (e.g., reduction in thickness due to plasma or an etchant in etching). Therefore, reliability of the transistor can be improved.

Further, after the oxide semiconductor film 184 is formed, an insulating film may be formed to cover the oxide semiconductor film 184, and a second gate electrode may be formed over the insulating film so as to overlap with the oxide semiconductor film 184. In the case where the second gate electrode is formed, the second gate electrode functions as a so-called back gate. With the second gate electrode, an electric field in the oxide semiconductor film 184 can be controlled, whereby electric characteristics of the transistor 196 can be controlled. Note that the second gate electrode may be electrically connected to another wiring layer, electrode, or the like so that a potential is supplied to the second gate electrode, or may be insulated so as to be in a floating state.

Note that as in the case of Embodiment 1, this embodiment can be applied to any semiconductor device that includes two transistors having different characteristics from each other and a diode. Examples of such a semiconductor device include semiconductor devices having a wireless communication function, microprocessors, integrated circuits such as image processing circuits, photoelectric conversion devices, and semiconductor display devices. The photoelectric conversion devices include solar cells and photosensors in the category. The semiconductor display devices include the following in the category: liquid crystal display devices, light-emitting devices in which a light-emitting element typified by an organic light-emitting diode (OLED) is provided for each pixel, electronic paper, electronic book readers, digital micromirror devices (DMDs), plasma display panels (PDPs), field emission displays (FEDs), and other semiconductor display devices in which a driver circuit including a semiconductor element is included.

According to this embodiment, the diode 250 can also be manufactured through a process for manufacturing the transistor 120 or the transistor 121 which is formed using the single crystal semiconductor layer 104 separated from the bond substrate 100 and manufacturing the transistor 196 formed using an oxide semiconductor film. Accordingly, it is not necessary to provide a process for manufacturing the diode 250, separately from the process for manufacturing the transistor 120 or the transistor 121 and the transistor 196. Therefore, the number of manufacturing steps of such a semiconductor device including transistors and a diode can be reduced. When the number of manufacturing steps of the semiconductor device is reduced, yield of the semiconductor device can be improved. When the number of manufacturing steps of the semiconductor device is reduced, manufacturing cost of the semiconductor device can be reduced.

Embodiment 5

The transistors in Embodiments 1 to 4, each of which has an oxide semiconductor film in a channel formation region, are bottom-gate transistors. In this embodiment, a semiconductor device including a top-gate transistor having an oxide semiconductor film in a channel formation region and a method for manufacturing the semiconductor device will be described.

This embodiment will be described with reference to FIGS. 11A and 11B and FIGS. 18A and 18B.

First, steps up to and including a step of forming the insulating film 132 illustrated in FIG. 4A are performed on the basis of Embodiment 1.

Thus, the semiconductor film 106 serving as a channel formation region of the transistor 120, the semiconductor film 107 serving as a channel formation region of the transistor 121, and the semiconductor film 201 serving as the p-type semiconductor layer 204 of a diode 309 that is a rectifier element can be formed at a time. By forming the semiconductor film 106, the semiconductor film 107, and the semiconductor film 201 at a time, the number of manufacturing steps of the semiconductor device can be reduced.

Next, the insulating film 132, the insulating film 131, and the insulating film 130 are partly etched. By this etching step, contact holes reaching the high-concentration impurity regions 113 in the transistor 120 and contact holes reaching the high-concentration impurity regions 116 in the transistor 121 are formed.

Through the above steps, the conductive film 151 functioning as one of a source electrode and a drain electrode of the transistor 120, and the conductive film 152 functioning as the other of the source electrode and the drain electrode of the transistor 120 are formed. The conductive film 153 functioning as one of a source electrode and a drain electrode of the transistor 121, and a conductive film 304 functioning as the other of the source electrode and the drain electrode of the transistor 121 and one of a source electrode and a drain electrode of a transistor 308 are formed. A conductive film 305 functioning as the other of the source electrode and the drain electrode of the transistor 308 is formed. The conductive films 218 and 219 functioning as electrodes of the diode 309 are formed. Note that the conductive film 219 is shown by a dotted line because it cannot be illustrated in the cross-sectional view. In addition, the conductive film 218 and the conductive film 219 are similar to the conductive film 218 and the conductive film 219 described in Embodiment 2.

The conductive film 218 and the conductive film 219 which are the electrodes of the diode 309 are electrically connected to an oxide semiconductor film 307 that is an n-type semiconductor layer described later and the p-type semiconductor layer 204, respectively.

Next, an oxide semiconductor film is formed over the insulating film 132, the conductive film 304, the conductive film 305, the insulating film 202, the conductive film 218, and the p-type semiconductor layer 204. After being formed, the above oxide semiconductor film is processed into a desired shape by etching or the like. Thus, an island-shaped oxide semiconductor film 300 is formed to overlap with the conductive film 304 and the conductive film 305, and an island-shaped oxide semiconductor film 310 is formed in contact with the p-type semiconductor layer 204 (see FIG. 11A). Note that for detailed steps and conditions for the formation of the oxide semiconductor film 300 which overlaps with the conductive film 304 and the conductive film 305 and the oxide semiconductor film 310 which is in contact with the p-type semiconductor layer 204, those of the island-shaped oxide semiconductor film 143 and the island-shaped oxide semiconductor film 206 described in Embodiment 1 can be referred to, respectively.

The oxide semiconductor film 300 serving as a channel formation region of the transistor 308 described later and the oxide semiconductor film 310 serving as an n-type semiconductor layer of the diode 309 that is a rectifier element can be formed at a time. Thus, the number of manufacturing steps of the semiconductor device can be reduced.

Next, heat treatment may be performed on the oxide semiconductor film 300 which overlaps with the conductive film 304 and the conductive film 305 and the oxide semiconductor film 310 which is in contact with the p-type semiconductor layer 204 in an atmosphere of an inert gas (such as nitrogen, helium, neon, or argon).

By performing the heat treatment on the oxide semiconductor film 300 which overlaps with the conductive film 304 and the conductive film 305 and the oxide semiconductor film 310 which is in contact with the p-type semiconductor layer 204, an oxide semiconductor film 301 and the oxide semiconductor film 307 in which the amount of impurities such as hydrogen and water is reduced are formed.

Then, an insulating film 302 is formed to cover the insulating film 132, the conductive film 151, the conductive film 152, the conductive film 153, the conductive film 304, the oxide semiconductor film 301, and the conductive film 305. The insulating film 302 may cover the diode 309. The insulating film 302 functions as a gate insulating film of the transistor 308. The insulating film 302 also functions as a protective film of the transistor 120, the transistor 121, and the diode 309.

A conductive film is formed over the insulating film 302 by a sputtering method or a vacuum evaporation method. The conductive film is processed into an appropriate shape by etching or the like so as to be provided in a region which is over the insulating film 302 and overlaps with the oxide semiconductor film 301. Thus, a gate electrode 303 of the transistor 308 is formed.

Through the above steps, the transistor 308 in which the oxide semiconductor film 301 is used as the channel formation region, and the diode 309 having the p-type semiconductor layer 204 that is a single crystal semiconductor layer and the oxide semiconductor film 307 can be manufactured (see FIG. 11B).

Note that as in the case of Embodiment 1, this embodiment can be applied to any semiconductor device that includes two transistors having different characteristics from each other and a diode. Examples of such a semiconductor device include semiconductor devices having a wireless communication function, microprocessors, integrated circuits such as image processing circuits, photoelectric conversion devices, and semiconductor display devices. The photoelectric conversion devices include solar cells and photosensors in the category. The semiconductor display devices include the following in the category: liquid crystal display devices, light-emitting devices in which a light-emitting element typified by an organic light-emitting diode (OLED) is provided for each pixel, electronic paper, electronic book readers, digital micromirror devices (DMDs), plasma display panels (PDPs), field emission displays (FEDs), and other semiconductor display devices in which a driver circuit including a semiconductor element is included.

According to this embodiment, the diode 309 can also be manufactured through a process for manufacturing the transistor 120 or the transistor 121 which is formed using the single crystal semiconductor layer 104 separated from the bond substrate 100 and manufacturing the transistor 308 formed using an oxide semiconductor film. Accordingly, it is not necessary to provide a process for manufacturing the diode 309, separately from the process for manufacturing the transistor 120 or the transistor 121 and the transistor 308. Therefore, the number of manufacturing steps of such a semiconductor device including transistors and a diode can be reduced. When the number of manufacturing steps of the semiconductor device is reduced, yield of the semiconductor device can be improved. When the number of manufacturing steps of the semiconductor device is reduced, manufacturing cost of the semiconductor device can be reduced.

FIG. 18B illustrates a semiconductor device having a structure different from that in FIG. 11B. The semiconductor device illustrated in FIG. 18B includes the transistor 120, the transistor 121, a transistor 318, and a diode 319 that is a rectifier element. A method for manufacturing the semiconductor device illustrated in FIG. 18B will be described below.

First, steps up to and including a step of forming the insulating film 132 illustrated in FIG. 4A are performed on the basis of Embodiment 1.

Thus, the semiconductor film 106 serving as a channel formation region of the transistor 120, the semiconductor film 107 serving as a channel formation region of the transistor 121, and the semiconductor film 201 serving as the p-type semiconductor layer 204 of the diode 319 can be formed at a time. By forming the semiconductor film 106, the semiconductor film 107, and the semiconductor film 201 at a time, the number of manufacturing steps of the semiconductor device can be reduced.

Next, an oxide semiconductor film is formed over the insulating film 132. After being formed, the above oxide semiconductor film is processed into a desired shape by etching or the like. Thus, an island-shaped oxide semiconductor film 320 is formed over the insulating film 132, and an island-shaped oxide semiconductor film 330 is formed in contact with the p-type semiconductor layer 204. Note that for detailed steps and conditions for the formation of the oxide semiconductor film 320 which is formed over the insulating film 132 and the oxide semiconductor film 330 which is in contact with the p-type semiconductor layer 204, those of the island-shaped oxide semiconductor film 143 and the island-shaped oxide semiconductor film 206 described in Embodiment 1 can be referred to, respectively.

The oxide semiconductor film 320 serving as a channel formation region of the transistor 318 described later and the oxide semiconductor film 330 serving as an n-type semiconductor layer of the diode 319 can be formed at a time. Thus, the number of manufacturing steps of the semiconductor device can be reduced.

Next, heat treatment may be performed on the oxide semiconductor film 320 which is formed over the insulating film 132 and the oxide semiconductor film 330 which is in contact with the p-type semiconductor layer 204 in an atmosphere of an inert gas (such as nitrogen, helium, neon, or argon).

By performing the heat treatment on the oxide semiconductor film 320 which is formed over the insulating film 132 and the oxide semiconductor film 330 which is in contact with the p-type semiconductor layer 204, an oxide semiconductor film 311 and an oxide semiconductor film 317 in which the amount of impurities such as hydrogen and water is reduced are formed.

Next, the insulating film 132, the insulating film 131, and the insulating film 130 are partly etched. By this etching step, contact holes reaching the high-concentration impurity regions 113 in the transistor 120 and contact holes reaching the high-concentration impurity regions 116 in the transistor 121 are formed.

Through the above manufacturing steps, the conductive film 151 functioning as one of a source electrode and a drain electrode of the transistor 120, and the conductive film 152 functioning as the other of the source electrode and the drain electrode of the transistor 120 are formed. The conductive film 153 functioning as one of a source electrode and a drain electrode of the transistor 121, and a conductive film 314 functioning as the other of the source electrode and the drain electrode of the transistor 121 and one of a source electrode and a drain electrode of the transistor 318 are formed. A conductive film 315 functioning as the other of the source electrode and the drain electrode of the transistor 318 is formed. The conductive films 208 and 209 functioning as electrodes of the diode 319 are formed. Note that the conductive film 209 is shown by a dotted line because it cannot be illustrated in the cross-sectional view. In addition, the conductive film 208 and the conductive film 209 are similar to the conductive film 208 and the conductive film 209 described in Embodiment 1.

The conductive film 208 and the conductive film 209 which are the electrodes of the diode 319 are electrically connected to the oxide semiconductor film 317 that is an n-type semiconductor layer described later and the p-type semiconductor layer 204, respectively.

Then, an insulating film 312 is formed to cover the insulating film 132, the conductive film 151, the conductive film 152, the conductive film 153, the conductive film 314, the oxide semiconductor film 311, and the conductive film 315. The insulating film 312 may cover the diode 319. The insulating film 312 functions as a gate insulating film of the transistor 318. The insulating film 312 also functions as a protective film of the transistor 120, the transistor 121, and the diode 319.

A conductive film is formed over the insulating film 312 by a sputtering method or a vacuum evaporation method. The conductive film is processed into an appropriate shape by etching or the like so as to be provided in a region which is over the insulating film 312 and overlaps with the oxide semiconductor film 311. Thus, a gate electrode 313 of the transistor 318 is formed.

Through the above steps, the transistor 318 having the oxide semiconductor film 311 in the channel formation region, and the diode 319 having the p-type semiconductor layer 204 that is a single crystal semiconductor layer and the oxide semiconductor film 317 can be manufactured.

Although this embodiment relates to a semiconductor device having a wireless communication function and a manufacturing method thereof as in the case of Embodiment 1, the semiconductor device of this embodiment is not limited to this. This embodiment can be applied to any semiconductor device that includes two transistors having different characteristics from each other and a diode. Examples of such a semiconductor device include microprocessors, integrated circuits such as image processing circuits, photoelectric conversion devices, and semiconductor display devices. The photoelectric conversion devices include solar cells and photosensors in the category. The semiconductor display devices include the following in the category: liquid crystal display devices, light-emitting devices in which a light-emitting element typified by an organic light-emitting diode (OLED) is provided for each pixel, electronic paper, electronic book readers, digital micromirror devices (DMDs), plasma display panels (PDPs), field emission displays (FEDs), and other semiconductor display devices in which a driver circuit including a semiconductor element is included.

According to this embodiment, the diode 319 can also be manufactured through a process for manufacturing the transistor 120 or the transistor 121 which is formed using the single crystal semiconductor layer 104 separated from the bond substrate 100 and manufacturing the transistor 318 formed using an oxide semiconductor film. Accordingly, it is not necessary to provide a process for manufacturing the diode 319, separately from the process for manufacturing the transistor 120 or the transistor 121 and the transistor 318. Therefore, the number of manufacturing steps of such a semiconductor device including transistors and a diode can be reduced. When the number of manufacturing steps of the semiconductor device is reduced, yield of the semiconductor device can be improved. When the number of manufacturing steps of the semiconductor device is reduced, manufacturing cost of the semiconductor device can be reduced.

In this embodiment, in the semiconductor device illustrated in FIG. 11B and the semiconductor device illustrated in FIG. 18B, an intrinsic semiconductor layer may be provided between the p-type semiconductor layer 204 and the oxide semiconductor film 307 that is an n-type semiconductor layer and between the p-type semiconductor layer 204 and the oxide semiconductor film 317 that is an n-type semiconductor layer. Description in Embodiment 3 or 4 can be referred to for a method for forming the intrinsic semiconductor layer.

According to one embodiment of the disclosed invention, in the manufacture of a semiconductor device, through a process for manufacturing a first semiconductor element (e.g., a transistor including silicon) and a second semiconductor element (e.g., a transistor including an oxide semiconductor film) which have different characteristics from each other, a third semiconductor element (e.g., a diode) is also manufactured; thus, the number of manufacturing steps can be reduced. When the number of manufacturing steps of the semiconductor device is reduced, yield of the semiconductor device can be improved. When the number of manufacturing steps of the semiconductor device is reduced, manufacturing cost of the semiconductor device can be reduced.

Embodiment 6

In Embodiment 1, an example in which a single crystal semiconductor layer is used for the channel formation regions of the transistor 120 and the transistor 121 is described. In Embodiment 6, an example in which a polycrystalline semiconductor layer is used for the channel formation regions of the transistor 120 and the transistor 121 will be described.

This embodiment will be described with reference to FIGS. 19A to 19C, FIGS. 20A and 20B, FIGS. 21A and 21B, and FIGS. 22A and 22B. First, a substrate 901 is prepared. A substrate similar to the base substrate 103 may be used as the substrate 901.

Figure 19A:
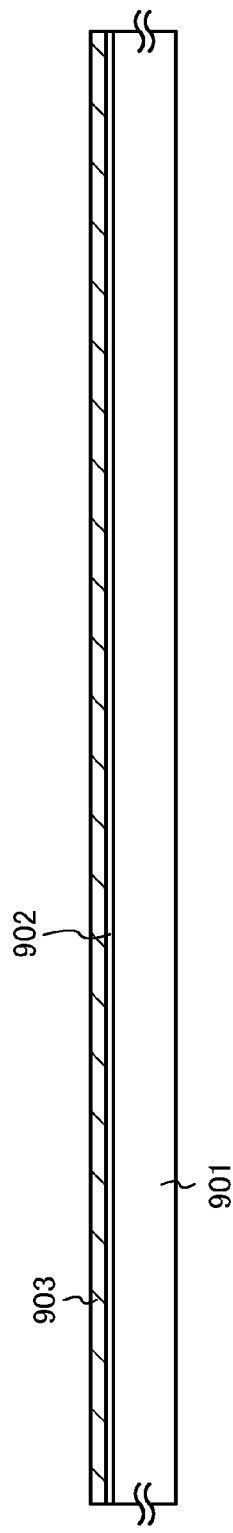
FIGS. 19A to 19C are cross-sectional views illustrating manufacturing steps of a semiconductor device.

A semiconductor layer 903 is formed over the substrate 901 with an insulating film 902 positioned therebetween (see FIG. 19A).

An insulating film functioning as a base film may be formed as the insulating film 902; a single layer or a stacked layer of any of a silicon oxide film, a silicon nitride film, a silicon oxynitride film, and a silicon nitride oxide film is formed.

The semiconductor layer 903 is formed using a semiconductor material such as an element belonging to Group 14 of the periodic table, such as silicon (Si) or germanium (Ge), or a compound such as silicon germanium (SiGe) or gallium arsenide (GaAs). A layer having a stacked structure of any of these semiconductor materials may be used.

As the semiconductor layer 903, an amorphous semiconductor layer, a microcrystalline semiconductor layer, or a polycrystalline semiconductor layer is formed by a plasma CVD method, a sputtering method, or the like. In this embodiment, an amorphous silicon layer is formed as the semiconductor layer 903 by a plasma CVD method.

Figure 19B:
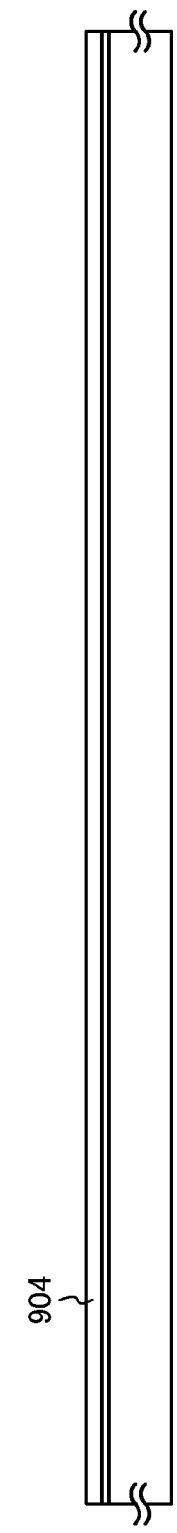
Figure 19C:
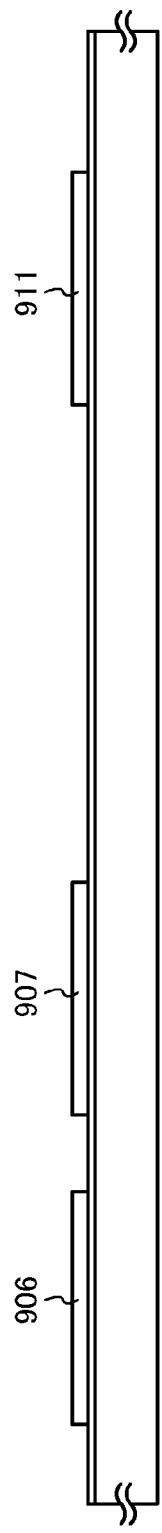

In the case where an amorphous semiconductor layer or a microcrystalline semiconductor layer is formed as the semiconductor layer 903, the semiconductor layer 903 is crystallized by a laser crystallization method, a thermal crystallization method using rapid thermal annealing (RTA) or an annealing furnace, a crystallization method using a metal element that promotes crystallization such as nickel (Ni), or the like, so that a polycrystalline semiconductor layer 904 is obtained (see FIG. 19B).

On the other hand, in the case where a polycrystalline semiconductor layer is formed as the semiconductor layer 903, the semiconductor layer 903 may be used as the polycrystalline semiconductor layer 904 without crystallization. Alternatively, the semiconductor layer 903 may be crystallized by the above crystallization method to form the polycrystalline semiconductor layer 904.

Next, a resist is formed over the polycrystalline semiconductor layer 904 by a photolithography method. The resist is used as a mask and the polycrystalline semiconductor layer 904 is selectively etched, so that an island-shaped semiconductor film 906, an island-shaped semiconductor film 907, and an island-shaped semiconductor film 911 are formed (see FIG. 19C).

In this manner, the island-shaped semiconductor films 906, 907, and 911 can be obtained from the polycrystalline semiconductor layer 904. The island-shaped semiconductor films 906, 907, and 911 formed in this embodiment can be applied to the island-shaped semiconductor films 106, 107, and 201 described in Embodiment 1, respectively, and Embodiments 1 to 5 can be applied; accordingly, through a manufacturing process of a transistor having a polycrystalline semiconductor layer in a channel formation region and a transistor having an oxide semiconductor layer in a channel formation region, a rectifier element (e.g., a diode) having a polycrystalline semiconductor layer and a oxide semiconductor layer can be obtained.

According to this embodiment, the number of manufacturing steps of a semiconductor device including transistors and a diode can be reduced. When the number of manufacturing steps of the semiconductor device is reduced, yield of the semiconductor device can be improved. When the number of manufacturing steps of the semiconductor device is reduced, manufacturing cost of the semiconductor device can be reduced.

FIGS. 20A and 20B, FIGS. 21A and 21B, and FIGS. 22A and 22B each illustrate a semiconductor device which includes a rectifier element having a polycrystalline semiconductor layer and an oxide semiconductor layer and being obtained according to this embodiment. The rectifier element is manufactured through a manufacturing process of a transistor having a polycrystalline semiconductor layer in a channel formation region and a transistor having a oxide semiconductor layer in a channel formation region.

Figure 20A:
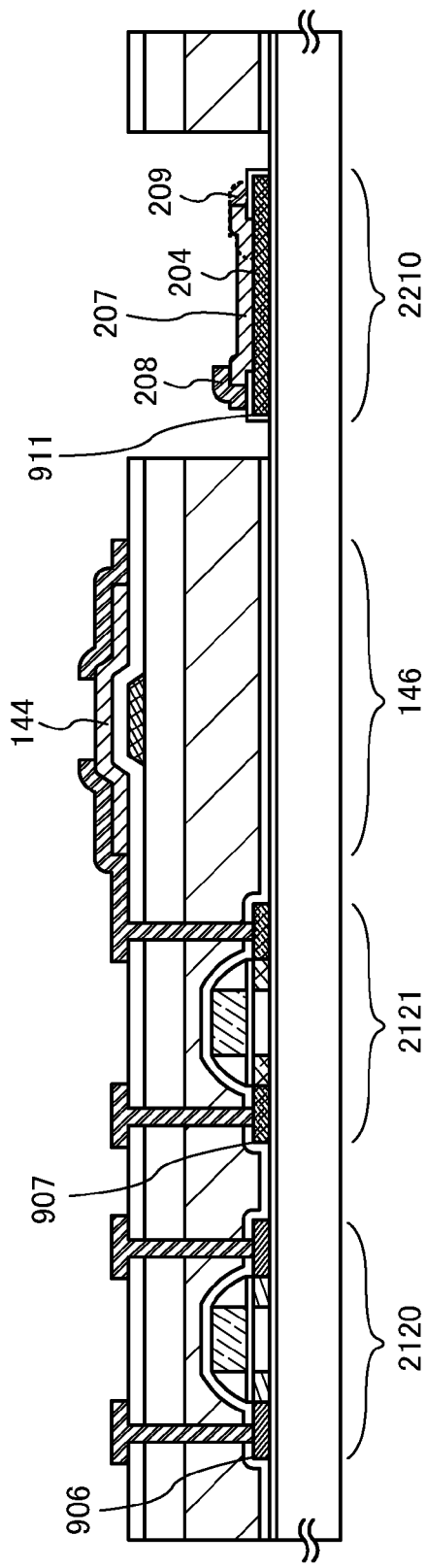
FIGS. 20A and 20B are cross-sectional views illustrating manufacturing steps of semiconductor devices.

The semiconductor device illustrated in FIG. 20A is similar to the semiconductor device illustrated in FIG. 6A and includes a transistor 2120, a transistor 2121, the transistor 146, and a diode 2210 that is a rectifier element. In the transistor 2120 in FIG. 20A, the semiconductor film 906 that is a polycrystalline semiconductor layer is used instead of the semiconductor film 106 that is a single crystal semiconductor layer of the transistor 120 in FIG. 6A. In the transistor 2121 in FIG. 20A, the semiconductor film 907 that is a polycrystalline semiconductor layer is used instead of the semiconductor film 107 that is a single crystal semiconductor layer of the transistor 121 in FIG. 6A. In the diode 2210 in FIG. 20A, the semiconductor film 911 that is a polycrystalline semiconductor layer is used instead of the semiconductor film 201 that is a single crystal semiconductor layer of the diode 210 in FIG. 6A.

Figure 20B:
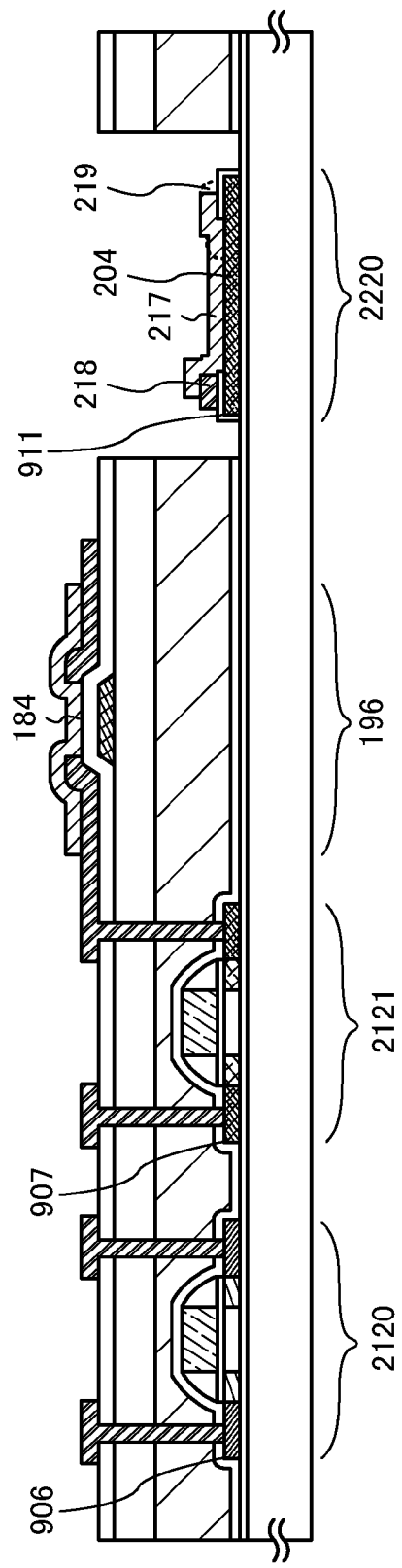

The semiconductor device illustrated in FIG. 20B is similar to the semiconductor device illustrated in FIG. 15A and includes the transistor 2120, the transistor 2121, the transistor 196, and a diode 2220 that is a rectifier element. In the transistor 2120 in FIG. 20B, the semiconductor film 906 that is a polycrystalline semiconductor layer is used instead of the semiconductor film 106 that is a single crystal semiconductor layer of the transistor 120 in FIG. 15A. In the transistor 2121 in FIG. 20B, the semiconductor film 907 that is a polycrystalline semiconductor layer is used instead of the semiconductor film 107 that is a single crystal semiconductor layer of the transistor 121 in FIG. 15A. In the diode 2220 in FIG. 20B, the semiconductor film 911 that is a polycrystalline semiconductor layer is used instead of the semiconductor film 201 that is a single crystal semiconductor layer of the diode 220 in FIG. 15A.

The semiconductor device illustrated in FIG. 21A is similar to the semiconductor device illustrated in FIG. 16A and includes the transistor 2120, the transistor 2121, the transistor 146, and a diode 2240 that is a rectifier element. In the transistor 2120 in FIG. 21A, the semiconductor film 906 that is a polycrystalline semiconductor layer is used instead of the semiconductor film 106 that is a single crystal semiconductor layer of the transistor 120 in FIG. 16A. In the transistor 2121 in FIG. 21A, the semiconductor film 907 that is a polycrystalline semiconductor layer is used instead of the semiconductor film 107 that is a single crystal semiconductor layer of the transistor 121 in FIG. 16A. In the diode 2240 in FIG. 21A, the semiconductor film 911 that is a polycrystalline semiconductor layer is used instead of the semiconductor film 201 that is a single crystal semiconductor layer of the diode 240 in FIG. 16A.

The semiconductor device illustrated in FIG. 21B is similar to the semiconductor device illustrated in FIG. 10B and includes the transistor 2120, the transistor 2121, the transistor 196, and a diode 2250 that is a rectifier element. In the transistor 2120 in FIG. 21B, the semiconductor film 906 that is a polycrystalline semiconductor layer is used instead of the semiconductor film 106 that is a single crystal semiconductor layer of the transistor 120 in FIG. 10B. In the transistor 2121 in FIG. 21B, the semiconductor film 907 that is a polycrystalline semiconductor layer is used instead of the semiconductor film 107 that is a single crystal semiconductor layer of the transistor 121 in FIG. 10B. In the diode 2250 in FIG. 21B, the semiconductor film 911 that is a polycrystalline semiconductor layer is used instead of the semiconductor film 201 that is a single crystal semiconductor layer of the diode 250 in FIG. 10B.

Figure 22A:
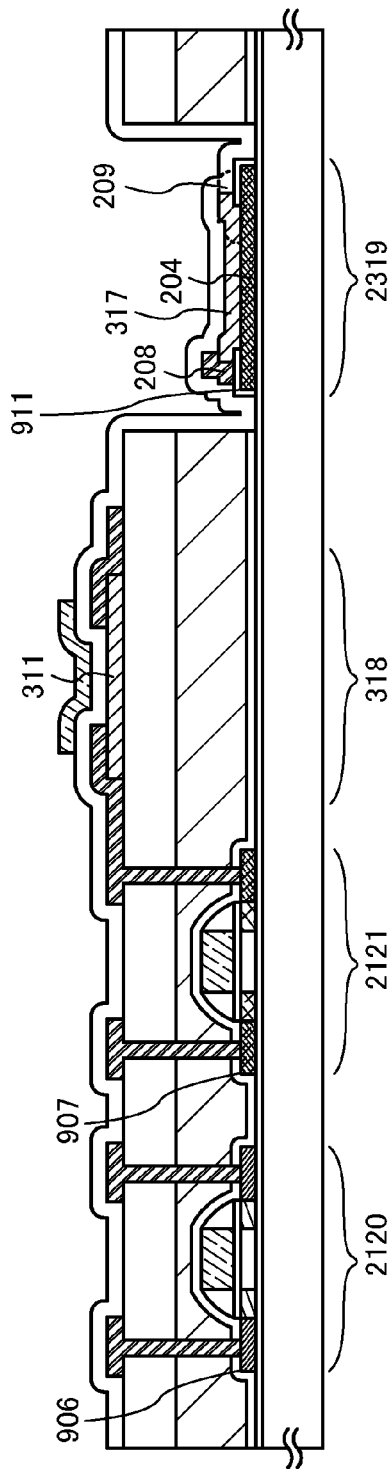
FIGS. 22A and 22B are cross-sectional views illustrating manufacturing steps of semiconductor devices.

The semiconductor device illustrated in FIG. 22A is similar to the semiconductor device illustrated in FIG. 18B and includes the transistor 2120, the transistor 2121, the transistor 318, and a diode 2319 that is a rectifier element. In the transistor 2120 in FIG. 22A, the semiconductor film 906 that is a polycrystalline semiconductor layer is used instead of the semiconductor film 106 that is a single crystal semiconductor layer of the transistor 120 in FIG. 18B. In the transistor 2121 in FIG. 22A, the semiconductor film 907 that is a polycrystalline semiconductor layer is used instead of the semiconductor film 107 that is a single crystal semiconductor layer of the transistor 121 in FIG. 18B. In the diode 2319 in FIG. 22A, the semiconductor film 911 that is a polycrystalline semiconductor layer is used instead of the semiconductor film 201 that is a single crystal semiconductor layer of the diode 319 in FIG. 18B.

Figure 22B:
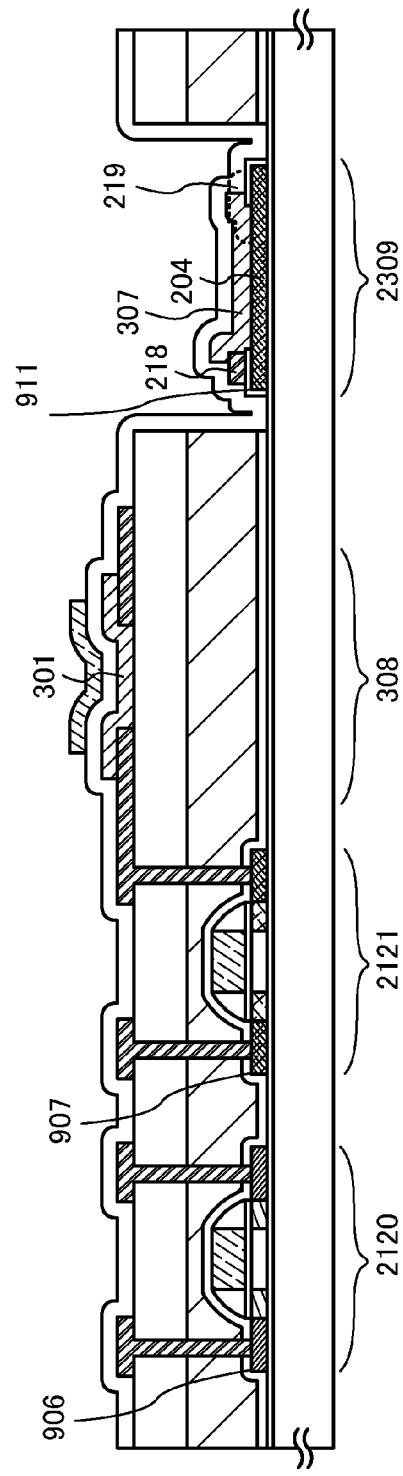

The semiconductor device illustrated in FIG. 22B is similar to the semiconductor device illustrated in FIG. 11B and includes the transistor 2120, the transistor 2121, the transistor 308, and a diode 2309 that is a rectifier element. In the transistor 2120 in FIG. 22B, the semiconductor film 906 that is a polycrystalline semiconductor layer is used instead of the semiconductor film 106 that is a single crystal semiconductor layer of the transistor 120 in FIG. 11B. In the transistor 2121 in FIG. 22B, the semiconductor film 907 that is a polycrystalline semiconductor layer is used instead of the semiconductor film 107 that is a single crystal semiconductor layer of the transistor 121 in FIG. 11B. In the diode 2309 in FIG. 22B, the semiconductor film 911 that is a polycrystalline semiconductor layer is used instead of the semiconductor film 201 that is a single crystal semiconductor layer of the diode 309 in FIG. 11B.

According to one embodiment of the disclosed invention, in the manufacture of a semiconductor device, through a process for manufacturing a first semiconductor element (e.g., a transistor including silicon) and a second semiconductor element (e.g., a transistor including an oxide semiconductor film) which have different characteristics from each other, a third semiconductor element (e.g., a diode) is also manufactured; thus, the number of manufacturing steps can be reduced. When the number of manufacturing steps of the semiconductor device is reduced, yield of the semiconductor device can be improved. When the number of manufacturing steps of the semiconductor device is reduced, manufacturing cost of the semiconductor device can be reduced.

Note that as in the case of Embodiment 1, this embodiment can be applied to any semiconductor device that includes two transistors having different characteristics from each other and a diode. Examples of such a semiconductor device include semiconductor devices having a wireless communication function, microprocessors, integrated circuits such as image processing circuits, photoelectric conversion devices, and semiconductor display devices. The photoelectric conversion devices include solar cells and photosensors in the category. The semiconductor display devices include the following in the category: liquid crystal display devices, light-emitting devices in which a light-emitting element typified by an organic light-emitting diode (OLED) is provided for each pixel, electronic paper, electronic book readers, digital micromirror devices (DMDs), plasma display panels (PDPs), field emission displays (FEDs), and other semiconductor display devices in which a driver circuit including a semiconductor element is included.

According to this embodiment, a diode can also be manufactured through a process for manufacturing a transistor formed using a polycrystalline semiconductor film and a transistor formed using an oxide semiconductor film. Accordingly, it is not necessary to provide a process for manufacturing the diode, separately from the process for manufacturing the transistor formed using a polycrystalline semiconductor film and the transistor formed using an oxide semiconductor film. Therefore, the number of manufacturing steps of such a semiconductor device including transistors and a diode can be reduced. When the number of manufacturing steps of the semiconductor device is reduced, yield of the semiconductor device can be improved. When the number of manufacturing steps of the semiconductor device is reduced, manufacturing cost of the semiconductor device can be reduced.

Embodiment 7

In Embodiment 1, an example in which a single crystal semiconductor layer separated from a bond substrate is used for the channel formation regions of the transistor 120 and the transistor 121 is described. In Embodiment 7, an example in which a single crystal semiconductor substrate is used for the channel formation regions of the transistor 120 and the transistor 121 will be described.

This embodiment will be described with reference to FIGS. 23A to 23D, FIGS. 24A to 24C, FIGS. 25A and 25B, FIG. 26, FIGS. 27A and 27B, and FIGS. 28A and 28B.

First, a single crystal semiconductor substrate 1100 is prepared. As the single crystal semiconductor substrate 1100, a single crystal semiconductor substrate formed using silicon can be used. Alternatively, a semiconductor substrate formed using silicon having crystal lattice distortion, silicon germanium obtained by adding germanium to silicon, or the like may be used as the single crystal semiconductor substrate 1100.

Next, element formation regions isolated with insulating films 1140 (also referred to as field oxide films) are formed in the single crystal semiconductor substrate 1100. The element isolation regions can be formed by local oxidation of silicon (LOCOS), shallow trench isolation (STI), or the like.

Next, an insulating film 1202 is formed so as to cover the element formation regions. In this embodiment, a silicon oxide film is formed by oxidation of surfaces of the element formation regions provided in the single crystal semiconductor substrate 1100 by heat treatment. As a result, the insulating film 1202 and the insulating films 1140 form one continuous film.

Alternatively, the insulating film 1202 may be formed to have a stacked structure of a silicon oxide film and a film including oxygen and nitrogen (silicon oxynitride film) by forming a silicon oxide film by a thermal oxidation method and then nitriding a surface of the silicon oxide film by nitridation treatment.

As another method for forming the insulating film 1202, for example, by oxidation treatment or nitridation treatment by high-density plasma treatment performed on the surfaces of the element formation regions provided in the single crystal semiconductor substrate 1100, a silicon oxide film or a silicon nitride film can be formed as the insulating film 1202. Further, after oxidation treatment is performed on the surfaces of the element formation regions by high-density plasma treatment, nitridation treatment may be performed by high-density plasma treatment. In that case, a silicon oxide film is formed on the surfaces of the element formation regions, and a silicon oxynitride film is formed on the silicon oxide film. Thus, the insulating film 1202 has a stacked structure of the silicon oxide film and the silicon oxynitride film.

The insulating film 1202 functions as gate insulating films of a transistor 1120 and a transistor 1121 described later.

Figure 23A:
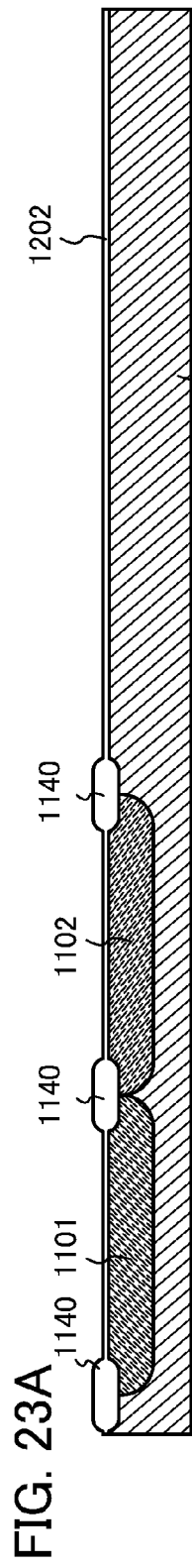
FIGS. 23A to 23D are cross-sectional views illustrating manufacturing steps of a semiconductor device.

Then, a p-well region 1101 and an n-well region 1102 are formed in the single crystal semiconductor substrate 1100 (see FIG. 23A). The p-well region 1101 and the n-well region 1102 are separated and insulated from each other by the insulating film 1140.

The p-well region 1101 and the n-well region 1102 may be formed by adding an impurity element imparting p-type conductivity and an impurity element imparting n-type conductivity, respectively, to the single crystal semiconductor substrate 1100. Further, after the p-well region 1101 and the n-well region 1102 are formed, the insulating film 1202 which is damaged by the addition of the impurity elements may be removed, and then thermal oxidation may be performed on the single crystal semiconductor substrate 1100 again to form an insulating film as the insulating film 1202.

As the impurity element imparting n-type conductivity, for example, phosphorus or arsenic is added; as the impurity element imparting p-type conductivity, for example, boron is added.

In a step of forming a high-concentration impurity region described later, the impurity element imparting n-type conductivity is added to the p-well region 1101; thus, an n-channel transistor is manufactured. Similarly, the impurity element imparting p-type conductivity is added to the n-well region 1102; thus, a p-channel transistor is manufactured.

Figure 23B:
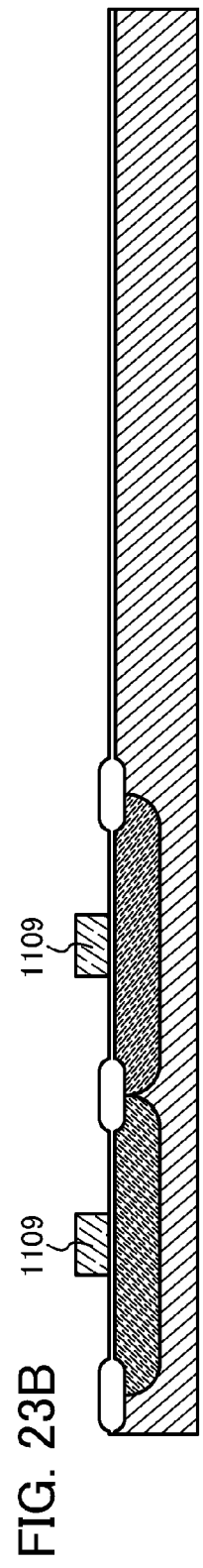

Next, a conductive film is formed over the insulating film 1202 and then processed into an appropriate shape, so that electrodes 1109 are formed over the p-well region 1101 and the n-well region 1102 (see FIG. 23B).

Figure 23C:
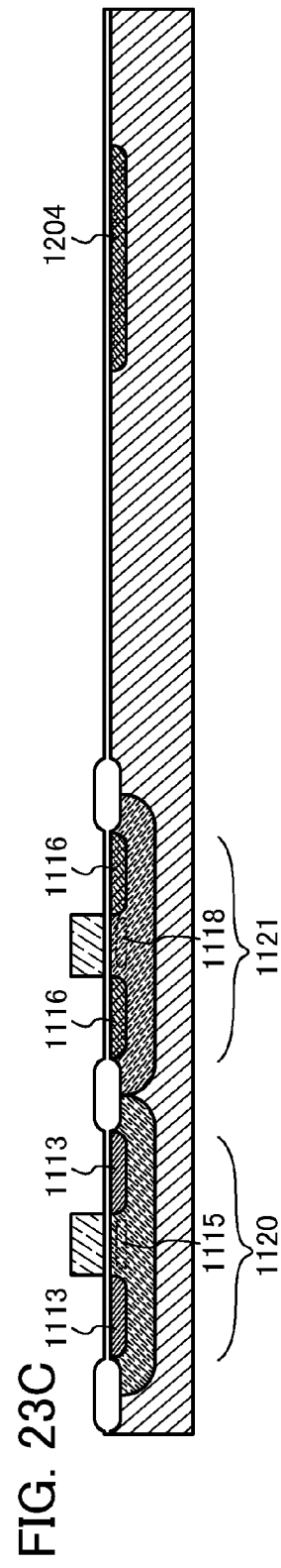

Then, as illustrated in FIG. 23C, impurity elements imparting one conductivity type are added to the single crystal semiconductor substrate 1100 with the use of the electrodes 1109 as masks. When the impurity element imparting p-type conductivity is added to the single crystal semiconductor substrate 1100 as the impurity imparting one conductivity type, a region to which the n-type impurity is added is covered with a mask or the like so that the impurity element imparting p-type conductivity is added selectively. On the other hand, when the impurity element imparting n-type conductivity is added to the single crystal semiconductor substrate 1100, a region to which the p-type impurity is added is covered with a mask or the like so that the impurity element imparting n-type conductivity is added selectively.

By the addition of the impurity element imparting n-type conductivity, a pair of high-concentration impurity regions 1113 and a channel formation region 1115 between the pair of high-concentration impurity regions 1113 are formed in the p-well region 1101.

By the addition of the impurity element imparting p-type conductivity, a pair of high-concentration impurity regions 1116 and a channel formation region 1118 between the pair of high-concentration impurity regions 1116 are formed in the n-well region 1102.

The high-concentration impurity regions 1113 and the high-concentration impurity regions 1116 each function as a source region or a drain region. As in Embodiment 1, low-concentration impurity regions may be formed between the high-concentration impurity regions 1113 and the channel formation region 1115 and between the high-concentration impurity regions 1116 and the channel formation region 1118. The low-concentration impurity regions function as lightly doped drain (LDD) regions. Note that the LDD regions are not necessarily provided, and only impurity regions functioning as a source region and a drain region may be formed. Alternatively, the LDD region may be formed on either the source region side or the drain region side.

By the addition of the impurity element imparting p-type conductivity, an impurity region 1204 is formed in another region of the single crystal semiconductor substrate 1100. The impurity region 1204 functions as a p-type semiconductor layer of a diode 1210.

Through the above series of steps, the channel formation regions are provided in the single crystal semiconductor substrate 1100, and the n-channel transistor 1120 and the p-channel transistor 1121 are manufactured. Further, the impurity region 1204 which is a p-type semiconductor layer of the diode 1210 that is a rectifier element is formed in one region of the single crystal semiconductor substrate 1100.

Figure 23D:
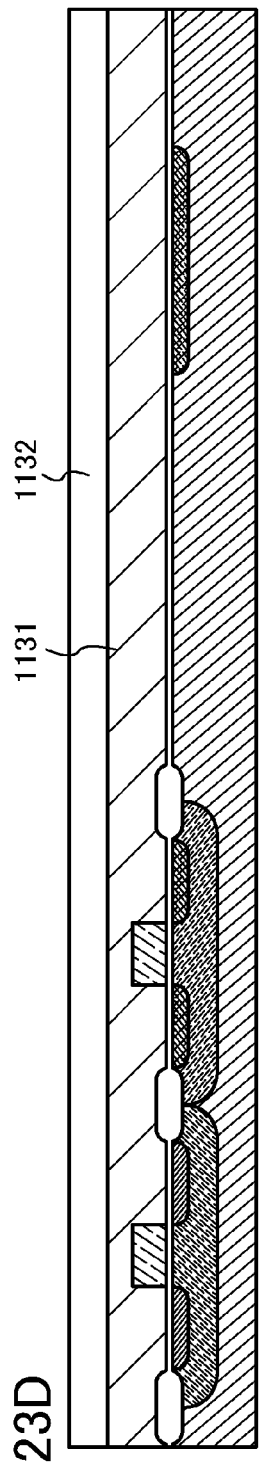

Then, an insulating film 1131 and an insulating film 1132 are formed over the transistor 1120, the transistor 1121, and a region of the single crystal semiconductor substrate 1100, which is not provided with the transistor 1120 and the transistor 1121 (see FIG. 23D). The transistor 1120 and the transistor 1121 are isolated from a transistor having an oxide semiconductor layer in a channel formation region, which is described later, with the insulating film 1131 and the insulating film 1132 positioned therebetween.

The insulating film 1131 and the insulating film 1132 may be formed using materials and formation steps similar to those of the insulating film 131 and the insulating film 132 described in Embodiment 1, respectively.

Figure 24A:
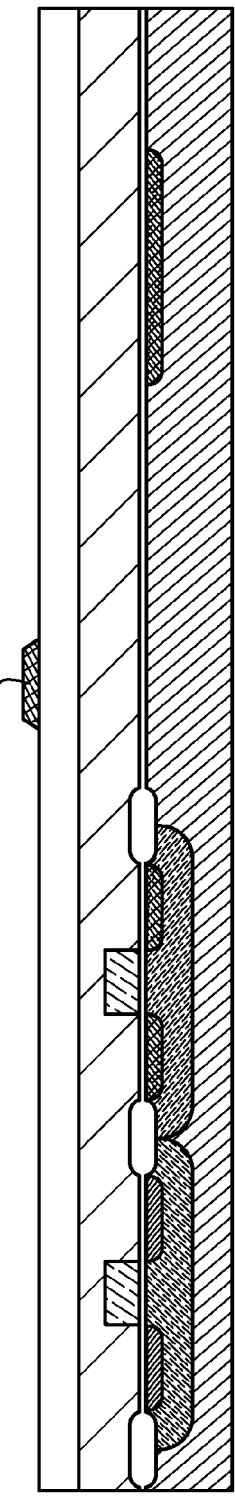
FIGS. 24A to 24C are cross-sectional views illustrating manufacturing steps of a semiconductor device.

Next, with reference to the formation step of the gate electrode 141 described in Embodiment 1, a gate electrode 1141 is formed over the insulating film 1132 (see FIG. 24A).

Figure 24B:
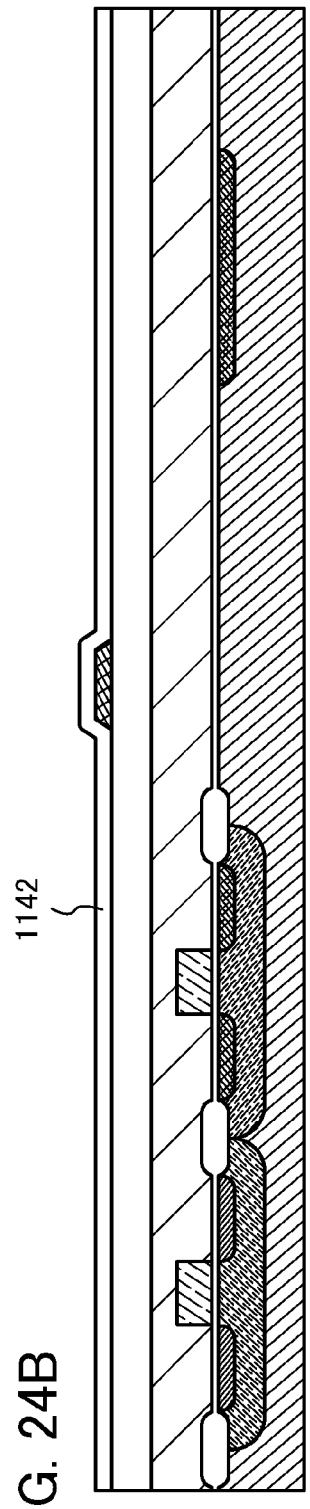

A gate insulating film 1142 is formed over the gate electrode 1141 (see FIG. 24B). For a material and a formation step of the gate insulating film 1142, description of the gate insulating film 142 in Embodiment 1 may be referred to.

Figure 24C:
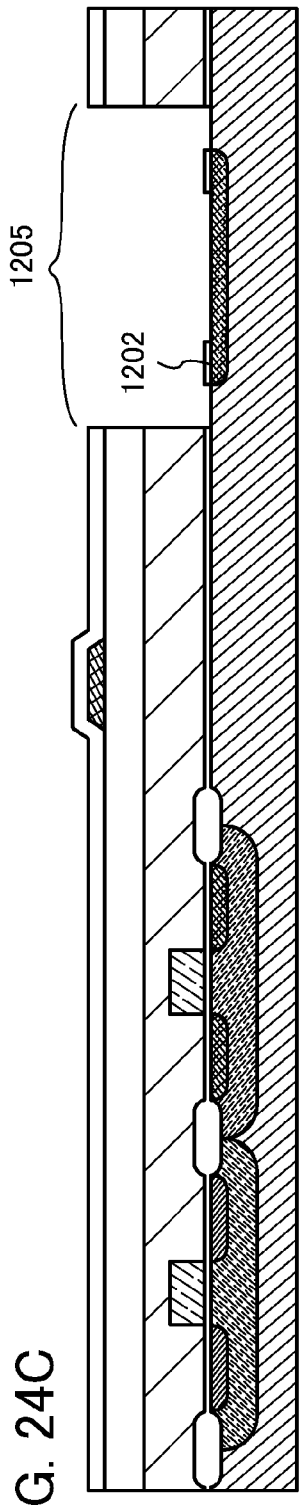

Then, each of the gate insulating film 1142, the insulating film 1132, and the insulating film 1131 is partly removed by etching or the like, so that an opening 1205 is formed (see FIG. 24C). The opening 1205 is provided in a region where the diode 1210 described later is formed. By this etching step, the insulating film 1202 and the impurity region 1204 are exposed.

Next, an oxide semiconductor film is formed over the gate insulating film 1142 and the exposed impurity region 1204. After being formed, the oxide semiconductor film is processed into a desired shape by etching or the like. After being processed into the desired shape, the oxide semiconductor film is subjected to heat treatment.

Figure 25A:
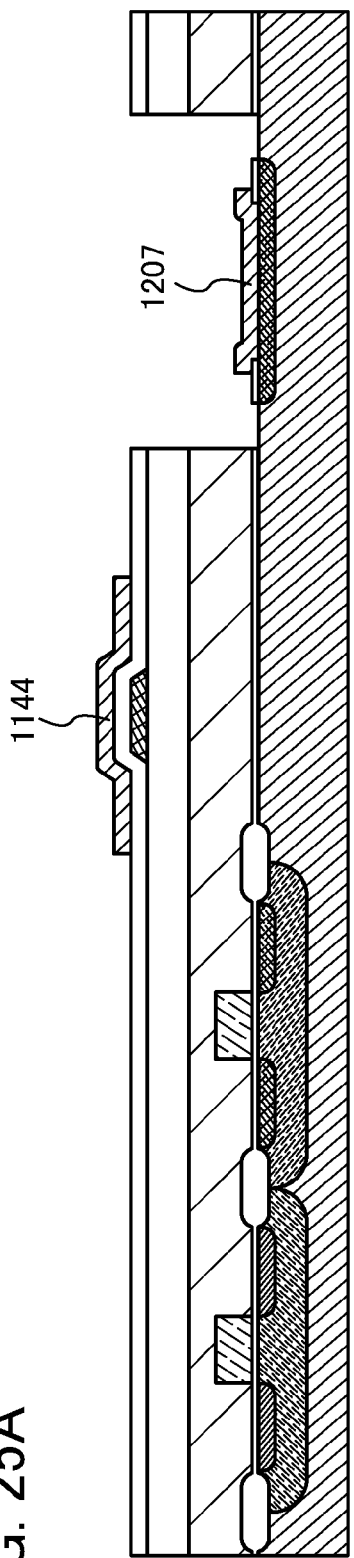
FIGS. 25A and 25B are cross-sectional views illustrating manufacturing steps of a semiconductor device.

By this step, an island-shaped oxide semiconductor film 1144 is formed to overlap with the gate electrode 1141, and an island-shaped oxide semiconductor film 1207 is formed in contact with the impurity region 1204 (see FIG. 25A).

The oxide semiconductor film 1144 serves as a channel formation region of a transistor 1146 described later. The oxide semiconductor film 1207 serves as an n-type semiconductor layer of the diode 1210. The oxide semiconductor film 1144 and the oxide semiconductor film 1207 have n-type conductivity without addition of an impurity element imparting one conductivity type. Therefore, it is preferable that the oxide semiconductor film 1144 be used for the channel formation region of the transistor 1146 because a step of adding an impurity element can be omitted.

Through the above steps, the oxide semiconductor film 1144 serving as the channel formation region of the transistor 1146 and the oxide semiconductor film 1207 serving as the n-type semiconductor layer of the diode 1210 can be formed at a time. Since the oxide semiconductor film 1144 and the oxide semiconductor film 1207 can be formed at a time, the number of manufacturing steps of the semiconductor device can be reduced.

Next, the gate insulating film 1142, the insulating film 1132, the insulating film 1131, and the insulating film 1202 are partly etched. By this etching step, contact holes reaching the high-concentration impurity regions 1113 in the transistor 1120 and contact holes reaching the high-concentration impurity regions 1116 in the transistor 1121 are formed.

Then, a conductive film is formed over the gate insulating film 1142, the oxide semiconductor film 1144, the insulating film 1202, and the impurity region 1204 by a sputtering method or a vacuum evaporation method. The conductive film is processed into an appropriate shape by etching or the like.

In this manner, a conductive film 1151 functioning as one of a source electrode and a drain electrode of the transistor 1120, and a conductive film 1152 functioning as the other of the source electrode and the drain electrode of the transistor 1120 are formed. A conductive film 1153 functioning as one of a source electrode and a drain electrode of the transistor 1121, and a conductive film 1154 functioning as the other of the source electrode and the drain electrode of the transistor 1121 and one of a source electrode and a drain electrode of the transistor 1146 are formed. A conductive film 1155 functioning as the other of the source electrode and the drain electrode of the transistor 1146 is formed. Conductive films 1208 and 1209 functioning as electrodes of the diode 1210 are formed (see FIG. 25B). Note that the conductive film 1209 is shown by a dotted line in FIG. 25B because it cannot be illustrated in the cross-sectional view.

Figure 25B:
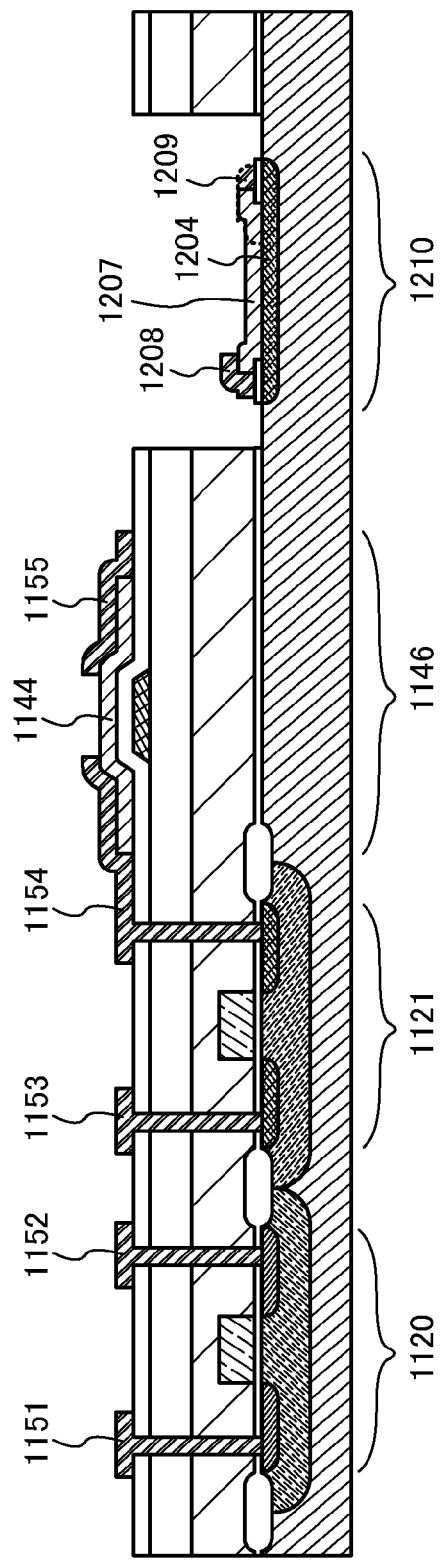

Note that the transistor 1146 illustrated in FIG. 25B can be referred to as a bottom-gate top-contact transistor because the transistor 1146 is a bottom-gate transistor and the oxide semiconductor film 1144 is connected to the source electrode or the drain electrode (the conductive film 1154 or the conductive film 1155) in a region including a top surface of the oxide semiconductor film 1144.

The conductive film 1208 and the conductive film 1209 which are the electrodes of the diode 1210 are electrically connected to the oxide semiconductor film 1207 that is an n-type semiconductor layer and the impurity region 1204, respectively.

In the above-described manner, the transistor 1120 and the transistor 1121 which have channel formation regions in the single crystal semiconductor substrate 1100, the transistor 1146 having the oxide semiconductor film 1144 in a channel formation region, and the diode 1210 having the impurity region 1204 that is provided in the single crystal semiconductor substrate 1100 and functions as a p-type semiconductor layer and the oxide semiconductor film 1207 that functions as an n-type semiconductor layer are obtained.

Figure 26:
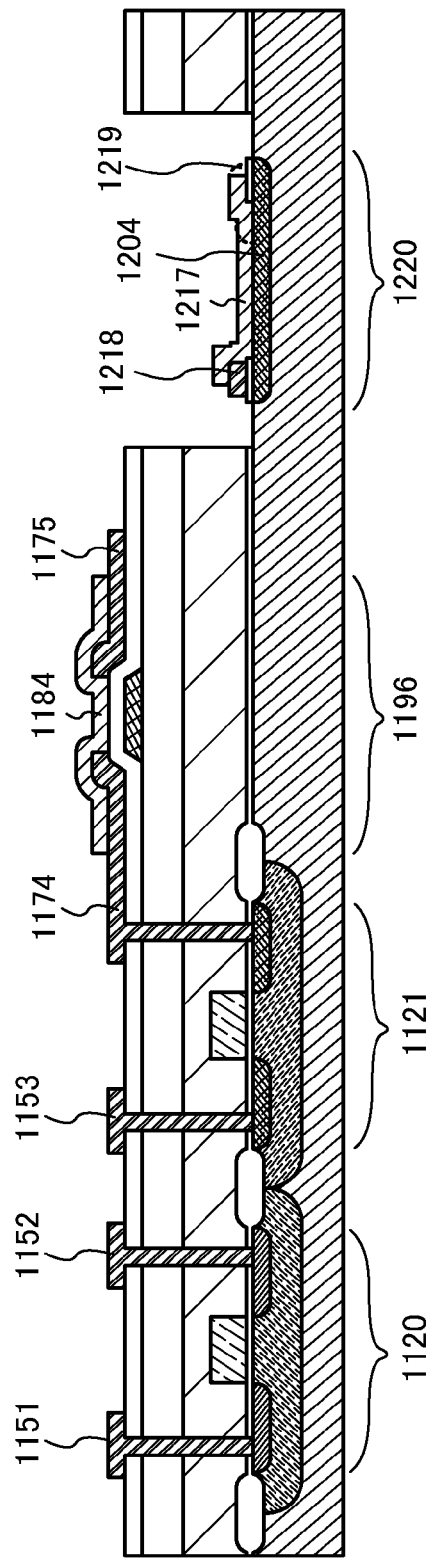
FIG. 26 is a cross-sectional view illustrating a manufacturing step of a semiconductor device.

FIG. 26 illustrates a semiconductor device having a structure different from that in FIGS. 25A and 25B. Note that in FIG. 26, the same portions as FIGS. 25A and 25B are denoted by the same reference numerals.

The semiconductor device illustrated in FIG. 26 includes the transistor 1120 and the transistor 1121 which have channel formation regions in the single crystal semiconductor substrate 1100, a transistor 1196 having an oxide semiconductor film 1184 in a channel formation region, and a diode 1220 having the impurity region 1204 that is provided in the single crystal semiconductor substrate 1100 and functions as a p-type semiconductor layer and an oxide semiconductor film 1217 that functions as an n-type semiconductor layer. Note that the transistor 1196 illustrated in FIG. 26 is similar to the transistor 196 described in Embodiment 2, and Embodiment 2 can be referred to for materials and manufacturing steps of the transistor 1196. The oxide semiconductor film 1217 of the diode 1220 is formed using a material and a formation step similar to those of the oxide semiconductor film 1184 of the transistor 1196. In addition, a conductive film 1174 and a conductive film 1175 are similar to the conductive film 174 and the conductive film 175, respectively. A conductive film 1218 and a conductive film 1219 are similar to the conductive film 218 and the conductive film 219, respectively.

A semiconductor device illustrated in FIG. 27A includes the transistor 1120 and the transistor 1121 which have channel formation regions in the single crystal semiconductor substrate 1100, the transistor 1146 having the oxide semiconductor film 1144 in a channel formation region, and a diode 1240 having the impurity region 1204 that is provided in the single crystal semiconductor substrate 1100 and functions as a p-type semiconductor layer, an intrinsic semiconductor film 1231, and an oxide semiconductor film 1237 that functions as an n-type semiconductor layer. Note that the transistor 1146 illustrated in FIG. 27A is similar to the transistor 146 described in Embodiment 3, and Embodiment 3 can be referred to for materials and manufacturing steps of the transistor 1146. The oxide semiconductor film 1237 of the diode 1240 is formed using a material and a formation step similar to those of the oxide semiconductor film 1144 of the transistor 1146. In addition, the intrinsic semiconductor film 1231 is similar to the intrinsic semiconductor film 231. The conductive film 1154 and the conductive film 1155 are similar to the conductive film 154 and the conductive film 155, respectively. A conductive film 1238 and a conductive film 1239 are similar to the conductive film 238 and the conductive film 239, respectively.

A semiconductor device illustrated in FIG. 27B includes the transistor 1120 and the transistor 1121 which have channel formation regions in the single crystal semiconductor substrate 1100, the transistor 1196 having the oxide semiconductor film 1184 in a channel formation region, and a diode 1250 having the impurity region 1204 that is provided in the single crystal semiconductor substrate 1100 and functions as a p-type semiconductor layer, an intrinsic semiconductor film 1241, and an oxide semiconductor film 1247 that functions as an n-type semiconductor layer. Note that the transistor 1196 illustrated in FIG. 27B is similar to the transistor 196 described in Embodiment 4, and Embodiment 4 can be referred to for materials and manufacturing steps of the transistor 1196. The oxide semiconductor film 1247 of the diode 1250 is formed using a material and a formation step similar to those of the oxide semiconductor film 1184 of the transistor 1196. In addition, the intrinsic semiconductor film 1241 is similar to the intrinsic semiconductor film 241. The conductive film 1174 and the conductive film 1175 are similar to the conductive film 174 and the conductive film 175, respectively. The conductive film 1218 and the conductive film 1219 are similar to the conductive film 218 and the conductive film 219, respectively.

A semiconductor device illustrated in FIG. 28A includes the transistor 1120 and the transistor 1121 which have channel formation regions in the single crystal semiconductor substrate 1100, a transistor 1318 having an oxide semiconductor film 1311 in a channel formation region, and a diode 1319 having the impurity region 1204 that is provided in the single crystal semiconductor substrate 1100 and functions as a p-type semiconductor layer and an oxide semiconductor film 1317 that functions as an n-type semiconductor layer. Note that the transistor 1318 illustrated in FIG. 28A is similar to the transistor 318 illustrated in FIG. 18B of Embodiment 5, and Embodiment 5 can be referred to for materials and manufacturing steps of the transistor 1318. The oxide semiconductor film 1317 of the diode 1319 is formed using a material and a formation step similar to those of the oxide semiconductor film 1311 of the transistor 1318. In addition, a conductive film 1314 and a conductive film 1315 are similar to the conductive film 314 and the conductive film 315, respectively. An insulating film 1312 is similar to the insulating film 312. A gate electrode 1313 is similar to the gate electrode 313. The conductive film 1208 and the conductive film 1209 are similar to the conductive film 208 and the conductive film 209, respectively.

A semiconductor device illustrated in FIG. 28B includes the transistor 1120 and the transistor 1121 which have channel formation regions in the single crystal semiconductor substrate 1100, a transistor 1308 having an oxide semiconductor film 1301 in a channel formation region, and a diode 1309 having the impurity region 1204 that is provided in the single crystal semiconductor substrate 1100 and functions as a p-type semiconductor layer and an oxide semiconductor film 1307 that functions as an n-type semiconductor layer. Note that the transistor 1308 illustrated in FIG. 28B is similar to the transistor 308 illustrated in FIG. 11B of Embodiment 5, and Embodiment 5 can be referred to for materials and manufacturing steps of the transistor 1308. The oxide semiconductor film 1307 of the diode 1309 is formed using a material and a formation step similar to those of the oxide semiconductor film 1301 of the transistor 1308. In addition, a conductive film 1304 and a conductive film 1305 are similar to the conductive film 304 and the conductive film 305, respectively. An insulating film 1302 is similar to the insulating film 302. A gate electrode 1303 is similar to the gate electrode 303. The conductive film 1218 and the conductive film 1219 are similar to the conductive film 218 and the conductive film 219, respectively.

According to one embodiment of the disclosed invention, in the manufacture of a semiconductor device, through a process for manufacturing a first semiconductor element (e.g., a transistor including silicon) and a second semiconductor element (e.g., a transistor including an oxide semiconductor film) which have different characteristics from each other, a third semiconductor element (e.g., a diode) is also manufactured; thus, the number of manufacturing steps can be reduced. When the number of manufacturing steps of the semiconductor device is reduced, yield of the semiconductor device can be improved. When the number of manufacturing steps of the semiconductor device is reduced, manufacturing cost of the semiconductor device can be reduced.

Note that as in the case of Embodiment 1, this embodiment can be applied to any semiconductor device that includes two transistors having different characteristics from each other and a diode. Examples of such a semiconductor device include semiconductor devices having a wireless communication function, microprocessors, integrated circuits such as image processing circuits, photoelectric conversion devices, and semiconductor display devices. The photoelectric conversion devices include solar cells and photosensors in the category. The semiconductor display devices include the following in the category: liquid crystal display devices, light-emitting devices in which a light-emitting element typified by an organic light-emitting diode (OLED) is provided for each pixel, electronic paper, electronic book readers, digital micromirror devices (DMDs), plasma display panels (PDPs), field emission displays (FEDs), and other semiconductor display devices in which a driver circuit including a semiconductor element is included.

According to this embodiment, a diode can also be manufactured through a process for manufacturing a transistor formed using a single crystal semiconductor substrate and a transistor formed using an oxide semiconductor film. Accordingly, it is not necessary to provide a process for manufacturing the diode, separately from the process for manufacturing the transistor formed using a single crystal semiconductor substrate and the transistor formed using an oxide semiconductor film. Therefore, the number of manufacturing steps of such a semiconductor device including transistors and a diode can be reduced. When the number of manufacturing steps of the semiconductor device is reduced, yield of the semiconductor device can be improved. When the number of manufacturing steps of the semiconductor device is reduced, manufacturing cost of the semiconductor device can be reduced.

Embodiment 8

In this embodiment, the following semiconductor devices having a wireless communication function will be described: a semiconductor device which includes the transistor having a single crystal semiconductor layer in a channel formation region, the transistor having an oxide semiconductor layer in a channel formation region, and the diode having a single crystal semiconductor layer and a oxide semiconductor layer, which are described in Embodiments 1 to 5; a semiconductor device which includes the transistor having a polycrystalline semiconductor layer in a channel formation region, the transistor having an oxide semiconductor layer in a channel formation region, and the diode having a polycrystalline semiconductor layer and a oxide semiconductor layer, which are described in Embodiment 6; and a semiconductor device which includes the transistor whose channel formation region is provided in a single crystal semiconductor substrate, the transistor having an oxide semiconductor layer in a channel formation region, and the diode having a p-type semiconductor layer provided in the single crystal semiconductor substrate and a oxide semiconductor layer functioning as an n-type semiconductor layer, which are described in Embodiment 7.

Figure 12:
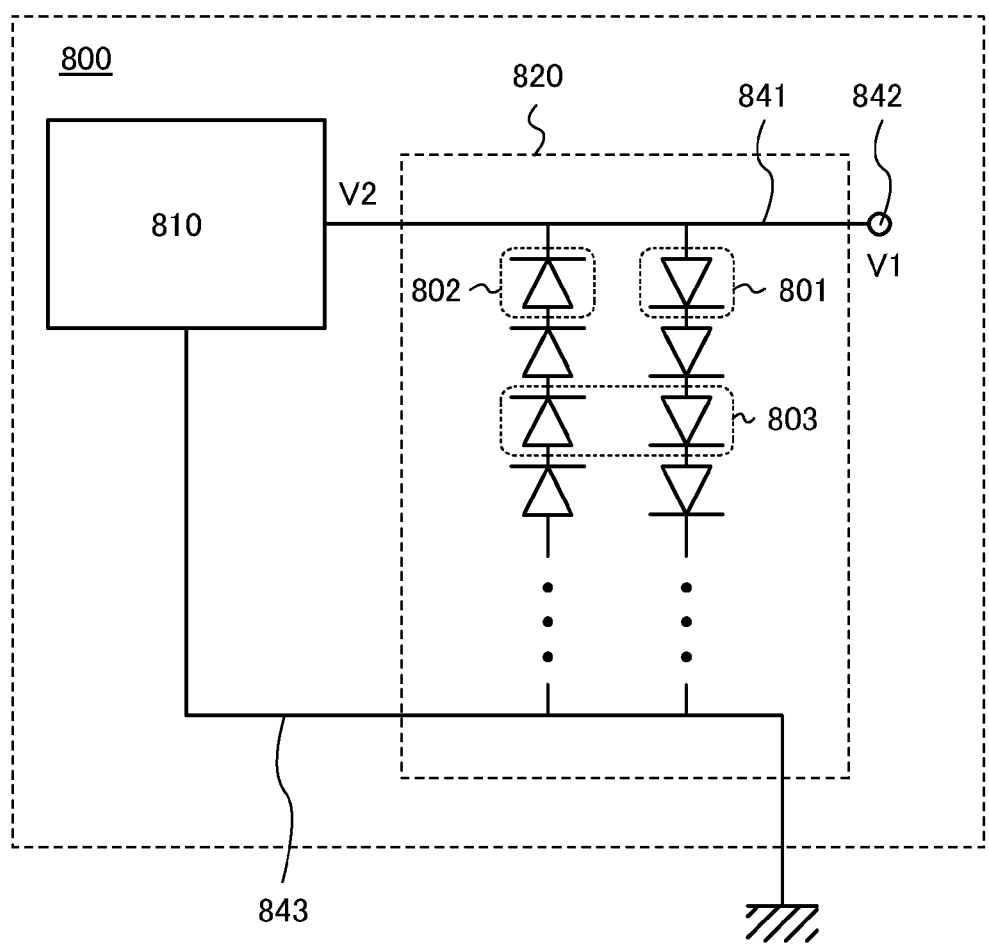
FIG. 12 is a circuit diagram illustrating a configuration of a semiconductor device.
Figure 13:
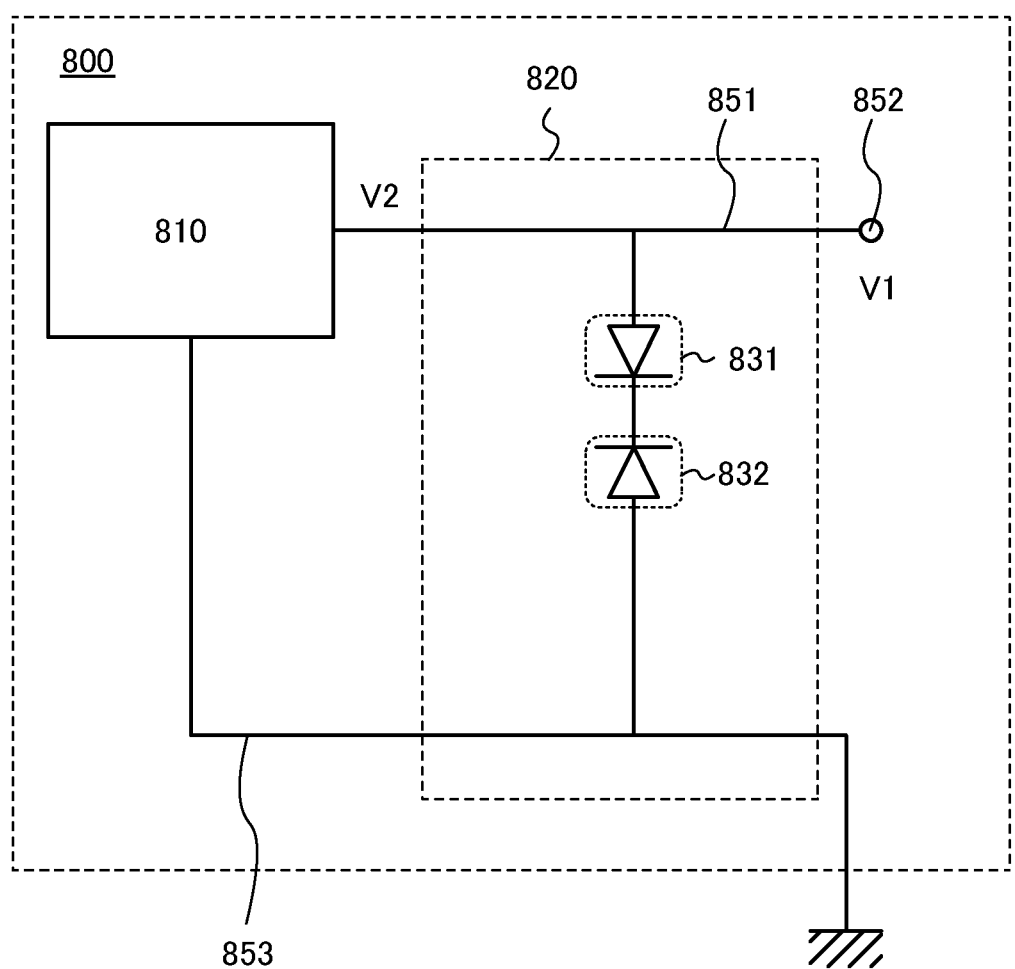
FIG. 13 is a circuit diagram illustrating a configuration of a semiconductor device.

FIG. 12 and FIG. 13 illustrate a semiconductor device 800 having a wireless communication function of this embodiment.

The semiconductor device 800 having a wireless communication function illustrated in FIG. 12 includes a logic circuit 810 and a limiter circuit portion 820. The logic circuit 810 is connected to the limiter circuit portion 820 through a wiring 841. The wiring 841 is provided with a terminal 842. Further, the logic circuit 810 and the limiter circuit portion 820 are connected to each other and grounded through a wiring 843.

In the limiter circuit portion 820, each of the diode 801 and the diode 802 forms a diode-series where diodes are connected in series.

A combination of one diode 801 and one diode 802 is referred to as a stage 803. A limit value of the output voltage is heightened in proportion to the number of the stages 803.

In the case where a plurality of stages 803 is provided, a plurality of diodes 801 and a plurality of diodes 802 are provided. The diodes 801 are connected to one another in series, and the diodes 802 are connected to one another in series. Terminals having opposite polarities are connected between the diode at an end of a diode-series including the diodes 801 and the diode at an end of a diode-series including the diodes 802.

The limiter circuit portion 820 operates when voltage V1 received at the terminal 842 is high, and limits input of the high voltage V1 to the logic circuit 810. The voltage V1 is transmitted wirelessly from a wireless communication device which functions as a power supply device and a transmitter-receiver.

Forward voltage drop of each of the diode 801 and the diode 802 is denoted by Vf. When the voltage V1 input to each of the diode 801 and the diode 802 is higher than or equal to the voltage Vf, electrical continuity is established in the diode 801 and the diode 802. As a result, voltage V2 output from the limiter circuit portion 820 does not become higher than or equal to the voltage Vf. The voltage V2 is also a voltage input to the logic circuit 810. In the above manner, it is possible to limit the voltage input to the logic circuit 810.

As the diode 801 and the diode 802, any of the following diodes is preferably used: the diode 210 described in Embodiment 1, the diode 220 described in Embodiment 2, the diode 240 described in Embodiment 3, the diode 250 described in Embodiment 4, the diodes 309 and 319 described in Embodiment 5, the diodes 2210, 2220, 2240, 2250, 2319, and 2309 described in Embodiment 6, and the diodes 1210, 1220, 1240, 1250, 1319, and 1309 described in Embodiment 7.

The logic circuit 810 includes an antenna circuit, a logic circuit, a memory circuit, and an analog circuit, for example. In the logic circuit 810, a circuit which needs to operate at high speed is preferably formed using a transistor having high mobility; a circuit which needs to hold voltage for a long time is preferably formed using a transistor capable of holding voltage for a long time. As the transistor having high mobility, a transistor having a single crystal semiconductor layer in a channel formation region is preferable. As the transistor capable of holding voltage for a long time, a transistor having an oxide semiconductor film in a channel formation region is preferable.

That is, as an element included in a circuit which needs to operate at high speed, any of following transistors is preferable: the transistors 120 and 121 described in Embodiments 1 to 5, each of which has a single crystal semiconductor layer in a channel formation region; the transistors 2120 and 2121 described in Embodiment 6, each of which has a polycrystalline semiconductor layer in a channel formation region; and the transistors 1120 and 1121 described in Embodiment 7, each of whose channel formation regions is provided in a single crystal semiconductor substrate. As the transistor capable of holding voltage for a long time, any of the following transistors is preferably used: the transistor 146, the transistor 196, the transistor 308, the transistor 318, the transistor 1146, the transistor 1196, the transistor 1308, and the transistor 1318, each of which has an oxide semiconductor film in a channel formation region.

As described in Embodiments 1 to 5, according to one embodiment of the disclosed invention, a transistor having a single crystal semiconductor layer in a channel formation region, a transistor having an oxide semiconductor film in a channel formation region, and a diode having a single crystal semiconductor layer and a oxide semiconductor film can be manufactured. As described in Embodiment 6, according to one embodiment of the disclosed invention, a transistor having a polycrystalline semiconductor layer in a channel formation region, a transistor having an oxide semiconductor film in a channel formation region, and a diode having a polycrystalline semiconductor layer and a oxide semiconductor film can be manufactured. As described in Embodiment 7, according to one embodiment of the disclosed invention, a transistor having a channel formation region provided in a single crystal semiconductor substrate, a transistor having an oxide semiconductor film in a channel formation region, and a diode having a p-type semiconductor layer provided in the single crystal semiconductor substrate and a oxide semiconductor film functioning as an n-type semiconductor layer can be manufactured.

Thus, according to one embodiment of the disclosed invention, the number of manufacturing steps of a semiconductor device capable of wireless communication can be reduced. When the number of manufacturing steps of the semiconductor device is reduced, yield of the semiconductor device can be improved. When the number of manufacturing steps of the semiconductor device is reduced, manufacturing cost of the semiconductor device can be reduced.

FIG. 13 illustrates another example of a circuit configuration of a semiconductor device capable of wireless communication.

In FIG. 13, the limiter circuit portion 820 is a limiter circuit using a Zener diode. The limiter circuit portion 820 in FIG. 13 serves as a Zener diode which includes a diode 831 and a diode 832. An output terminal of the diode 831 is electrically connected to an output terminal of the diode 832.

As the diode 831 and the diode 832, any of the following diodes can be used: the diode 210 described in Embodiment 1, the diode 220 described in Embodiment 2, the diode 240 described in Embodiment 3, the diode 250 described in Embodiment 4, the diodes 309 and 319 described in Embodiment 5, the diodes 2210, 2220, 2240, 2250, 2319, and 2309 described in Embodiment 6, and the diodes 1210, 1220, 1240, 1250, 1319, and 1309 described in Embodiment 7.

As in the description of FIG. 12, the logic circuit 810 includes an antenna circuit, a logic circuit, a memory circuit, and an analog circuit, for example. In the logic circuit 810, a circuit which needs to operate at high speed is preferably formed using a transistor having high mobility; a circuit which needs to hold voltage for a long time is preferably formed using a transistor capable of holding voltage for a long time. As the transistor having high mobility, a transistor having a single crystal semiconductor layer in a channel formation region is preferable. As the transistor capable of holding voltage for a long time, a transistor having an oxide semiconductor film in a channel formation region is preferable.

That is, as an element included in a circuit which needs to operate at high speed, any of following transistors is preferable: the transistors 120 and 121 described in Embodiments 1 to 5, each of which has a single crystal semiconductor layer in a channel formation region; the transistors 2120 and 2121 described in Embodiment 6, each of which has a polycrystalline semiconductor layer in a channel formation region; and the transistors 1120 and 1121 described in Embodiment 7, each of whose channel formation regions is provided in a single crystal semiconductor substrate. As the transistor capable of holding voltage for a long time, any of the following transistors is preferably used: the transistor 146, the transistor 196, the transistor 308, the transistor 318, the transistor 1146, the transistor 1196, the transistor 1308, and the transistor 1318, each of which has an oxide semiconductor film in a channel formation region.

As described in Embodiments 1 to 5, according to one embodiment of the disclosed invention, a transistor having a single crystal semiconductor layer in a channel formation region, a transistor having an oxide semiconductor film in a channel formation region, and a diode having a single crystal semiconductor layer and a oxide semiconductor film can be manufactured. As described in Embodiment 6, according to one embodiment of the disclosed invention, a transistor having a polycrystalline semiconductor layer in a channel formation region, a transistor having an oxide semiconductor film in a channel formation region, and a diode having a polycrystalline semiconductor layer and a oxide semiconductor film can be manufactured. As described in Embodiment 7, according to one embodiment of the disclosed invention, a transistor having a channel formation region provided in a single crystal semiconductor substrate, a transistor having an oxide semiconductor film in a channel formation region, and a diode having a p-type semiconductor layer provided in the single crystal semiconductor substrate and a oxide semiconductor film functioning as an n-type semiconductor layer can be manufactured.

Thus, according to one embodiment of the disclosed invention, the number of manufacturing steps of a semiconductor device capable of wireless communication can be reduced. When the number of manufacturing steps of the semiconductor device is reduced, yield of the semiconductor device can be improved. When the number of manufacturing steps of the semiconductor device is reduced, manufacturing cost of the semiconductor device can be reduced.

Embodiment 9

In this embodiment, the following power supply circuits will be described: a power supply circuit which includes the transistor having a single crystal semiconductor layer in a channel formation region, the transistor having an oxide semiconductor layer in a channel formation region, and the diode having a single crystal semiconductor layer and a oxide semiconductor layer, which are described in Embodiments 1 to 5; a power supply circuit which includes the transistor having a polycrystalline semiconductor layer in a channel formation region, the transistor having an oxide semiconductor layer in a channel formation region, and the diode having a polycrystalline semiconductor layer and a oxide semiconductor layer, which are described in Embodiment 6; and a power supply circuit which includes the transistor in which a single crystal semiconductor substrate is used for a channel formation region, the transistor having an oxide semiconductor layer in a channel formation region, and the diode having a single crystal semiconductor substrate and a oxide semiconductor layer, which are described in Embodiment 7.

Figure 14:
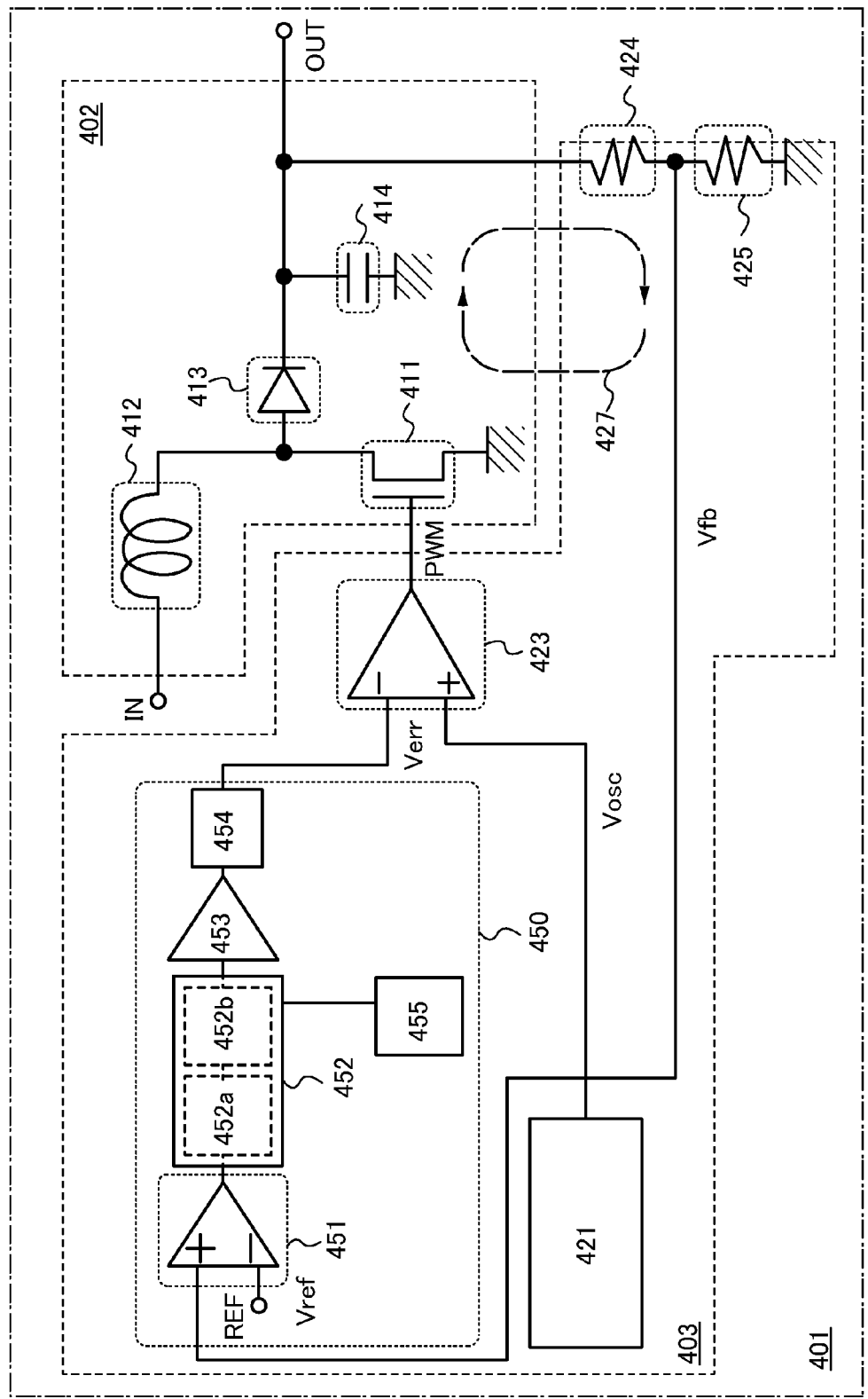
FIG. 14 is a circuit diagram illustrating a configuration of a power supply circuit.

FIG. 14 illustrates an example of a configuration of a power supply circuit 401. The power supply circuit 401 includes a voltage converter circuit 402 and a control circuit 403 for controlling the voltage converter circuit 402. The voltage converter circuit 402 includes a transistor 411, a coil 412, a diode 413, and a capacitor 414. The control circuit 403 includes a triangle wave generator circuit 421, a digital control circuit 450, a pulse width modulation output driver 423, a resistor 424, and a resistor 425. In addition, a dotted arrow 427 indicates a loop of a feedback circuit. A feedback voltage Vfb, which is an output voltage of the resistor 424, is input to the digital control circuit 450.

Since the output voltage of the voltage converter circuit 402 is high, a transistor with high breakdown voltage is preferably used as the transistor 411. As a transistor with high breakdown voltage, a transistor having an oxide semiconductor film in a channel formation region is preferable.

High-speed operation is needed for a transistor included in the digital control circuit 450; therefore, a transistor having high mobility is preferably used. As the transistor having high mobility, any of following transistors is preferable: the transistors 120 and 121 described in Embodiments 1 to 5, each of which has a single crystal semiconductor layer in a channel formation region; the transistors 2120 and 2121 described in Embodiment 6, each of which has a polycrystalline semiconductor layer in a channel formation region; and the transistors 1120 and 1121 described in Embodiment 7, each of whose channel formation regions is provided in a single crystal semiconductor substrate. As a transistor capable of holding voltage for a long time, any of the following transistors is preferably used: the transistor 146, the transistor 196, the transistor 308, the transistor 318, the transistor 1146, the transistor 1196, the transistor 1308, and the transistor 1318, each of which has an oxide semiconductor film in a channel formation region.

As the diode 413, any of the following diodes is preferably used: the diode 210 described in Embodiment 1, the diode 220 described in Embodiment 2, the diode 240 described in Embodiment 3, the diode 250 described in Embodiment 4, the diodes 309 and 319 described in Embodiment 5, the diodes 2210, 2220, 2240, 2250, 2319, and 2309 described in Embodiment 6, and the diodes 1210, 1220, 1240, 1250, 1319, and 1309 described in Embodiment 7. This is because, when the above diode is employed as the diode 413, the diode 413 can also be manufactured through a process for manufacturing the transistor 411 in the voltage converter circuit 402 and the transistor included in the digital control circuit 450.

When the above diode is employed as the diode 413, it is not necessary to provide a process for manufacturing the diode 413, separately from the process for manufacturing the transistor 411 in the voltage converter circuit 402 and the transistor included in the digital control circuit 450. Therefore, the number of manufacturing steps of the semiconductor device including the transistors and the diode can be reduced. When the number of manufacturing steps of the semiconductor device is reduced, yield of the semiconductor device can be improved. When the number of manufacturing steps of the semiconductor device is reduced, manufacturing cost of the semiconductor device can be reduced.

The digital control circuit 450 includes a comparator 451, a digital arithmetic process circuit 452, a pulse width modulation output driver 453, a low pass filter (LPF) 454, and a clock divider 455.

In the digital control circuit 450, the digital arithmetic process circuit 452 and the pulse width modulation output driver 453 are digital circuits. The digital circuit determines whether a signal is 1 or 0 (zero) according to whether the level of the signal in the circuit is higher or lower than a reference, and therefore performs data processing properly even when elements in the digital circuit vary in characteristics.

In addition, in the digital control circuit 450, the use of passive elements having a large area (e.g., a capacitor and a resistor) is reduced; therefore, the digital control circuit 450 is preferable in that the area of the circuit can be reduced.

The comparator 451 compares a reference voltage Vref which is input from an inverted input terminal REF and an input voltage Vin which is input from a non-inverted input terminal IN, and outputs a digital signal of H (high level) or L (low level), that is, a digital signal 1 or 0 (zero).

The digital arithmetic process circuit 452 includes a digital average-integrator 452a and a digital pulse width modulator 452b. To the digital arithmetic process circuit 452, the external clock divider 455 is connected, and a clock signal is input from the clock divider 455.

The digital arithmetic process circuit 452 performs an averaging process, an integration process, and a digital pulse width modulation process of the digital signal output from the comparator 451. In the digital arithmetic process circuit 452, the digital average-integrator 452a performs the averaging process and the integration process, and the digital pulse width modulator 452b performs the digital pulse width modulation process.

The digital arithmetic process circuit 452 holds N bits of data on the digital signal (which is either H (high level) or L (low level)) output from the comparator 451, compares the frequency of appearance of H signal and L signal, and outputs either one with a higher frequency. Thus, the digital signal is averaged.

Depending on the averaged digital signal, "−1" or "+1" is added and integration is performed. Note that when the averaged digital signal is an H signal, "−1" is added, while when the averaged digital signal is an L signal, "+1" is added. Thus, the averaged digital signal is integrated.

The phase position of a pulse width modulation output signal is set in accordance with an integrated digital signal. Thus, a digital pulse width modulation process is performed. The pulse width modulation output signal which has been subjected to digital pulse width modulation is input to the pulse width modulation output driver 453.

The triangle wave generator circuit 421 generates a triangle wave Vosc which is needed for generation of a pulse width modulation signal.

To an inverted input terminal of the pulse width modulation output driver 423, an output signal Verr of the digital control circuit 450 is input, while to a non-inverted input terminal, the triangle wave Vosc generated by the triangle wave generator circuit 421 is input.

The pulse width modulation output driver 423 compares the output signal Verr of the digital control circuit 450 with the triangle wave Vosc. When the signal level of the triangle wave Vosc is higher than that of the output signal Verr of the digital control circuit 450, the pulse width modulation output driver 423 outputs H (high level) as the pulse width modulation signal to the transistor 411. When the signal level of the triangle wave Vosc is lower than that of the output signal Verr of the digital control circuit 450, the pulse width modulation output driver 423 outputs L (low level) as the pulse width modulation signal to the transistor 411.

According to one embodiment of the disclosed invention, in the manufacture of a power supply circuit, through a process for manufacturing a first semiconductor element (e.g., a transistor including silicon) and a second semiconductor element (e.g., a transistor including an oxide semiconductor film) which have different characteristics from each other, a third semiconductor element (e.g., a diode) is also manufactured; thus, the number of manufacturing steps can be reduced. When the number of manufacturing steps of the power supply circuit is reduced, yield of the power supply circuit can be improved. When the number of manufacturing steps of the power supply circuit is reduced, manufacturing cost of the power supply circuit can be reduced.

This application is based on Japanese Patent Application serial no. 2010-096878 filed with Japan Patent Office on Apr. 20, 2010, the entire contents of which are hereby incorporated by reference.

What is claimed is:

1. A semiconductor device comprising:
   a first transistor comprising a first semiconductor film;
   an insulating film over the first transistor;
   a second transistor comprising a first oxide semiconductor film over the insulating film; and
   a diode comprising a second semiconductor film and a second oxide semiconductor film over the second semiconductor film,
   wherein the first semiconductor film and the second semiconductor film are formed on a same insulating surface, and
   wherein the first oxide semiconductor film and the second oxide semiconductor film comprise a same oxide semiconductor.

2. The semiconductor device according to claim 1,
   wherein the diode comprises an intrinsic semiconductor film between the second semiconductor film and the second oxide semiconductor film.

3. The semiconductor device according to claim 1,
   wherein the first transistor is a p-type transistor,
   wherein the second transistor is an n-type transistor, and
   wherein the second semiconductor film is a p-type semiconductor film.

4. The semiconductor device according to claim 1,
   wherein the second semiconductor film and the second oxide semiconductor film are stacked with each other.

5. The semiconductor device according to claim 1,
   wherein the first semiconductor film and the second semiconductor film are a polycrystalline semiconductor film.

6. The semiconductor device according to claim 1,
   wherein the first semiconductor film and the second semiconductor film are a single crystal semiconductor film.

7. The semiconductor device according to claim 1,
   wherein the second transistor is a bottom-gate transistor.

8. The semiconductor device according to claim 1,
   wherein the first oxide semiconductor film comprises indium.

9. The semiconductor device according to claim 1,
   wherein the first semiconductor film and the second semiconductor film comprise a silicon.

10. The semiconductor device according to claim 1,
    wherein the first transistor comprises a first gate insulating film over the first semiconductor film, a first gate over the first gate insulating film, and an insulating film over the first gate,
    wherein the second transistor comprises a second gate over the insulating film, a second gate insulating film over the second gate, and the first oxide semiconductor film over the second gate insulating film,
    wherein the diode comprises an island-shaped intrinsic semiconductor film stacked and in contact with the second semiconductor film, and the second oxide semiconductor film stacked and in contact with the island-shaped intrinsic semiconductor film.

11. A method for manufacturing a semiconductor device, comprising the steps of:
    forming a first semiconductor film and a second semiconductor film by processing a semiconductor layer;
    forming a first gate insulating film over the first semiconductor film;
    forming a first gate over the first gate insulating film;
    forming a first transistor comprising the first semiconductor film, the first gate insulating film, and the first gate;
    forming an insulating layer to cover the first transistor and the second semiconductor film;
    forming an opening provided in a region where the second semiconductor film is formed by removing a part of the insulating layer;
    forming an island-shaped intrinsic semiconductor film stacked and in contact with the second semiconductor film;
    forming a second gate over the insulating layer;
    forming a second gate insulating film over the second gate;
    forming an oxide semiconductor layer over the insulating layer and the second semiconductor film;
    forming a first oxide semiconductor film over the insulating layer and a second oxide semiconductor film stacked and in contact with the island-shaped intrinsic semiconductor film by processing the oxide semiconductor layer; and
    forming a second transistor comprising the second gate, the second gate insulating film, and the first oxide semiconductor film and a diode comprising the second semiconductor film, the island-shaped intrinsic semiconductor film, and the second oxide semiconductor film.

12. The method for manufacturing a semiconductor device according to claim 11, further comprising the step of:
    forming an intrinsic semiconductor layer over the second semiconductor film before forming the oxide semiconductor layer over the insulating layer and the second semiconductor film.

13. The method for manufacturing a semiconductor device according to claim 11,
    wherein the first transistor is a p-type transistor,
    wherein the second transistor is an n-type transistor, and
    wherein the second semiconductor film is a p-type semiconductor film.

14. The method for manufacturing a semiconductor device according to claim 11,
    wherein the second semiconductor film and the second oxide semiconductor film are stacked with each other.

15. The method for manufacturing a semiconductor device according to claim 11,
    wherein the semiconductor layer is a polycrystalline semiconductor layer provided over an insulating surface.

16. The method for manufacturing a semiconductor device according to claim 11,
    wherein the semiconductor layer is a single crystal semiconductor layer provided over an insulating surface.

17. The method for manufacturing a semiconductor device according to claim 11,
    wherein the semiconductor layer is formed from a single crystal semiconductor substrate.

18. The method for manufacturing a semiconductor device according to claim 11,
    wherein the second transistor is a bottom-gate transistor.

19. The method for manufacturing a semiconductor device according to claim 11,
    wherein the second transistor is a top-gate transistor.

* * * * *